United States Patent
Kim

(10) Patent No.: US 8,120,990 B2
(45) Date of Patent: Feb. 21, 2012

(54) FLEXIBLE MEMORY OPERATIONS IN NAND FLASH DEVICES

(75) Inventor: Jin-Ki Kim, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 534 days.

(21) Appl. No.: 12/364,665

(22) Filed: Feb. 3, 2009

(65) Prior Publication Data

US 2009/0196102 A1 Aug. 6, 2009

Related U.S. Application Data

(63) Continuation-in-part of application No. 12/329,929, filed on Dec. 8, 2008, application No. 12/364,665.

(60) Provisional application No. 61/025,920, filed on Feb. 4, 2008, provisional application No. 61/081,910, filed on Jul. 18, 2008, provisional application No. 61/035,791, filed on Mar. 12, 2008.

(51) Int. Cl.
*G11C 7/10* (2006.01)

(52) U.S. Cl. ........... 365/238.5; 365/185.11; 365/230.03; 365/189.05; 365/230.06; 711/170; 711/171; 711/173

(58) Field of Classification Search ............... 365/238.5, 365/185.11, 230.03, 189.05, 230.06; 711/170, 711/171, 173
See application file for complete search history.

(56) References Cited

U.S. PATENT DOCUMENTS

| | | | |
|---|---|---|---|
| 5,369,619 A | 11/1994 | Ohba | |
| 5,473,563 A | 12/1995 | Suh et al. | |
| 5,752,275 A * | 5/1998 | Hammond | 711/207 |
| 6,041,016 A * | 3/2000 | Freker | 365/238.5 |
| 6,205,530 B1 * | 3/2001 | Kang | 711/202 |
| 6,240,040 B1 | 5/2001 | Akaogi et al. | |
| 6,516,399 B2 * | 2/2003 | Vishal | 711/206 |
| 6,523,102 B1 * | 2/2003 | Dye et al. | 711/170 |
| 6,763,424 B2 | 7/2004 | Conley | |
| 6,839,285 B2 * | 1/2005 | Zink et al. | 365/185.33 |
| 6,850,438 B2 | 2/2005 | Lee | |
| 6,889,304 B2 * | 5/2005 | Perego et al. | 711/170 |

(Continued)

OTHER PUBLICATIONS

Lee et al., "A 90-nm CMOS 1.8V 2-Gb NAND Flash Memory for Mass Storage Applications", 1934 IEEE Journal of Solid-State Circuits, vol. 38, No. 11, 1493 0018-9200 copyright 2003, Nov. 2003, pp. 1934-1942.

(Continued)

*Primary Examiner* — Viet Q Nguyen
(74) *Attorney, Agent, or Firm* — Shin Hung; Borden Ladner Gervais LLP

(57) ABSTRACT

A flash memory device having at least two bank, where the each bank has an independently configurable page size and core controller. The core controller is local to each bank, and governs memory access operations for the bank that include read, program and erase operations. Each core controller controls timing and activation of row circuits, column circuits, voltage generators, and local input/output path circuits for a corresponding memory access operation of the bank. Concurrent operations are executable in multiple banks to improve performance. Each bank has a page size that is configurable with page size configuration data such that only selected wordlines are activated in response to address data. The configuration data can be loaded into the memory device upon power up for a static page configuration of the bank, or the configuration data can be received with each command to allow for dynamic page configuration of the bank.

34 Claims, 34 Drawing Sheets

U.S. PATENT DOCUMENTS

| | | | |
|---|---|---|---|
| 6,889,307 B1* | 5/2005 | Scheuerlein | 711/202 |
| 6,950,342 B2* | 9/2005 | Lindhorst et al. | 365/185.21 |
| 7,096,313 B1 | 8/2006 | Chang et al. | |
| 7,154,783 B2 | 12/2006 | Lee | |
| 7,197,607 B2 | 3/2007 | Roohparvar | |
| 7,254,075 B2* | 8/2007 | Woo et al. | 365/207 |
| 7,308,524 B2 | 12/2007 | Grundy et al. | |
| 7,389,402 B2* | 6/2008 | Zuraski et al. | 711/205 |
| 7,505,356 B2* | 3/2009 | Ware et al. | 365/230.06 |
| 7,606,111 B2* | 10/2009 | Lee et al. | 365/238.5 |
| 7,755,968 B2* | 7/2010 | Woo et al. | 365/230.03 |
| 7,779,214 B2* | 8/2010 | Stecher | 711/156 |
| 7,876,614 B2* | 1/2011 | Kang et al. | 365/185.03 |
| 7,889,544 B2* | 2/2011 | Chow et al. | 365/163 |
| 7,917,725 B2* | 3/2011 | Stecher | 711/207 |
| 7,953,931 B2* | 5/2011 | Yu et al. | 711/117 |
| 7,975,109 B2* | 7/2011 | McWilliams et al. | 711/147 |
| 2004/0027856 A1 | 2/2004 | Lee | |
| 2006/0067146 A1 | 3/2006 | Woo et al. | |
| 2007/0076484 A1 | 4/2007 | Cho et al. | |
| 2007/0242552 A1 | 10/2007 | Ju | |
| 2007/0263457 A1 | 11/2007 | Park | |

OTHER PUBLICATIONS

Samsung Electronics "512M×8 Bit / 1G×8 Bit NAND Flash Memory" Flash Memory K9F4G08U0A, K9K8GO8U1A, K9XXGO8UXA, Mar. 7, 2006, pp. 1-43.

Samsung Electronics "1G×8 Bit/ 2G×8 Bit NAND Flash Memory" Flash Memory K9KAGO8U1M, K9F8GO8UOM, K9F8G08BOM and K9F8GO8UXM. Mar. 31, 2007. pp. 1-54.

Samsung Electronics "64M×8 Bits NAND Flash Memory" Flash Memory K9F1208ROC, K9F1208U0C, K9F1208B0C and K9F1208X0C. Jun. 18, 2007. pp. 1-38.

Lee, Seungjae et al., "A 3.3V 4 Gb Four-Level NAND Flash Memory with 90nm CMOS Technology", ISSCC 2004 / Session; 2 / Non-Volatile Memory / 2.72004 IEEE International Solid-State Circuits Conference 0-7803-8267-6/ © 2004 IEEE, 2004, pp. 1-10.

Imamiya, Kenichi et al., "A 125-mm2 1-Gb NAND Flash Memory with 10-MByte/s Program Speed", IEEE Journal of Solid-State Circuits, vol. 37, No. 11, Nov. 2002 1493 0018-9200/02 © 2002 IEEE, pp. 1493-1501.

Suh, K. et al., "A 3.3 V 32 Mb NAND Flash Memory with Incremental Step Pulse Programming Scheme", IEEE Journal of Solid-State Circuits, vol. 30, No. 11, Nov. 1995, pp. 1149-1156.

Kim, et al. "A 120-mm2 64 Mb NAND Flash Memory Archieving 180 ns/Byte Effective Program Speed," IEEE Journal of Solid-State Circuits, vol. 32, No. 5, May 1977, pp. 670-680.

Byeon, D. et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 2005, pp. 46 and 47.

Hara, T. et al., "A 146mm2 8Gb NAND Flash Memory with 70nm CMOS Technology", ISSCC Session 2 Non-Volatile Memory 2.1, IEEE International Solid-State Circuits Conference, Feb. 2005, pp. 44, 45 and 584.

Yoo et al., "A 32-Bank 1 Gb Self-Strobing Synchronous DRAM with 1 GByte/s Bandwidth", IEEE Journal of Solid-State Circuits, vol. 31, No. 11, Nov. 1996, pp. 1635-1644.

Gal, et al., "Algorithms and data structures for flash memories", ACM Computing Surveys (CSUR), vol. 37, No. 2, p. 138-163, Jun. 2005, Tel Aviv University.

"IEEE Standard for High-Bandwidth Memory Interface based on Scalable Coherent Interface (SCI) Signaling Technology (RamLink)", IEEE Std. 1596.4-1996, The Institute of Electrical Electronics Engineers, Inc., pp. i-91, (Mar. 1996).

PCT Application No. PCT/CA2009/000004: International Search Report dated Apr. 9, 2009, p. 2.

PCT Application No. PCT/CA2009/000130: International Search Report, dated May 19, 2009, p. 2.

* cited by examiner

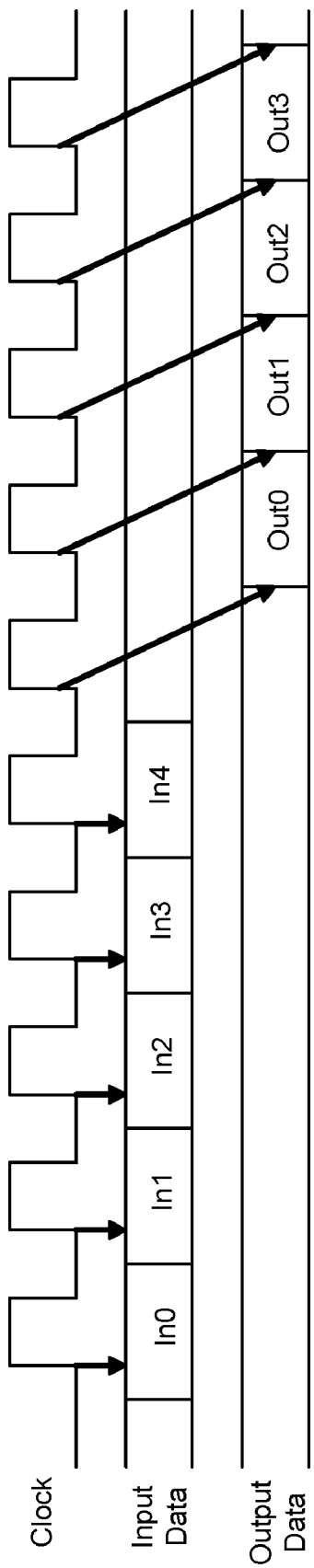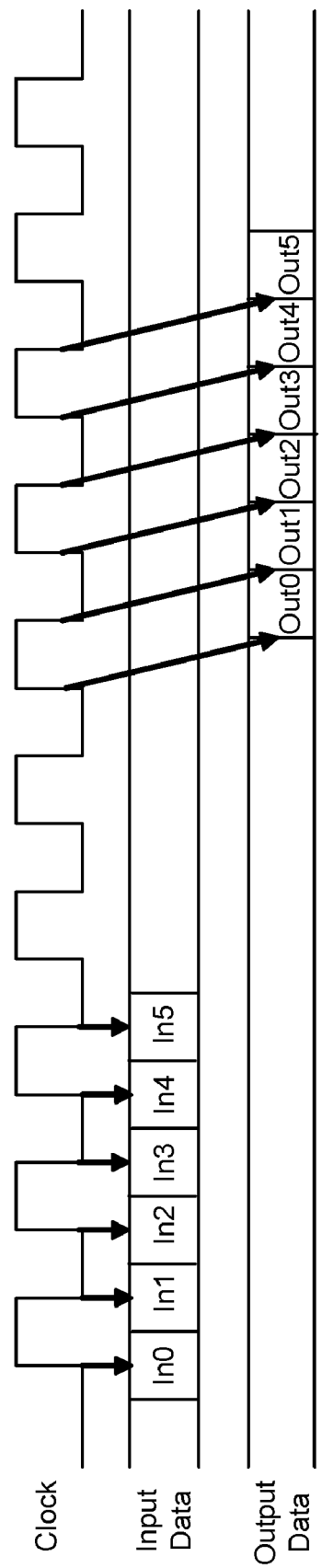
FIG. 3D
FIG. 3E

| Operation | Command (2 Bytes) | | Row Address (3 Bytes) | Column Address (2 Bytes) | Input Data (1 to 2112 Bytes) |
|---|---|---|---|---|---|
| | DA (1 Byte) | OP Code (1 Byte) | | | |
| Page Read | Valid | 0Xh | Valid | - | - |
| Page Read for Copy | Valid | 1Xh | Valid | - | - |
| Burst Data Read | Valid | 2Xh | - | Valid | - |
| Burst Data Load Start | Valid | 4Xh | - | Valid | Valid |
| Burst Data Load | Valid | 5Xh | - | Valid | Valid |
| Page Program | Valid | 6Xh | Valid | - | - |
| Block Address Input | Valid | 8Xh | Valid | - | - |
| Page - pair Address Input | Valid | 9Xh | Valid | - | - |
| Erase | Valid | AXh | - | - | - |
| Operation Abort | Valid | CXh | - | - | - |
| Read Status Register | Valid | F0h | - | - | - |
| Read Device Information Register | Valid | F4h | - | - | - |
| Read Link Configuration Register | Valid | F7h | - | - | - |
| Write Link Configuration Register | FFh | FFh | - | - | Valid |

FIG. 19

FLEXIBLE MEMORY OPERATIONS IN NAND FLASH DEVICES

CROSS REFERENCE TO RELATED APPLICATIONS

This application is a continuation-in-part of U.S. application Ser. No. 12/329,929 filed Dec. 8, 2008, which claims the benefit of priority of U.S. Provisional Patent Application No. 61/025,920 filed Feb. 4, 2008 and of U.S. Provisional Application No. 61/081,910 filed Jul. 18, 2008, the contents of which are incorporated by reference in their entirety.

This application claims the benefit of priority of U.S. Provisional Patent Application No. 61/035,791, filed Mar. 12, 2008, the content of which is incorporated herein by reference in its entirety.

TECHNICAL FIELD

The present invention relates generally to nonvolatile semiconductor memories. More particularly, the present invention relates to semiconductor memories having flexible memory operations.

BACKGROUND

Flash memory is a commonly used type of non-volatile memory in widespread use as storage for consumer electronics and mass storage applications. Flash memory is pervasive in popular consumer products such as digital audio/video players, cell phones and digital cameras, for storing application data and/or media data. Flash memory can further be used as a dedicated storage device, such as a portable flash drive pluggable into a universal serial port (USB) of a personal computer, and a magnetic hard disk drive (HDD) replacement for example. It is well known that flash memory is non-volatile, meaning that it retains stored data in the absence of power, which provides a power savings advantage for the above mentioned consumer products. Flash memory is suited for such applications due to its relatively high density for a given area of its memory array.

SUMMARY

In a first aspect, the present invention provides a flash memory device. The flash memory device includes a memory element and core controller circuitry. The memory element is configured to perform memory operations, and includes at least two memory banks. Each of the at least two memory banks has local core circuitry, and has a configurable page size for receiving and providing data having different page sizes during memory operations. The core controller circuitry is configured to receive control signals corresponding to the memory operations and for concurrently controlling the at least two memory banks in response to the received control signals.

In one embodiment of the first aspect, the flash memory device further includes a row predecoder receiving a row address and a bank address. The row predecoder provides predecoded row addresses corresponding to a selected memory bank of the at least two memory banks in response to the bank address and the row address. In another embodiment of the first aspect, the flash memory device further includes a column predecoder receiving a column address and a bank address. The column predecoder provides a predecoded column address corresponding to a selected memory bank of the at least two memory banks in response to the bank address and the row address.

According to yet another embodiment of the first aspect, the core controller circuitry includes at least two core controllers configured for receiving the control signals corresponding to the memory operations, the at least two core controllers operating the local core circuitry of the at least two banks concurrently in response to the control signals. The flash memory device further includes a selector for selectively passing the control signals to a selected core controller of the at least two core controllers in response to a bank address. The selected core controller provides bank control signals in response to the control signals. In the present embodiment, the flash memory device includes a command interpreter for receiving a command, which decodes the command to provide the control signals and the bank address. In an alternate embodiment of the first aspect, each of the at least two memory banks includes two memory planes each having NAND memory cell strings connected to bitlines and wordlines connected to flash memory cells of each of the NAND memory cell strings. The two memory planes can each be adjacent a shared row decoder.

In another embodiment, the flash memory cells connected to a wordline forms a page unit having a predetermined page size, such that the configurable page size includes one of a single page unit from one of the two memory planes and two page units. The flash memory device can include page size configurators corresponding to each of the each of the at least two memory banks for selectively enabling activation of at least one wordline in each of the two memory planes in response to an address. Each of the at least two memory banks can include one of the page size configurators, and each of the two memory planes includes a row decoder enabled by the page size configurator for driving the at least one wordline with a global row drive signal. The two memory planes can be each adjacent a shared row decoder enabled by the page size configurator for driving the at least one wordline with a global row drive signal. The shared row decoder includes a row driver for selectively passing the global row drive signal to the at least one wordline in response to first and second enable signals provided by the page size configurator. The row driver includes a first pass transistor for passing the global row drive signal to a first wordline in response to the first enable signal, and a second pass transistor for passing the global row drive signal to a second wordline in response to the second enable signal. The first enable signal and the second enable signal are driven to a high voltage level greater than a voltage level of the global row drive signal, and the shared row decoder further includes a block decoder for providing a master voltage as the first enable signal in response to a first plane select signal, and as the second enable signal in response to a second plane select signal.

In another embodiment of the first aspect, each of the at least two memory banks includes four memory planes each having NAND memory cell strings connected to bitlines and wordlines connected to flash memory cells of each of the NAND memory cell strings. The flash memory device further includes a page size configurator corresponding to one of the at least two memory banks for selectively enabling activation of at least one wordline in each of the four memory planes of the one of the at least two memory banks, in response to an address. The four memory planes of the one of the at least two memory banks are arranged as a first tile and a second tile, the first tile and the second tile each having memory planes adjacent a shared row decoder. The page size configurator selectively enables activation of at least one wordline in each of the four memory planes in response to a tile address and a plane address. The flash memory cells connected to one wordline forms a page unit having a predetermined page size, and the configurable page size includes any combination of page units from each of the four memory planes.

In a second aspect, the present invention provides a method for operating a flash memory device. The method includes executing a first memory operation in a first memory bank having a configurable page size, and executing a second memory operation in a second memory bank having a configurable page size while the first memory operation is being executed in the first memory bank.

According to an embodiment of the second aspect, a first memory bank page size and a second memory bank page size are configured at power up of the flash memory device, and page size configuration commands for configuring the first memory bank page size and the second memory bank page size are provided after power up of the flash memory device. The page size configuration commands include configuration data stored in configuration registers corresponding to the first memory bank and the second memory bank. The page size configuration commands are provided any time before and after the first memory operation and the second memory operation are executed.

In another embodiment of the second aspect, executing the first memory operation includes configuring a first memory bank page size and executing the second memory operation includes configuring a second memory bank page size page. Executing the first memory operation includes receiving a first command including an op code corresponding to the first memory operation and configuration data corresponding to the first memory bank page size. Alternately, executing the second memory operation includes receiving a first command including an op code corresponding to the second memory operation and configuration data corresponding to the second memory bank page size. In the second aspect, the first memory operation and the second memory operation includes one of a read operation, a program operation and an erase operation.

In a third aspect, the present invention provides a system. The system includes a memory controller and a memory system. The memory controller provides commands for executing corresponding memory operations. The memory system has at least one memory device, where the at least one memory device having at least two memory banks. Each of the at least two memory banks has a configurable page size and is controllable for executing memory operations corresponding to the commands concurrently.

In one embodiment of the third aspect, the memory system includes a first memory device and a second memory device. The first memory device is connected to a common bus, where the common bus being connected to the memory controller, and the second memory device is connected to the common bus and in parallel with the first memory device. In an alternate embodiment, the memory system includes a first memory device and a second memory device. The first memory device is connected in series to the memory controller and has inputs for receiving the commands and outputs for providing the commands. The second memory device is connected in series to the first memory device and has inputs for receiving the commands. The second memory device has outputs for providing the commands to the memory controller.

In yet another embodiment of the third aspect, the at least one memory device includes core controller circuitry for receiving control signals corresponding to the commands. The core controller is configured to concurrently control local core circuits corresponding to each of the at least two memory banks in response to the received control signals. The system can include a command interpreter for decoding the commands and for providing the control signals.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 3D and 3E are timing diagrams of single data rate and double data rate operations of memory devices;

FIG. 19 is a table showing example operation commands;

DETAILED DESCRIPTION

The present invention generally provides nonvolatile semiconductor devices having flexible memory operations. Examples of the semiconductor devices are nonvolatile memories, such as, for example, flash memory devices.

Figure 1:
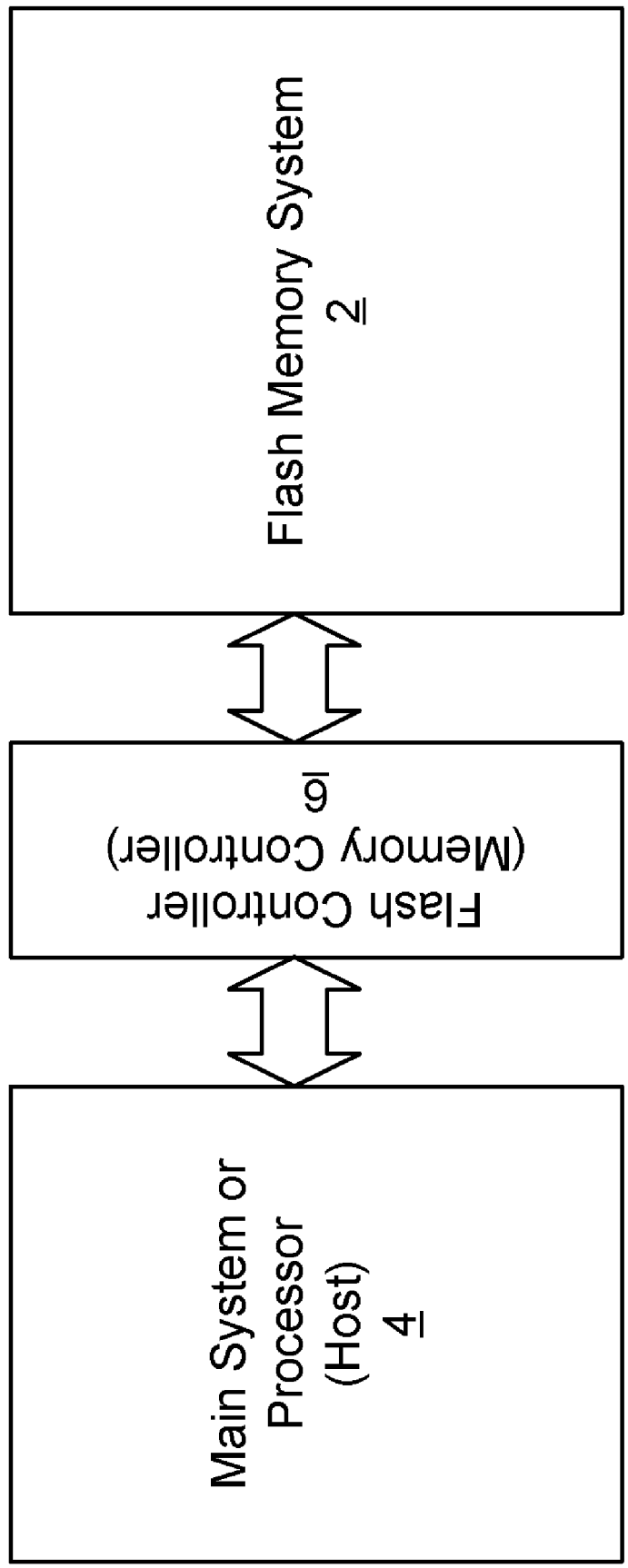
FIG. 1 is a block diagram of a global system including a host system, a memory controller and flash memory devices to which the present invention is applicable.

FIG. 1 shows a global system to which the present invention is applicable. Referring to FIG. 1, a flash memory system 2 communicates with a main system or processor (a host system) 4 via a flash controller (or a memory controller) 6. Flash memory system 2 includes a plurality of flash memory devices. The memory devices are connected in series or parallel.

Figure 2A:
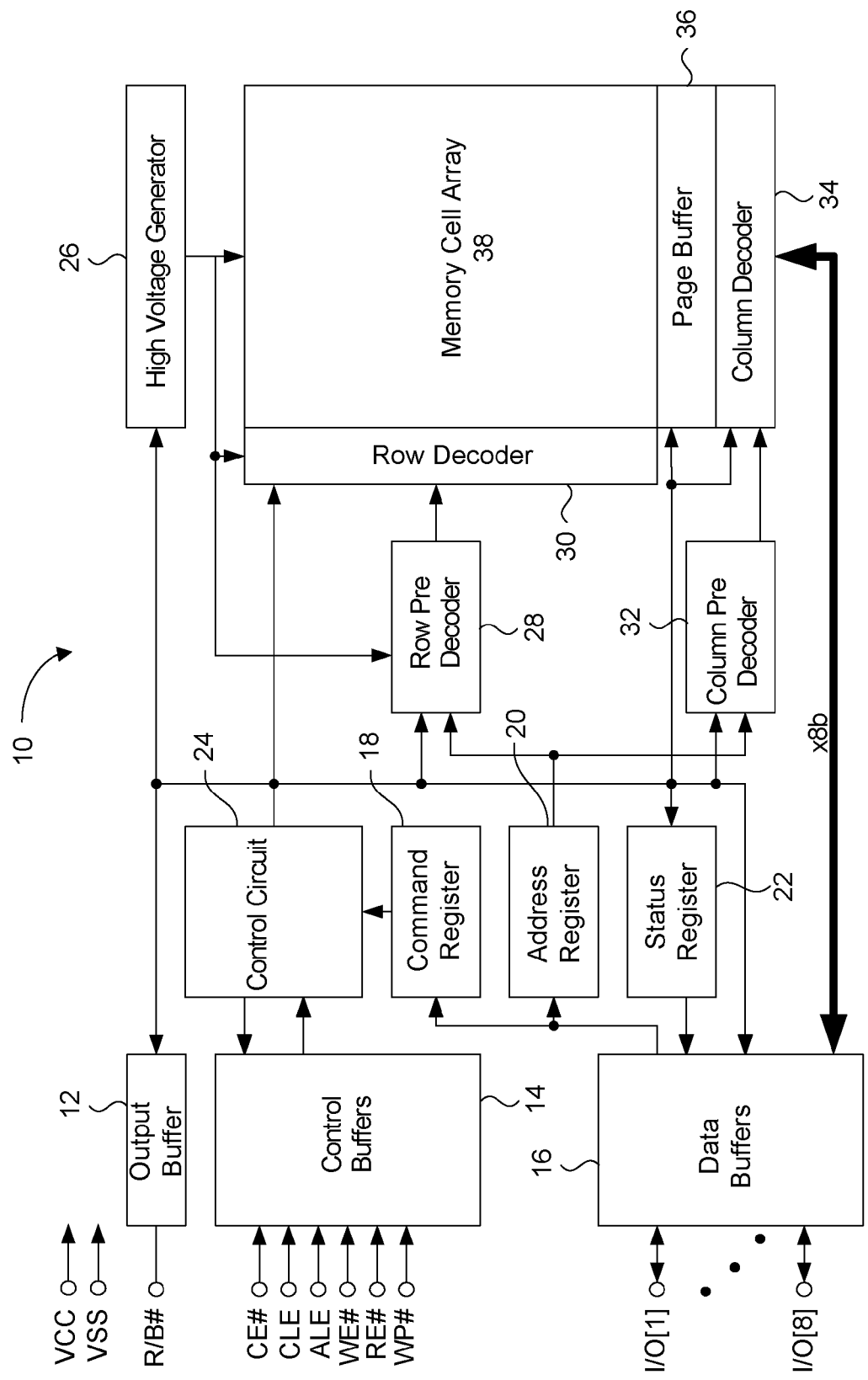
FIG. 2A is a block diagram of an example of a flash memory device for use in the flash memory system of FIG. 1.

FIG. 2A shows an example of a flash memory device for use in the flash memory system 2 of FIG. 1. The flash memory device is, for example an asynchronous flash memory device. Referring to FIG. 2A, a flash memory device 10, which is for example a NAND flash memory device, includes interface and control circuits also known as peripheral circuits, and core circuits. The interface and control circuits includes output buffer 12, control buffers 14, data buffers 16, command register 18, address register 20, status register 22, and control circuit 24. The core circuits include a high voltage generator 26, a row predecoder 28, a row decoder 30, a column predecoder 32, a column decoder 34, a page buffer 36, and a memory cell array 38. Those of skill in the art would understand the function of the circuits of the interface and control circuits, and many details are not shown in order to simplify the schematic. For example, the lines interconnecting the circuit blocks merely illustrates a functional relationship between connected blocks, without detailing the specific signals being used. Output buffer 12 drives the ready/busy (R/B#) output pin or port. Control buffers 14 include input buffers each connected to a respective input control pin or port. It is noted that the "#" character appended to the signal name denotes that the signal is an active low logic level signal, as should be well known to those skilled in the art. Data buffers 16 include bi-directional buffers for receiving and driving data onto a respective I/O pin or port. In the presently described example, control buffers 14 includes input buffers for the chip enable (CE#), command latch enable (CLE), address latch enable (ALE), write enable (WE#), read enable (RE#) and write protect (WP#) input control pins or ports. There are eight data I/O pins or port in the presently described example, therefore there are eight bi-directional buffers. Asynchronous input buffer and output buffer circuits are well known in the art, and do not need to be described in any further detail. Flash memory device 10 can be a discrete memory device that is packaged for use, or it can be embedded in a larger system such as an application specific integrated circuit (ASIC).

To execute operations such as erase, program and read in asynchronous flash memory device 10, a command is provided via the data I/O pins. The command includes an operation code (op code), address information and data. The operation code corresponds to a specific operation, depending on the operation being executed. It is noted that because address and write (program) data can be more than eight bits in length, several input iterations or cycles may be required before all the address and write data bits are latched in the proper registers. The op code data is latched in command register 18. Address information for read and program operations is latched in address register 20. The op code data latched by command register 18 is provided to control circuit 24. Control circuit 24 includes logic circuitry for decoding the op code, such as a command decoder or interpreter for example, and decodes the op code data, thereby providing decoded op code. Control circuit 24 further includes control logic circuitry that provides the internal control signals with the required timing for operating both the core circuits and any peripheral circuits of flash memory device 10. High voltage generator 26 provides a voltage level higher than the externally supplied VCC and VSS voltages, which is used for read, program and erase operations.

With respect to a read operation, row predecoder 28 and column predecoder 32 receive a row address and a column address, respectively, from address register 20. The predecoded row signals from row predecoder 28 are used by row decoder 30 to drive a wordline of memory cell array 38 for accessing a page of data. The data stored in the memory cells connected to the selected wordline is sensed and stored in page buffer 36 via bitlines. In memory cell array 38, continuous wordlines extend horizontally from the left side at row decoder 30 to the right side of memory cell array 38. The predecoded column signals from column predecoder 32 are used by column decoder 34 for selecting a set of 8 bits of data from page buffer 36 to output to data buffers 16. Eight bits are used by example, but other configurations can be used. The sequence and timing of asserted control signals originate from control circuit 24 in response to the received op code.

Figure 2B:
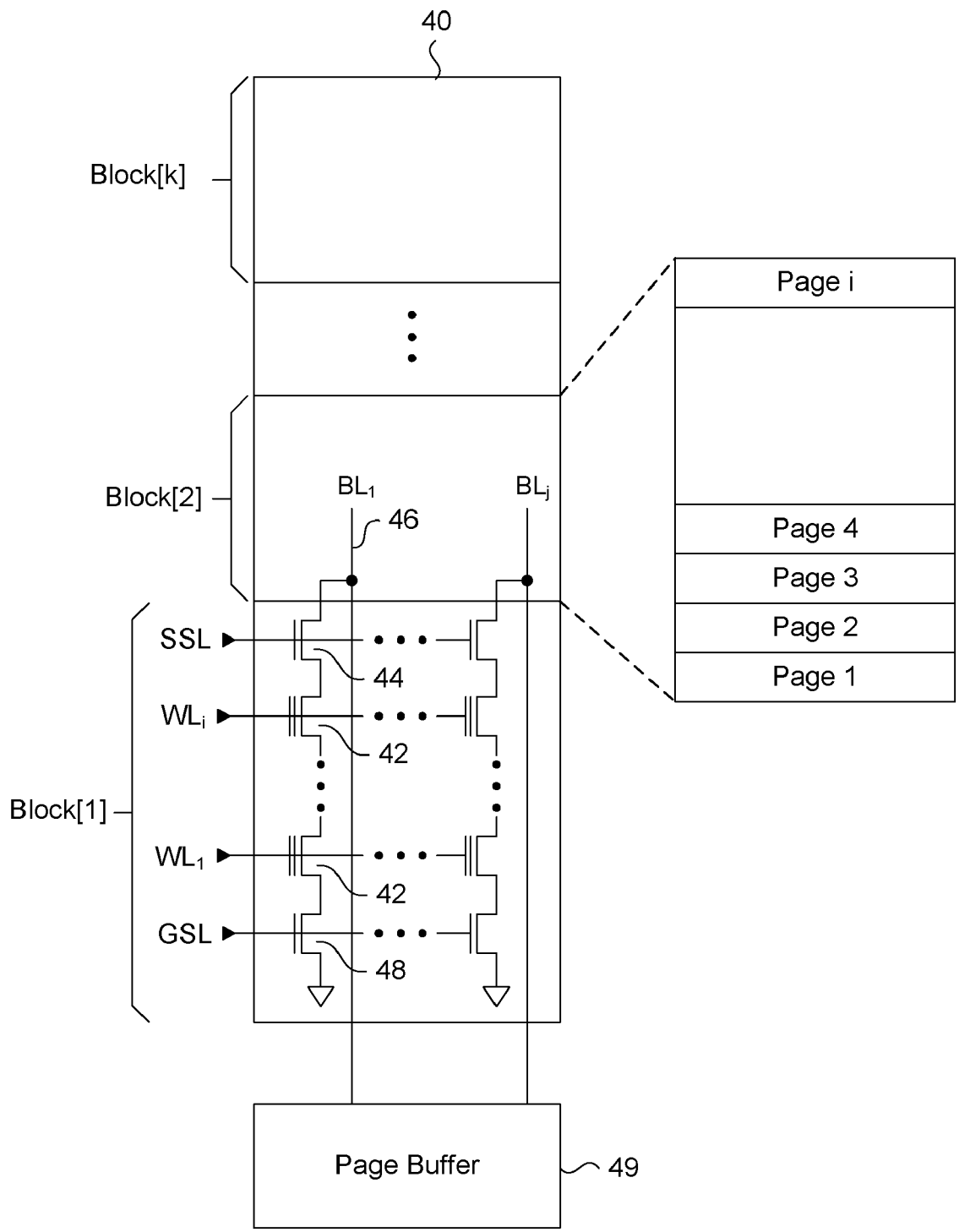
FIG. 2B is a schematic showing an example of a flash memory organization of a memory cell array of FIG. 2A.

FIG. 2B shows an example of a flash memory organization of memory cell array 38 of FIG. 2A. In the particular example, the flash memory is a NAND flash memory. Referring to FIG. 2B, memory array 40 is organized as blocks Block[1] to Block[k], k being an integer greater than one. Each of the blocks has the same structure. Each of the blocks has a plurality of pages 1 to i, i being an integer greater than one. Each of the pages corresponds to a row of memory cells coupled to a common wordline. A detailed description of the memory cells of the block follows.

Each of the blocks Block[1] to Block[k] has NAND memory cell strings, having flash memory cells 42 serially coupled to each other. Accordingly, wordlines $WL_1$ to $WL_i$ are coupled to the gates of each flash memory cell in the memory cell string. A string select device 44 receives string select line signal SSL (hereinafter referred to as an "SSL" signal) and selectively connects the memory cell string to a bitline 46. A ground select device 48 receives ground select line signal GSL (hereinafter referred to as a "GSL signal") and selectively connects the memory cell string to a source line to which the source line voltage VSS is provided. String select device 44 and ground select device 48 are n-channel transistors. Bitlines $BL_1$ to $BL_j$ 46 are common to all blocks of memory array 40, where j is a non-zero integer value. Each bitline 46 is coupled to one NAND memory cell string in each of blocks [1] to [k]. In one block, the wordlines $WL_1$ to $WL_i$ and the SSL and GSL signals are provided to the same corresponding transistor devices in each NAND memory cell string. Data stored in the flash memory cells along one wordline is referred to as a "page of data".

Coupled to each bitline outside of the memory array 40 is a page buffer 49 for storing one page of write data to be programmed into one page of flash memory cells. Page buffer 49 includes registers, sense circuits for sensing data read from one page of flash memory cells, and verify logic circuitry. During programming operations, page buffer 49 performs program verify operations to ensure that the data has been properly programmed into the flash memory cells coupled to the selected wordline. To achieve high density, each flash memory cell can either be single level cells (SLC) for storing two logic states, or multi-level cells (MLC) for storing at least two bits of data.

Returning to FIG. 2A, memory cell array 38 with its corresponding row decoder 30, page buffer 36 and column decoder 34 has a practical limit, which is defined by the length of the wordlines and the bitlines. This can be due to a reduction in performance, yield or a combination thereof when the wordlines and bitlines become too long, which is an effect that is well known to persons of skill in the art. One technique for addressing this problem is to place the row decoder in the middle of the memory array, thereby resulting in segmented physical wordlines that are logically the same. This allows the dimensions of the memory cell array 38 to be increased in size because the row decoder can be shared. One of the driving factors for increasing the size of the memory cell array 38 is the desired increase in the page size. Large page sizes are well suited for multi-media applications such as music, photo and video because the file size to be programmed is typically larger than the maximum page size. Furthermore, the total program time may be nearly the same regardless of the page size, thereby resulting in higher program throughput that further benefits multi-media applications.

While the length of the wordline segments can be increased, eventually the same performance and yield problems will arise as the wordline lengths are increased. Therefore to accommodate large capacity memory devices, a second memory cell array is introduced as part of the memory array.

Figure 2C:
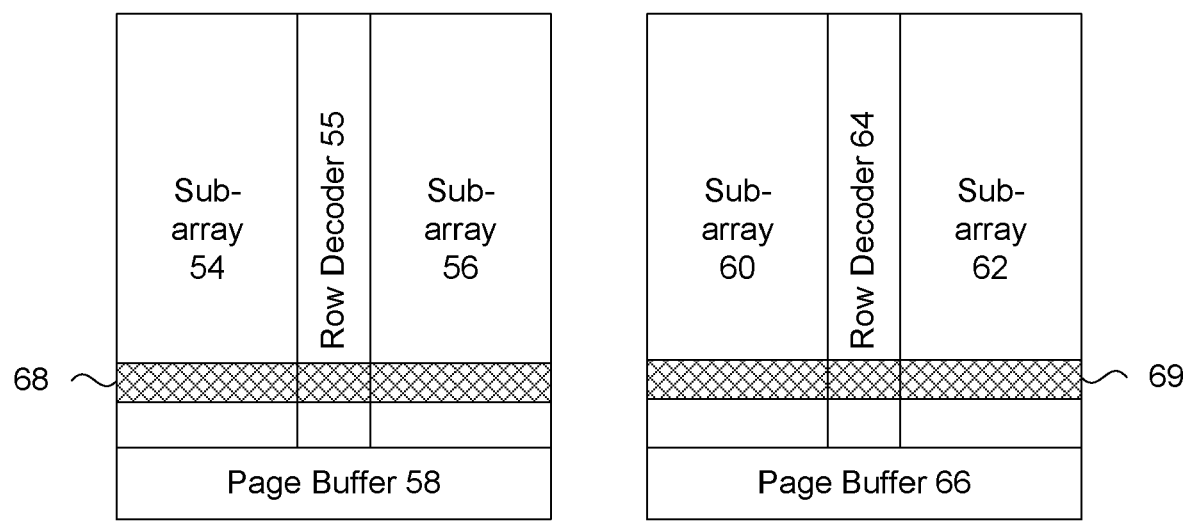
FIG. 2C is an illustration of an example of a memory array organized as four sub-arrays for use in the memory cell array of FIG. 2A.

FIG. 2C shows an example of a memory array organized as four sub-arrays for use in memory cell array 38 of FIG. 2A. In the particular example, the memory array includes sub-array 54, sub-array 56, sub-array 60 and sub-array 62. Referring to FIG. 2C, two sub-arrays 54 and 56 are positioned on both sides of a row decoder 55, and a page buffer 58 is located at one end of sub-arrays 54 and 56. The other two sub-arrays 60 and 62 are positioned on both sides of a row decoder 64, and a page buffer 66 is located at one end of sub-arrays 60 and 62. Collectively, page buffers 58 and 66 store one page of data, and each sub-array has the basic NAND flash memory organization shown earlier in FIG. 2B. In this example, pairs of sub-arrays share one common row decoder, such that the same logical wordline extends horizontally from the row decoders into each sub-array. It is assumed that each of the page buffers is associated with respective column decoder, such as column decoder 34 shown in FIG. 2A.

In the four sub-array memory array configuration of FIG. 2C, one page of data is read or programmed by simultaneously selecting, or activating, one row in each of sub-arrays 54, 56, 60 and 62. For example, sub-arrays 54 and 56 are programmed by loading page buffer 58 with a half page of data and sub-arrays 60 and 62 are programmed by loading page buffer 66 with the other half page of data, then executing programming operations to write the data to page portions 68 and 69. When reading for example, one row in each of each of sub-arrays 54, 56, 60 and 62 (i.e., page halves 68 and 69) is activated and the data is sensed and stored in page buffers 58 and 66 for subsequent burst read-out.

While multi-media applications reap the benefits of increasing page sizes, other applications using such NAND flash memory may suffer from degraded performance and reliability. Such applications include flash cache and solid state drives (SSDs) for hard disk drive (HDD) replacement. In these applications, the file sizes are much smaller than multi-media files, and are frequently updated. For example, a small file may only occupy ¼ of the capacity of the page size, which is quantitatively a small portion of the page and even smaller relative to the memory block associated with the page. However each time the data is modified, which occurs frequently for SSD and cache applications, the entire memory block needs to be first erased. In FIG. 2C for example, page portions 68 and 69 are both erased prior to a programming operation. As previously mentioned, each memory block includes many pages that store other previously programmed data. Thus well known operations such as page copy operations need to be executed to retain the other data that is not being modified. This contributes significantly to reduced endurance of the memory device because the other memory cells in the same page not being modified are subjected to unnecessary erase and program cycles.

In the presently described example, the memory cells corresponding to the remaining ¾ of the page are subjected to program and erase cycles even though the data stored here is not being modified. This problem can be addressed with complex wear leveling schemes, but at the cost of degraded system performance. Hence, power consumption is high relative to the small amount of data per page that is to be programmed or modified. Accordingly, current NAND flash memory devices have prematurely reduced endurance and poor performance, which makes them unsuited for applications where data smaller than the preset physical page size is frequently written to the memory array, such as in SSD applications for example.

According to an embodiment of the present invention, there is provided a flash memory device having at least one bank, where each bank has an independently configurable page size and core control logic. The core control logic is local to each bank, and governs memory access operations for the bank that include read, program and erase operations. Each core control logic controls timing and activation of row circuits, column circuits, voltage generators, and local input/output path circuits for a corresponding memory access operation of the bank. Concurrent operations are executable in a plurality of banks to improve performance. Each bank has a page size that is configurable with page size configuration data such that only selected wordlines are activated in response to address data. The configuration data can be loaded into the memory device upon power up for a static page configuration of the bank, or the configuration data can be received with each command to allow for dynamic page configuration of the bank.

Figure 3A:
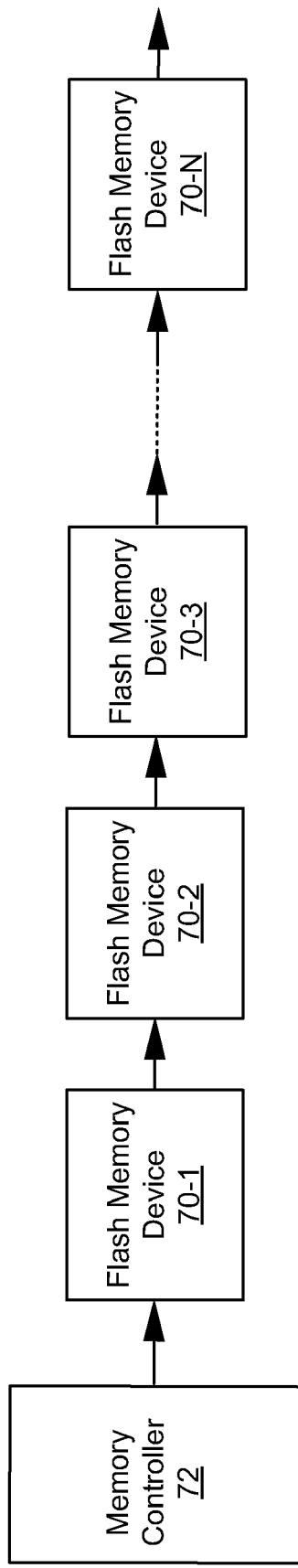
FIG. 3A is a block diagram of an example of a system including a memory controller and a plurality of flash memory devices to which the present invention is applicable.

FIG. 3A shows an example of a system including a memory controller and a plurality of flash memory devices to which the embodiments of the present invention are applicable.

Referring to FIG. 3A, a plurality of N flash memory devices 70-1 to 70-N are connected in series with a memory controller 72, which communicates with the series-connected flash memory devices. Data is transmitted from one device to a next or subsequent device. The two neighboring devices are interconnected through a serial or parallel link. The memory controller 72 and flash memory devices 70-1-70-N correspond to the flash controller 6 and flash memory system 2 of FIG. 1, respectively. In this example, the last device, Device 70-N provides output data to another device, circuit or controller (not shown).

Figure 3B:
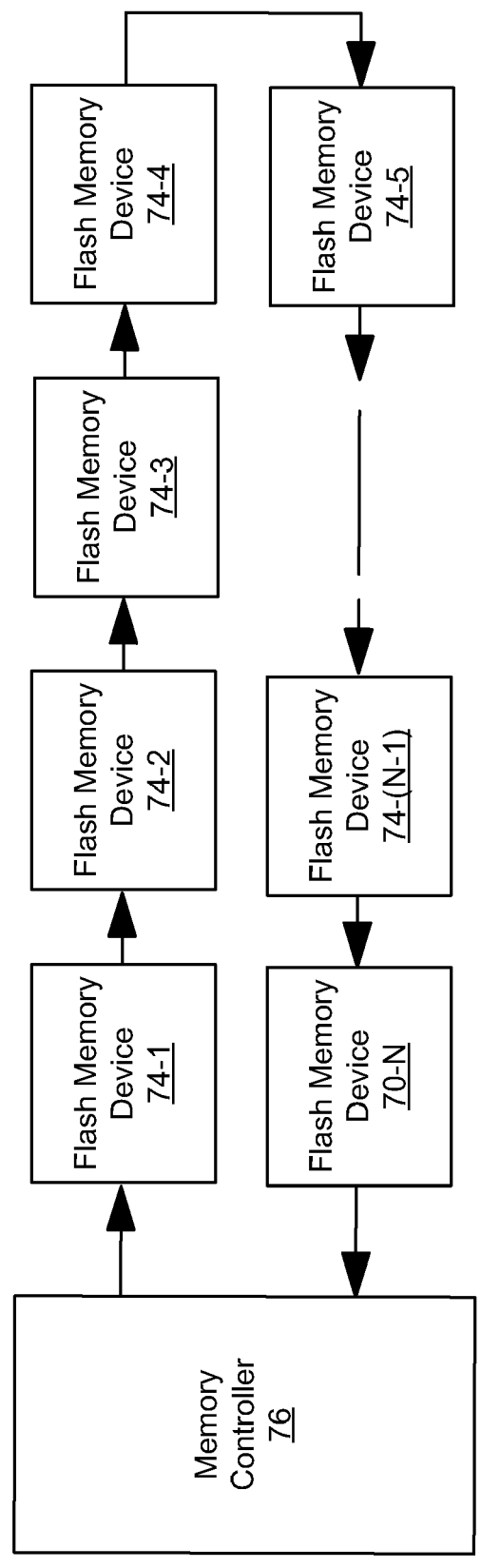
FIG. 3B is a block diagram of another example of a system including a memory controller and a plurality of flash memory devices to which the present invention is applicable.

FIG. 3B shows another example of a system including a memory controller and a plurality of flash memory devices to which the present invention is applicable. Referring to FIG. 3B, a plurality of N flash memory devices 74-1 to 74-N are connected in series with a memory controller 76, which communicates with the series-connected flash memory devices. Data is transmitted from one device to a next device. The two neighboring devices are interconnected through a serial or parallel link. In this example, the last device, Device 74-N provides output data to memory controller 76. The memory controller 76 and flash memory devices 74-1-74-N correspond to the flash controller 6 and flash memory system 2 of FIG. 1, respectively.

Figure 3C:
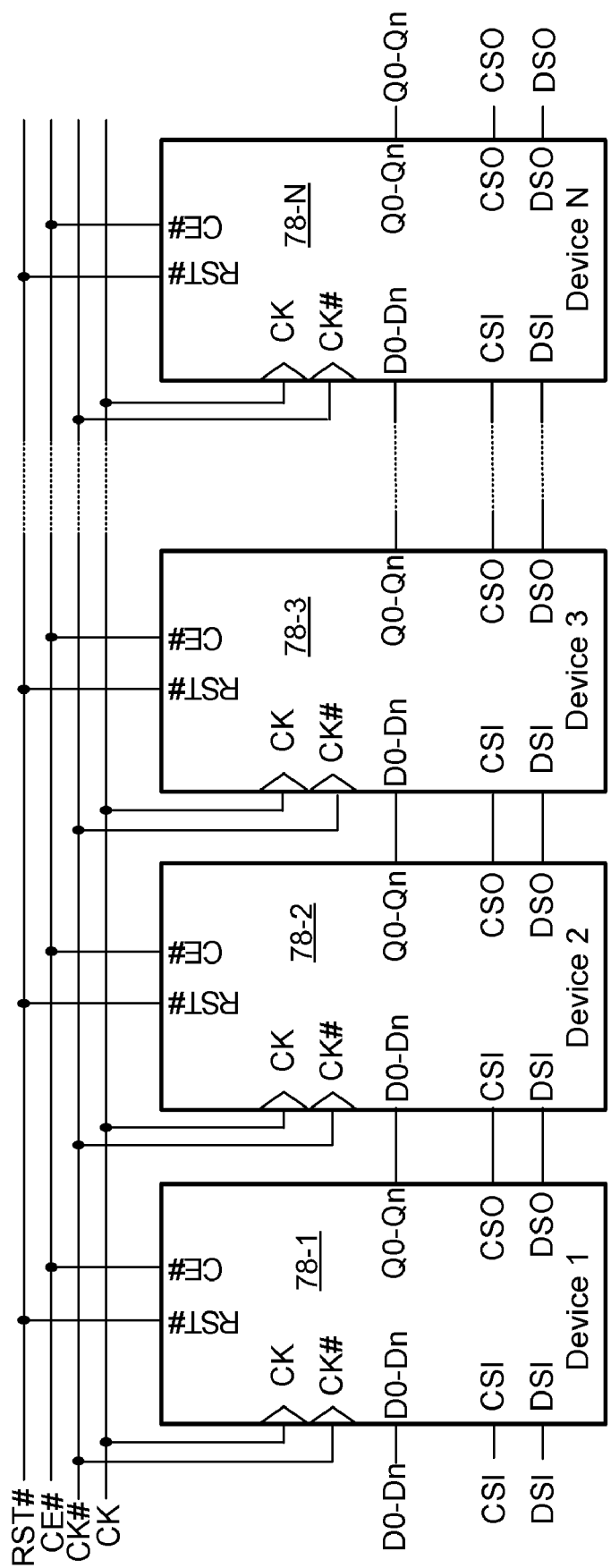
FIG. 3C shows a series-connection configuration of the plurality of semiconductor devices shown in FIGS. 3A and 3B.

FIG. 3C shows a series-connection configuration of the plurality of semiconductor devices (or flash memory devices) shown in FIGS. 3A and 3B. Referring to FIG. 3C, a series-connection configuration of a plurality (N) of semiconductor devices 78-1 to 78-N that have a common synchronous clock structure. A controller (not shown) sends parallel data (e.g., (n+1)-bit data D0-Dn) and control signals including a command strobe input (CSI) signal and a data strobe input (DSI) signal to a first device (e.g., Device 1). Device 1 (78-1) provides (n+1)-bit output data (Q0-Qn), a command strobe output (CSO) signal and a data strobe output (DSO) signal to the next device, such as Device 2 (78-2). The CSO and DSO signals are echo of the CSI and DSI signals, respectively. Similarly, Device 2 (78-2) transmits data and control signals to the next device 78-3. The controller provides clock signals CK/CK#, a chip enable signal CE# and a reset signal RST# to each of the devices in parallel. In FIG. 3C, the same reference sign is used for a signal (or data) and its corresponding connection. The system is configured for parallel clock operation, meaning that all the semiconductor devices receive the clock signals in parallel. The last device, Device N (78-N), may be connected to the memory controller or another component (not shown).

Data can be transferred or captured in response to the clock signals CK/CK#. More specifically, the operation can be performed in response to rising edges and/or falling edges of the clock signals. Accordingly, the memory devices can perform single data rate (SDR) operation and double data rate (DDR) operation as shown in FIGS. 3D and 3E, respectively. Also, the memory devices may operate with more than twice during the clock cycle.

Figure 3F:
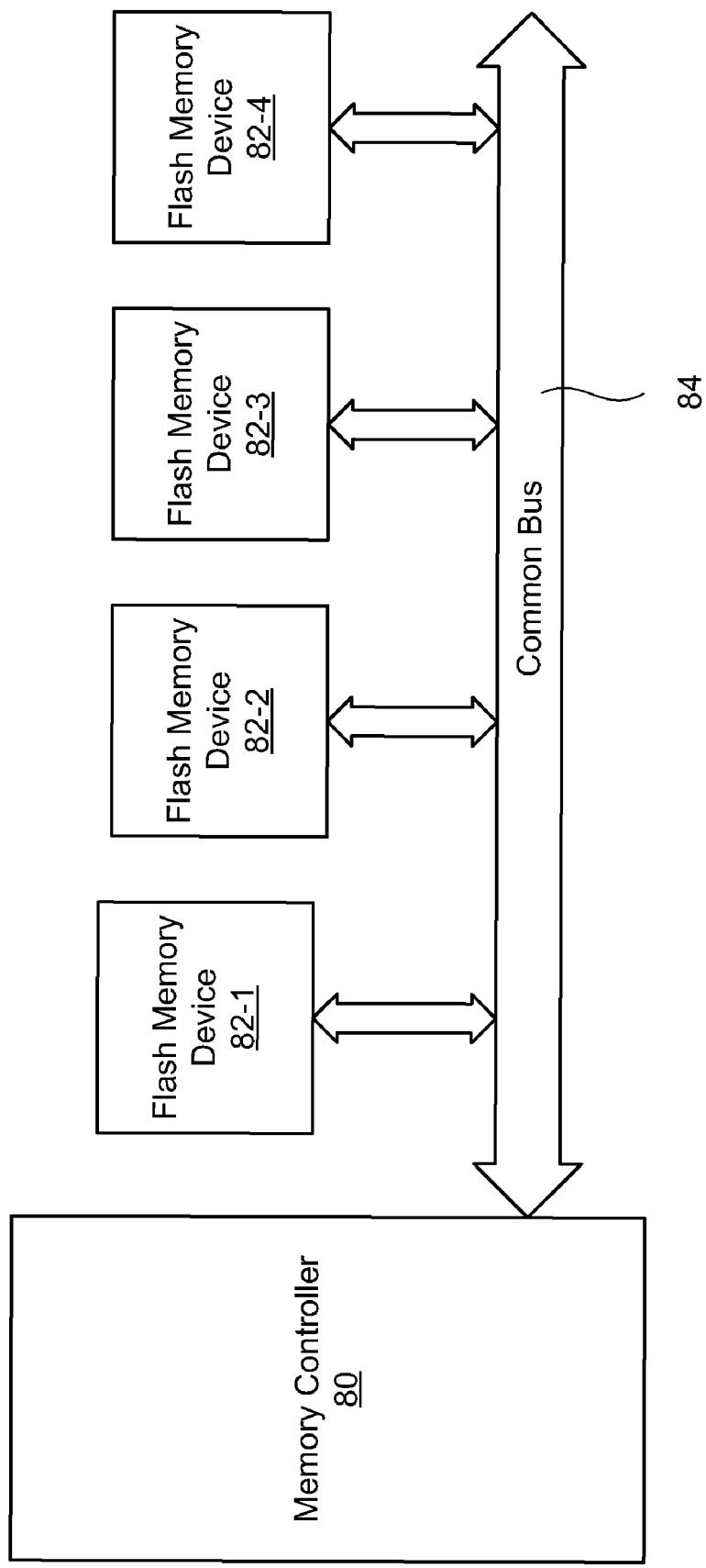
FIG. 3F is a block diagram of an example of a system including a memory controller and a plurality of parallel connected flash memory devices to which the present invention is applicable.

FIGS. 3A, 3B and 3C are examples of serially connected memory devices to which the embodiments of the present invention can be applied to. The embodiments of the present invention are applicable to memory systems having parallel connected memory devices. FIG. 3F is a block diagram of a memory system having a plurality of flash memory devices that are connected in parallel. In the particular example shown in FIG. 3F, the memory system includes four flash memory devices. A memory controller 80 is connected to flash memory devices 82-1, 82-2, 82-3 and 82-4 in parallel, via common bus 84. Memory controller 80 corresponds to memory controller 6 of FIG. 1, while flash memory devices 82-1, 82-2, 82-3 and 82-4 correspond to flash memory system 2 of FIG. 1. The parallel connected flash memory device configuration is commonly referred to as a multi-drop configuration. Each of flash memory devices 82-1, 82-2, 82-3 and 82-4 has a parallel input/output interface for receiving and providing data, and is typically referred to as an asynchronous flash memory device, similar to flash memory device 10 shown in FIG. 2A.

Figure 3G:
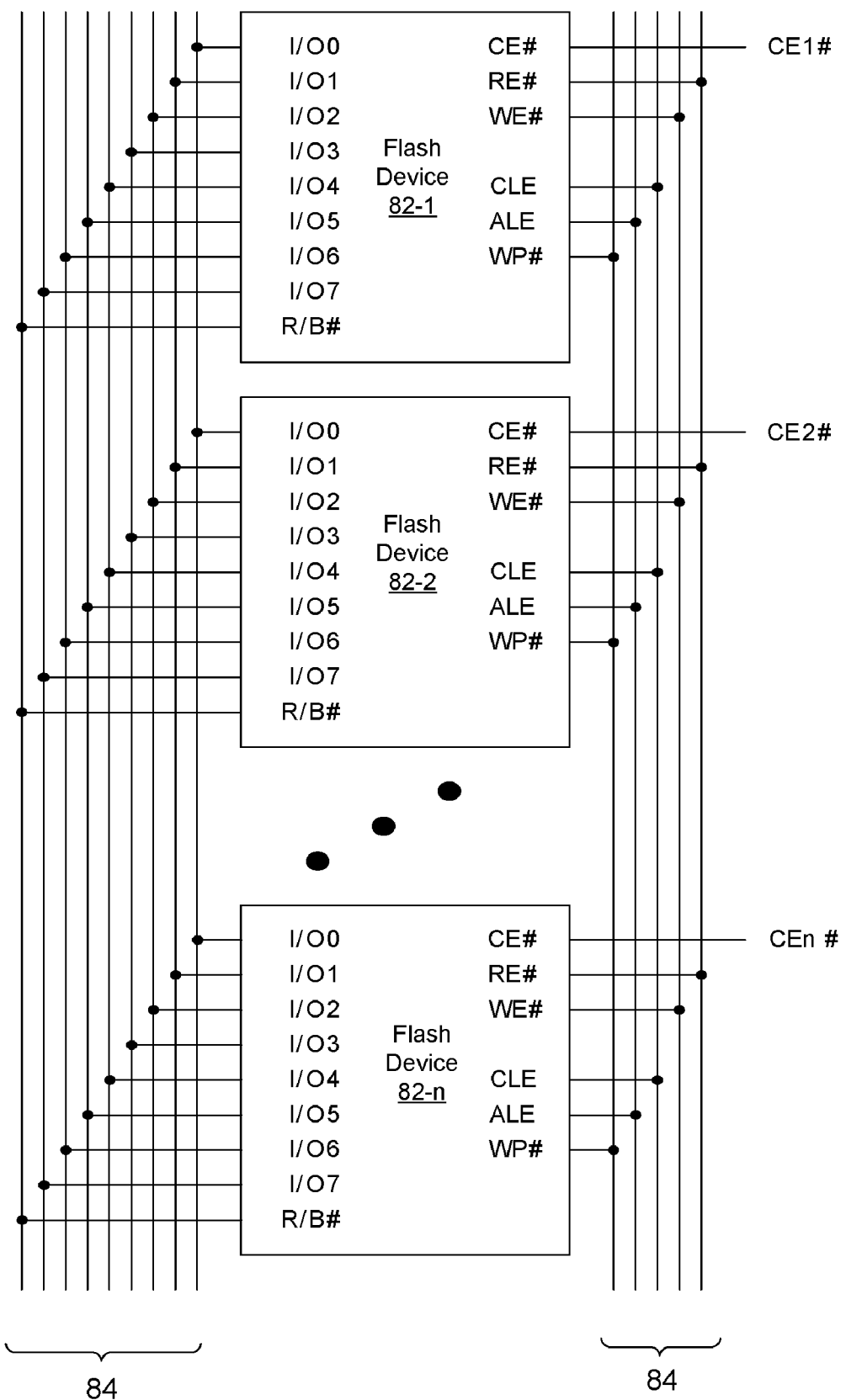
FIG. 3G shows a parallel-connection configuration of the plurality of semiconductor devices shown in FIG. 3F.

FIG. 3G shows interconnection details of the memory system of FIG. 3F. The memory controller 80 is omitted from FIG. 3G, which shows n flash memory devices connected in parallel to each other, labeled 82-1 to 82-n. The common bus 84 carries data lines I/O0 to I/O7, control signals R/B#, RE#, WE#, CLE, ALE and WP#. The chip enable signals CE1# to CEn# are provided to each flash memory device.

Figure 4:
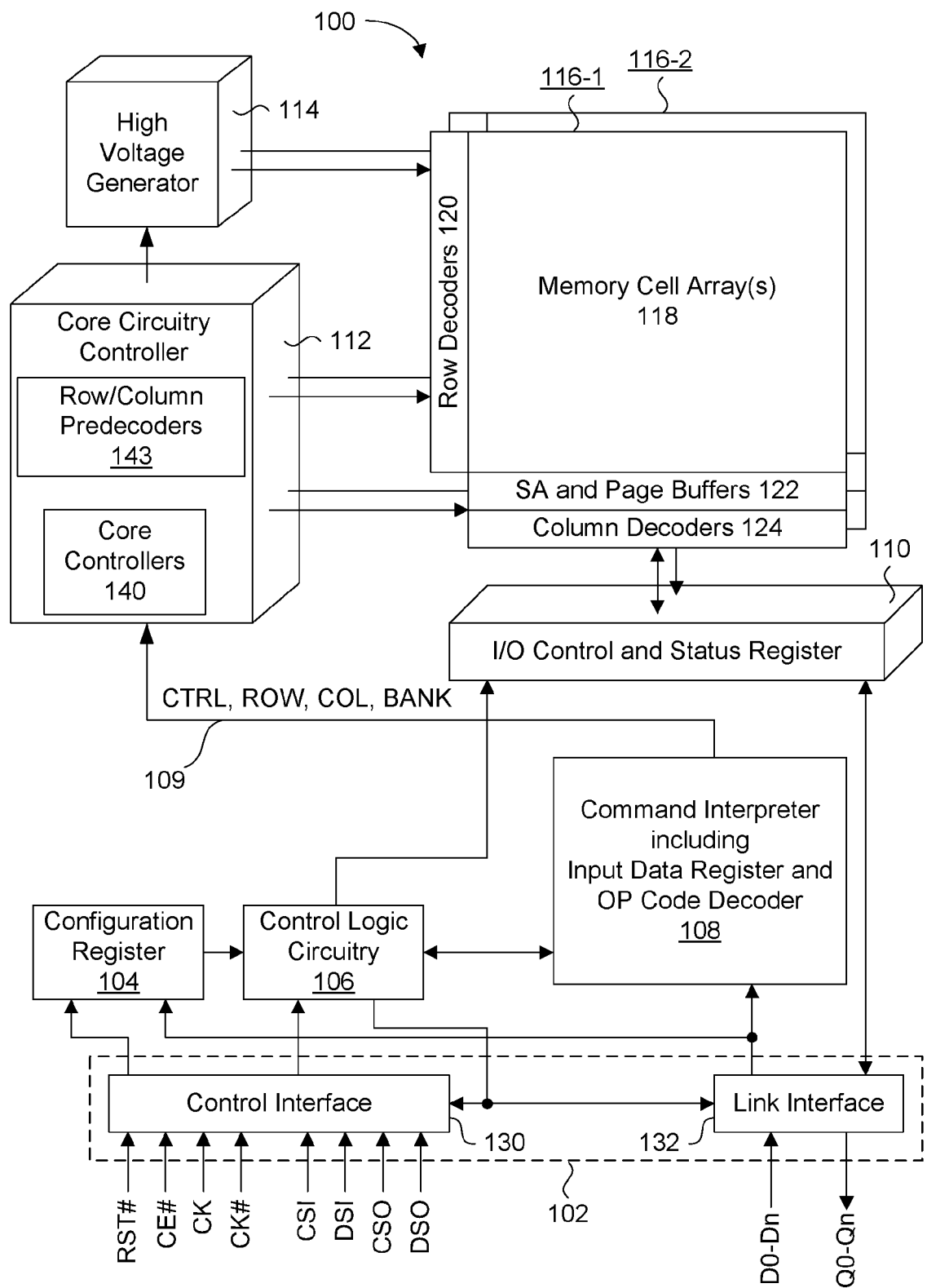
FIG. 4 is a block diagram of a flash memory device according to an embodiment of the present invention.

FIG. 4 is a block diagram of a flash memory device according to an embodiment of the present invention, the flash memory device having a plurality of memory banks. Referring to FIG. 4, a multi-bank flash memory device 100 includes interface and control circuits, core circuits, and memory elements. The interface and control circuits include peripheral circuits such as input/output interface 102, configuration register 104, control logic circuitry 106 and command interpreter 108. The core circuits include I/O control logic and status register 110, core circuitry controller 112 and high voltage generator 114. Core circuitry controller 112 includes core controllers 140 and row and column predecoders 144. The memory element of multi-bank flash memory device 100 includes a plurality of memory banks. Multi-bank flash memory device 100 may include two banks or more than two banks. In the presently shown embodiment, the memory element includes a first memory bank 116-1 and a second memory bank 116-2, each with local core circuits.

The memory elements are not limited to having two memory banks, and can have any number of memory banks depending on the desired memory capacity of multi-bank flash memory device 100. Command interpreter 108 includes input data register and an op code decoder, and extracts from a command, row address information ROW, column address information COL, bank address information BANK, and control signals CTRL derived from the decoded op code, to core circuitry controller 112. As will be described later, the aforementioned addresses and control signals are provided in one or more commands received by link interface 132. In FIG. 4, all these signals are shown to be collectively provided to core circuitry controller 112 via line 109.

The local core circuits of one memory bank (e.g., bank 116-1) include row decoders 120, sense amplifier (SA) and page buffers 122, and column decoders 124. The overall function of these local core circuits would be apparent to those of skill in the art, hence details of their operation are not described. Row decoders 120, SA and page buffers 122 and column decoders 124 are shown in FIG. 4 as functional representations only, and do not represent the physical arrangement of respective fabricated circuits in the bank. More specifically, the selected memory architecture being used determines the number and physical layout or placement of the aforementioned circuits in the bank. Each bank has a memory cell array 118 including NAND flash memory cells organized in a memory architecture, having a page size which is configurable in size. Therefore, each bank of multi-bank flash memory device 100 can be configured to have different page sizes. As will be discussed later, each bank and its local core circuits can be organized as individual planes. Further details of possible memory architectures for bank 116-1 or 116-2 are discussed later. Memory bank 116-2 and any other memory banks have the same local core circuits as memory bank 116-1.

The interface and control circuits are responsible for receiving control signals and commands following a predetermined protocol, and for receiving write data to be programmed to the memory elements and for providing read data therefrom. In multi-bank flash memory device 100, the write data can be programmed to any one of banks 116-1 and 116-2, and the read data can be provided from any one of banks 116-1 and 116-2. Input/output interface 102 is designed for receiving and providing data in a serial format, meaning that write and read data is received and provided in at least one data bitstream. Alternately, input/output interface 102 can be designed for receiving and providing data in a parallel format, as is well known in the art.

Input/output interface 102 includes a control interface 130 and a link interface 132. Control interface 130 receives a command strobe input (CSI) signal, a command strobe output (CSO) signal (echo of CSI), data strobe input (DSI) signal, a data strobe output (DSO) signal (echo of DSI), a chip enable signal CE#, a reset signal RST#, and complementary clock signals CK and CK#. Link interface 132 has an output port Qn for providing read data and an input port Dn for receiving write data. Both the output port Qn and the input port Dn can be one bit in width, or n bits in width where n is a non-zero integer, depending on the desired configuration. For example, if n is 1 then one byte of data is received after eight data latching edges of the clock. A data latching clock edge can be a rising clock edge for example. If n is 2 then one byte of data is received after four latching edges of the clock. If n is 4 then one byte of data is received after two latching edges of the clock. The memory device can be statically configured or dynamically configured for any width of Qn and Dn. Hence, in a configuration where n is greater than 1, a memory controller (e.g., a memory controller 6 shown in FIG. 1) provides data in parallel bitstreams. Input/output interface 102 designed for serial operation has been previously described in detail in International Publication WO/2007/036047 (5 Apr. 2007), the contents of which are incorporated by reference in its entirety. Input/output interface 102 allows for any number of multi-bank flash memory devices 100 to be connected in series with each other to form a memory system. Multi-bank flash memory device 100 can use a serial or parallel input/output interface and can use an asynchronous interface substantially the same as the one shown in FIG. 2A.

Configuration register 104 stores configuration data relating to the width of output and input ports Qn and Dn, and optionally, configuration data relating to the selected page sizes for each of banks 116-1 and 116-2. This configuration data can be provided at power up or via received commands. Control logic circuitry 106 is responsible for rudimentary control of the circuits of input/output interface 102 and I/O control logic and status register 110. For example, in response to a read command and activation of specific input control signals, control logic circuitry 106 ensures that read data from either bank 116-1 or 116-2 is output through output port Qn.

In response to the clock signals CK/CK#, data D0-Dn is provided to the input data register of command interpreter 108. The command included in the data stored in input data register is decoded by the op code decoder included in command interpreter 108. In response to the interpreted command (the decoded op code), the addresses (of column and/or row) included in the data stored in input data register are provided to core circuitry controller 112. In particular, these internal control signals are provided to specific control circuits within core circuitry controller 112 that are dedicated for controlling the local core circuits corresponding to a memory bank. The local core circuits of the memory bank are thus controlled for executing the corresponding algorithm related to the op code. Functions and operations of the input data register and the op code interpreter of command interpreter 108 are described in International Publication WO/2007/036047.

The local core circuits manage operations of each of the plurality of memory banks including banks 116-1 and 116-2. The operations include read, program and erase operations, for example, and are performed in response to control signals, addresses and voltages. Data is transmitted between banks 116-1, 116-2 and link interface 132. Hence, I/O control logic and status register 110 includes data path circuits for selectively routing data from a specific bank to link interface 132 of input/output interface 102. High voltage generator 114 provides any required voltages greater than the supply voltage VCC to banks 116-1 and 116-2. While not shown in FIG. 4, the VCC and VSS supply voltages are provided to the multi-bank flash memory device 100, and to the high voltage generator 114. Core circuitry controller 112 includes core controllers 140, and row and column predecoders 143. Row and column predecoders 143 receive address information and provides decoded row addresses and column addresses. The decoded row addresses are provided to row decoders 120 for activation of a selected row or block. The decoded column addresses are provided to SA and column decoders 122 for activation of a particular column.

In the presently described example, there is a core controller associated with each bank, for controlling the circuits of that bank. Each core controller can be considered a state machine that activates circuits of its corresponding bank in a particular sequence for executing the operation specified in the received command. Because there is one core controller per bank, banks 116-1 and 116-2 can execute the same type or different types of operations at substantially the same time. Read, program and erase operations have associated with them an inherent latency required for completing an initiated operation. For example, once a read operation is initiated in the bank through activation of a wordline, then a certain amount of time is required before the current can be reliably sensed on the bitlines. This time corresponds to a read latency of the memory bank. Similar inherent latencies are associated with program and erase operations. Therefore, because the multi-bank flash memory device 100 receives one command at a time, different operations can be initiated in different banks sequentially and immediately after the other. Once initiated, the operations are considered concurrent because the operation of the circuits of one bank function independent of the circuits of another bank. If multi-bank flash memory device 100 includes only one core controller shared by two banks 116-1 and 116-2, no operation can be initiated in a second bank until the operation of the first bank is completed.

Therefore, the ability to execute the same type or different types of operations in multiple banks concurrently provides users flexibility and performance benefits, since one page of data can be read or programmed in one bank (e.g., bank 116-1), while a second page of data can be concurrently read or programmed in another bank (e.g., bank 116-2). Erase operations are executed on a block of pages at the same time, and can be executed in one bank concurrently with any other operation in another bank. While multi-media applications benefit from large page sizes, SSD applications accelerate wear of the memory cells because even the memory cells in the same page that are not being programmed must first be erased, thereby exposing the memory cells to unwanted and unnecessary erase cycles. While complex data management algorithms can be executed in the background to re-organize and manage the data, such as page copy operations for re-distributing the data in the physical locations of the memory, these algorithms inevitably reduce overall performance. In order to improve the performance, each of the banks 116-1 and 116-2 have configurable page sizes. Thus, the page size for one bank (e.g., bank 116-1) can be set independently from that of another bank (bank 116-2), depending on the application.

Figure 5:
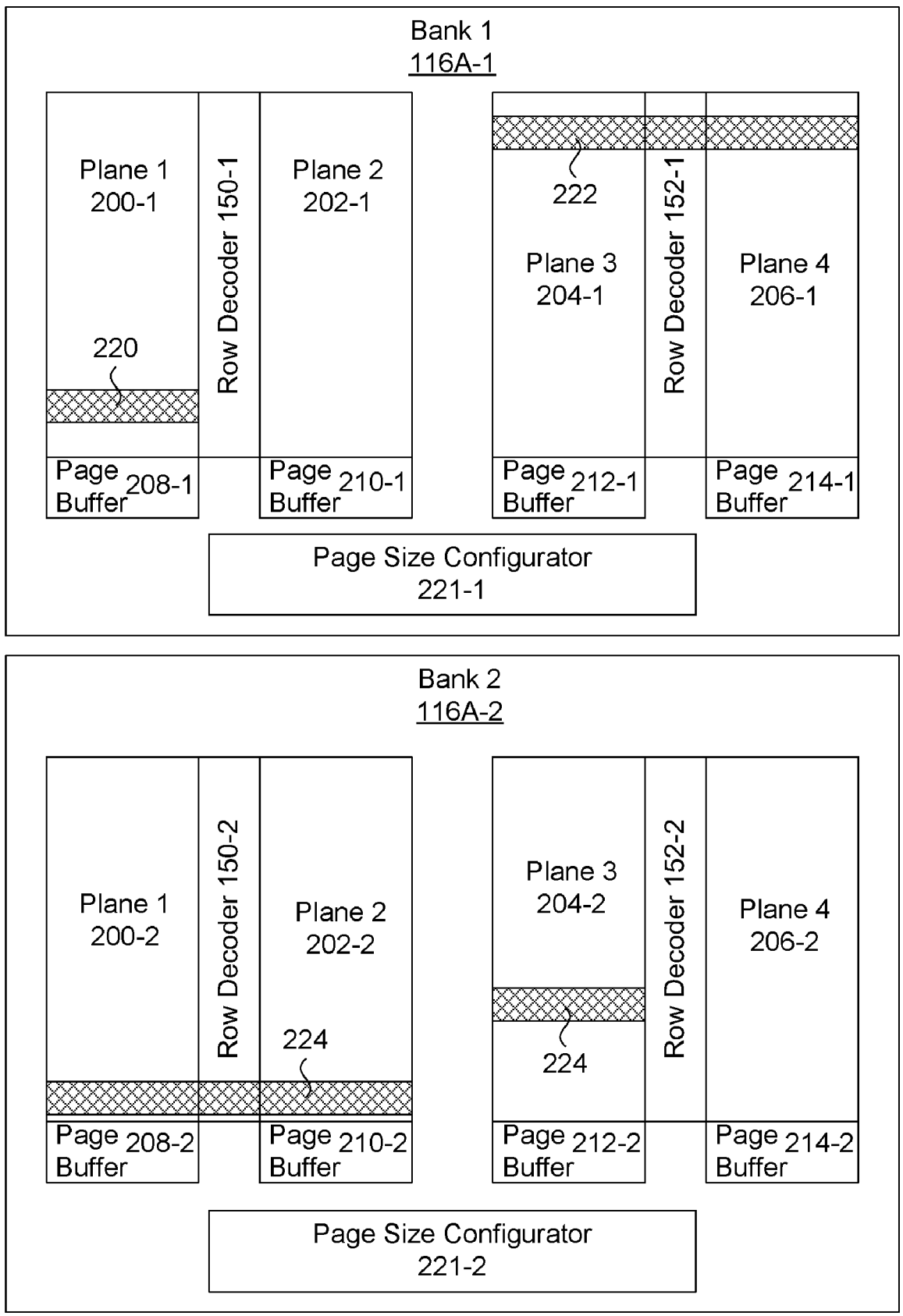
FIG. 5 is an illustration of an example of a memory architecture having configurable page size in memory banks of the flash memory device of FIG. 4.

FIG. 5 illustrates a memory architecture for memory banks 116-1 and 116-2 of multi-bank flash memory device 100 shown in FIG. 4. Referring to FIG. 5, each of banks (bank 1) 116A-1 and (bank 2) 116A-2 has configurable page sizes. In multi-bank flash memory device 100, each memory bank has a similar configuration. Memory bank 116A-1 includes four planes "Plane 1" 200-1, "Plane 2" 202-1, "Plane 3" 204-1 and "Plane 4" 206-1. Planes 200-1, 202-1, 204-1 and 206-1 have page buffers 208-1, 210-1, 212-1 and 214-1, respectively. Similarly, memory bank 116A-2 includes four planes "Plane 1" 200-2, "Plane 2" 202-2, "Plane 3" 204-2 and "Plane 4" 206-2. Planes 200-2, 202-2, 204-2 and 206-2 have page buffers 208-2, 210-2, 212-2 and 214-2, respectively. Each of page buffers 208-1, 210-1, 212-1, 214-1 and 208-2, 210-2, 212-2 and 214-2 has the same function as page buffer 58 or 66 shown in FIG. 3. In order to minimize circuit area, planes 200-1 and 202-1 share a common row decoder 150-1 and planes 204-1 and 206-1 share a common row decoder 152-1 in bank 116A-1. Similarly, planes 200-2 and 202-2 share a common row decoder 150-2 and planes 204-2 and 206-2 share a common row decoder 152-2 in bank 116A-2. As such, two planes share a common row decoder and are referred to as a "tile". Hence there are two tiles in each of banks 116A-1 and 116A-2. The number of planes or tiles in each bank is a design choice for multi-bank memory device 100.

Planes 200-1, 202-1 and 204-1, 206-1 have wordlines (not shown) extending horizontally from their respective common row decoders 150-1 and 152-1 and bitlines (not shown) extending vertically from their respective page buffers 208-1, 210-1 and 212-1, 214-1. Similarly, planes 200-2, 202-2 and 204-2, 206-2 have wordlines (not shown) extending horizontally from their respective common row decoders 150-2 and 152-2 and bitlines (not shown) extending vertically from their respective page buffers 208-2, 210-2 and 212-2, 214-2. In an alternate circuit configuration, each plane can have its respective row decoder arranged at either its right side or left side as a dedicated row decoder that is not shared with another plane.

Memory banks 116A-1 and 116A-2 include page size configurators 221-1 and 221-2, respectively. Detailed configurations and operations of the page size configurators will be described later with reference to FIGS. 11, 12 and 15.

A single plane page buffer such as page buffer 208-1 is provided with a minimum page buffer size for a bank (e.g., bank 116A-1). The minimum page buffer size is referred to from this point on as a "page buffer unit". Correspondingly, the minimum page size for bank 116A-1 or 116A-2 is one page unit. By example, the smallest page buffer unit size can be 512$k$ bits in width. For example, one page 220 in plane 200-1 is selected for a read or program operation. If the operation is an erase operation, then a memory block containing page 220 is selected for erasure. With reference to FIG. 2B, the memory block can be Block[1] to Block[k]. For the presently described example, the selection of a wordline is analogous to activating the wordline by driving it to a voltage level required for reading, programming or erasing the memory cells connected thereto. If the page size of bank 116A-1 or 116A-2 is configured to be one page buffer unit, any page of planes 200-1, 202-1, 204-1 and 206-1 or 200-2, 202-2, 204-2 and 206-2 can be selected for any operation. As will be described later, the page size of bank 116A-1 or bank 116A-2 can be configured to be any combination of planes 200-1, 202-1, 204-1 and 206-1 or 200-2, 202-2, 204-2 and 206-2.

Therefore, row decoder 150-1 selectively enables or activates, one wordline in either planes 200-1 or 202-1, or one wordline in both planes 200-1 and 202-1 during a program, read or erase operation. Row decoder 152-1 also selectively activates one wordline in either planes 204-1 or 206-1, or one wordline in both planes 204-1 and 206-1 during the program, read or erase operation. Core controllers 140 of core circuitry controller 112 shown in FIG. 4 are associated with banks 116A-1 and 116A-2. The control timing and activation of the circuits of banks 116A-1 and 116A-2 for program, read and erase operations are controlled, in response to corresponding commands. Accordingly, all planes in the bank execute the same operation dictated by the corresponding core controller.

Following is an example operation of concurrent operations executed in banks 116A-1 and 116A-2 in FIG. 5. In the present example, bank 116A-1 has a page size of two page buffer units and executes a read operation, while bank 116A-2 has a page size of three page buffer units and executes a program operation.

Figure 6:
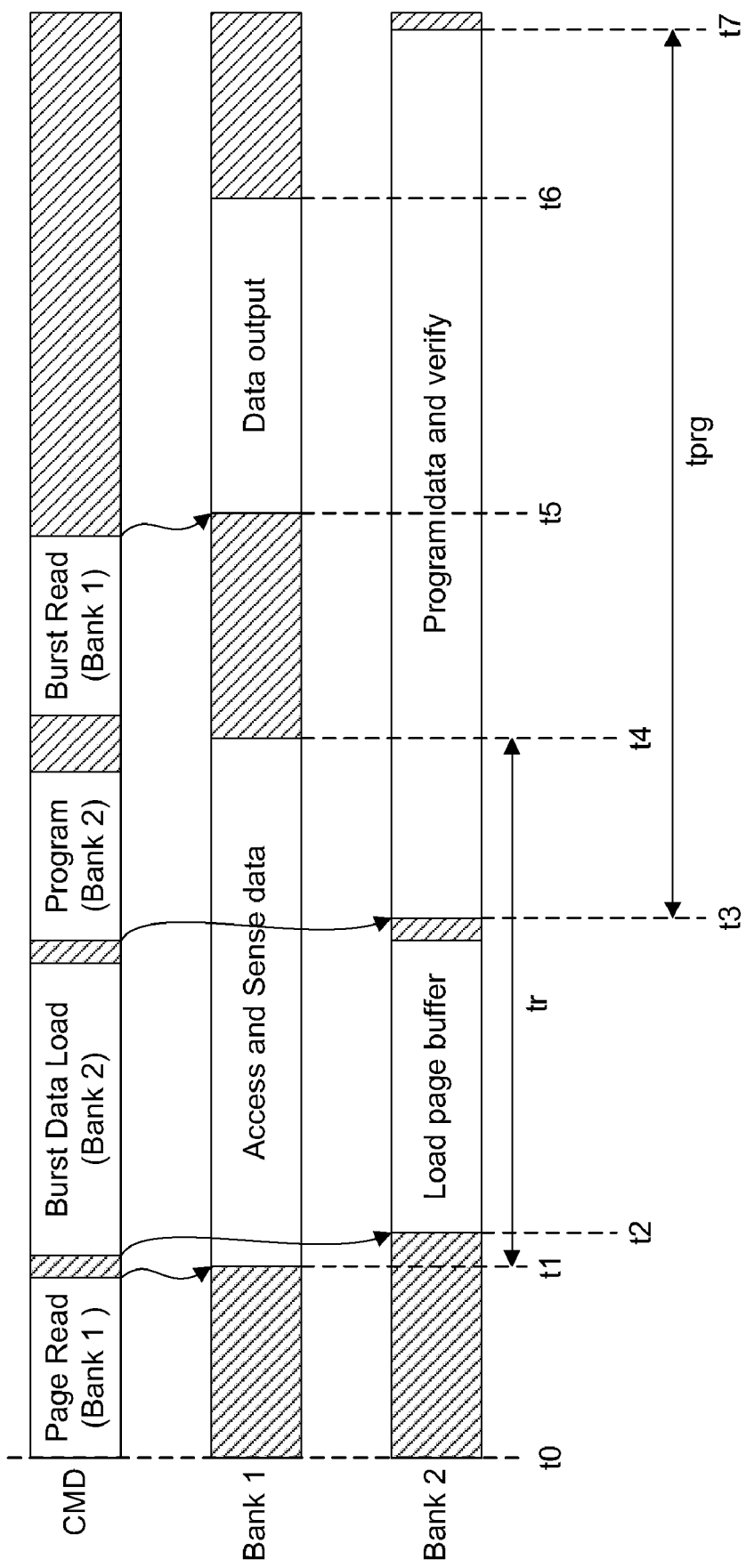
FIG. 6 is a sequence diagram showing concurrent operations in the memory banks shown in FIG. 5.

FIG. 6 is a sequence diagram showing from left to right, the order of issued commands received by multi-bank flash memory device 100 of FIG. 4, and the operations of banks 116A-1 and 116A-2 of FIG. 5 in response to the received commands. Referring to FIGS. 4, 5 and 6, the first command received at time t0 is a page read command issued for bank 116A-1. The page read command includes a page read op code, and address information indicating where the data is to be read from. A bank address is provided to select a bank and a row address is provided to select a block and a row within the block to activate. In the presently shown example, wordlines in planes 204-1 and 206-1 are addressed, and based on the page size configuration for bank 116A-1 (bank 1), page 222 is selected. Once the address data is latched, the internal bank operations for reading page 222 begins at time t1. This includes sensing and latching the read data from page 222 into page buffers 212-1 and 214-1 after the selected wordlines are activated.

Immediately after the page read command is received, a burst data load command for bank 116A-2 (bank 2) is received. The burst data load command includes write data, which is loaded into page buffers 208-2, 210-2 and 212-2 of bank 116A-2 at time t2. In the presently described example, the write data is to be written to page 224 spanning planes 200-2, 202-2 and 204-2 of bank 116A-2. At this point in time, the page buffers 212-1 and 214-1 of bank 116A-1 are receiving read data while the page buffers 208-2, 210-2 and 212-2 of bank 116A-2 are receiving write data for programming, thus both banks 116A-1 and 116A-2 are operating concurrently. After page buffers 208-2, 210-2 and 212-2 of bank 116A-2 have been loaded with the write data, a program command for bank 116A-2 is received to initiate programming operations in bank 116A-2 at time t3. Eventually at time t4, the internal read operation is completed and the data is ready for output.

The time interval between t1 and t4 is the internal read latency period tr. Shortly after, a burst ready command for bank 116A-1 is received, which includes the column address corresponding to a bit position in the page buffers 212-1 and 214-1 from which the first bit of data is to be read out from. At time t5, page buffers 212-1 and 214-1 of bank 116A-1 output their stored read data from page 222 to the output port(s) Qn. Data output is completed at time t6, and eventually at time t7, the program operation is completed after an internal program latency period denoted as tprg between times t3 and t7. The time periods shown in FIG. 6 are not to scale, and do not represent actual elapsed times for processing a command or for executing internal bank operations.

Any combination of possible memory bank operations can be executed concurrently in multi-bank flash memory device 100. Using the notation <operation>/<operation> for banks 116A-1/116A-2 respectively, a non-exhaustive list of possible concurrent operations include read/read, program/program, erase/erase, read/erase, program/read and erase/program. For each operation executed in a bank, the page size of the bank can be configured at power up of multi-bank flash memory device 100, or dynamically during normal operations.

Figure 7:
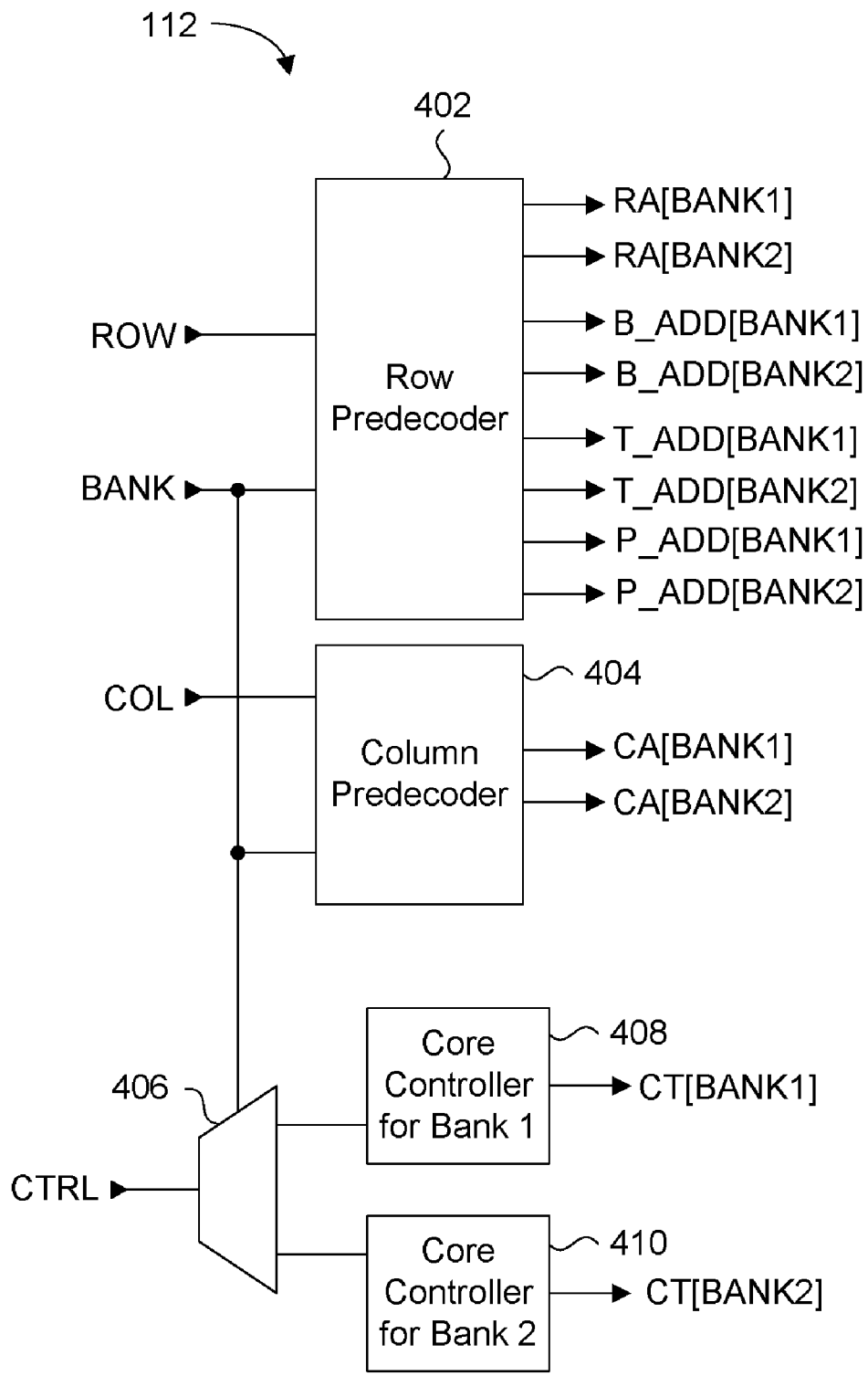
FIG. 7 is a block diagram of predecoder/core controller circuitry of the flash memory device of FIG. 4.

Prior to a discussion of the circuit details of one bank of multi-bank flash memory device 100, is a brief description of core circuitry controller 112 of FIG. 4. A block diagram of core circuitry controller 112 of multi-bank flash memory device 100 of FIG. 4 is shown in FIG. 7. Since different banks can be selected for executing a particular operation, bank address information can be predecoded with the row address and column address information provided in the commands. Furthermore, the bank address is used for routing control signals CTRL decoded from the received op code by command interpreter 108 to the core controller (408 or 410 for example) corresponding to the addressed bank.

Referring to FIGS. 4-7, core circuitry controller 112 includes a row predecoder 402, a column predecoder 404, a selector 406, core controller 408 for bank 1 and duplicate core controller 410 for bank 2. Core controllers 408 and 410 are referred to as core controller circuitry. Row predecoder 402 and column predecoder 404 correspond to row and column predecoders 143 shown in FIG. 4. Core controllers 408 and 410 correspond to core controllers 140 shown in FIG. 4. Row predecoder 402 receives row address information ROW and bank address information BANK and outputs predecoded row address RA, block address B_ADD, tile address T_ADD and plane address P_ADD. Each of the predecoded addresses can be multi-bit signals depending on the density and design of the memory array, and is annotated with either "[BANK1]" or "[BANK2]" to designate the specific bank. BANK1 and BANK 2 designate bank 1 and bank 2, respectively. Banks 1 and 2 correspond to banks 116-1 and 116-2 of FIG. 4, respectively, and banks 116A-1 and 116A-2 of FIG. 5, respectively. Accordingly, if the bank address information BANK designates bank 116-1, the predecoded row address RA[BANK1] will be an active signal while the other predecoded row address RA[BANK2] will be a disabled signal or set to an inactive logic level. The same scheme applies to the other predecoded block address B_ADD, tile address T_ADD and plane address P_ADD. As will be discussed later, the command includes an op code and a row address. Certain bits of the op code include the bank address. The row address includes bits for producing B_ADD, T_ADD and P_ADD.

Column predecoder 404 receives column address information COL and bank address information BANK and produces predecoded column address CA. The predecoded column address can be multi-bit signals depending on the density and design of the memory array. The predecoded column address CA is annotated with either "[BANK1]" or "[BANK2]" to designate the specific bank. Both the row predecoder 402 and the column predecoder 404 can produce other address or control signals (not shown) required for proper operation of the circuits of the memory banks.

Selector 406 functions as a demultiplexor for selectively passing control signals CTRL to one of core controllers 408 for bank 1 and 410 for bank 2 in response to the bank address information BANK. It is noted that CTRL represents a plurality of control signals required for proper operation of the circuits in the memory bank, and corresponding circuits such as but not limited to, high voltage generator 114. The control signals CTRL are signals resulting from decoding of the op code in the command received by multi-bank flash memory device 100. Each of core controllers 408 and 410 provides a set of bank control signals CT for its respective bank, which correspond to the control signals CTRL, where the bank control signals CT are activated with particular timing and sequences specific to the command. Bank control signals CT[BANK1] is provided to bank 116-1. Bank control signals CT[BANK2] is provided to bank 116-2. Core controllers 408 and 410 can include their own registers for latching addresses ROW, COL and BANK, and the control signals CTRL, thereby allowing them to operate concurrently. In the particular example, because multi-bank flash memory device 100 has two banks 116-1 and 116-2, row predecoder 402 and column predecoder 404 of core circuitry controller 112 produces signals only for banks 116-1 and 116-2. Scaling of multi-bank flash memory device 100 to include more than two banks requires a corresponding scaling of the circuits of row and column predecoders of core circuitry controller 112 to produce the predecoded addresses and control signals for the banks.

Figure 8:
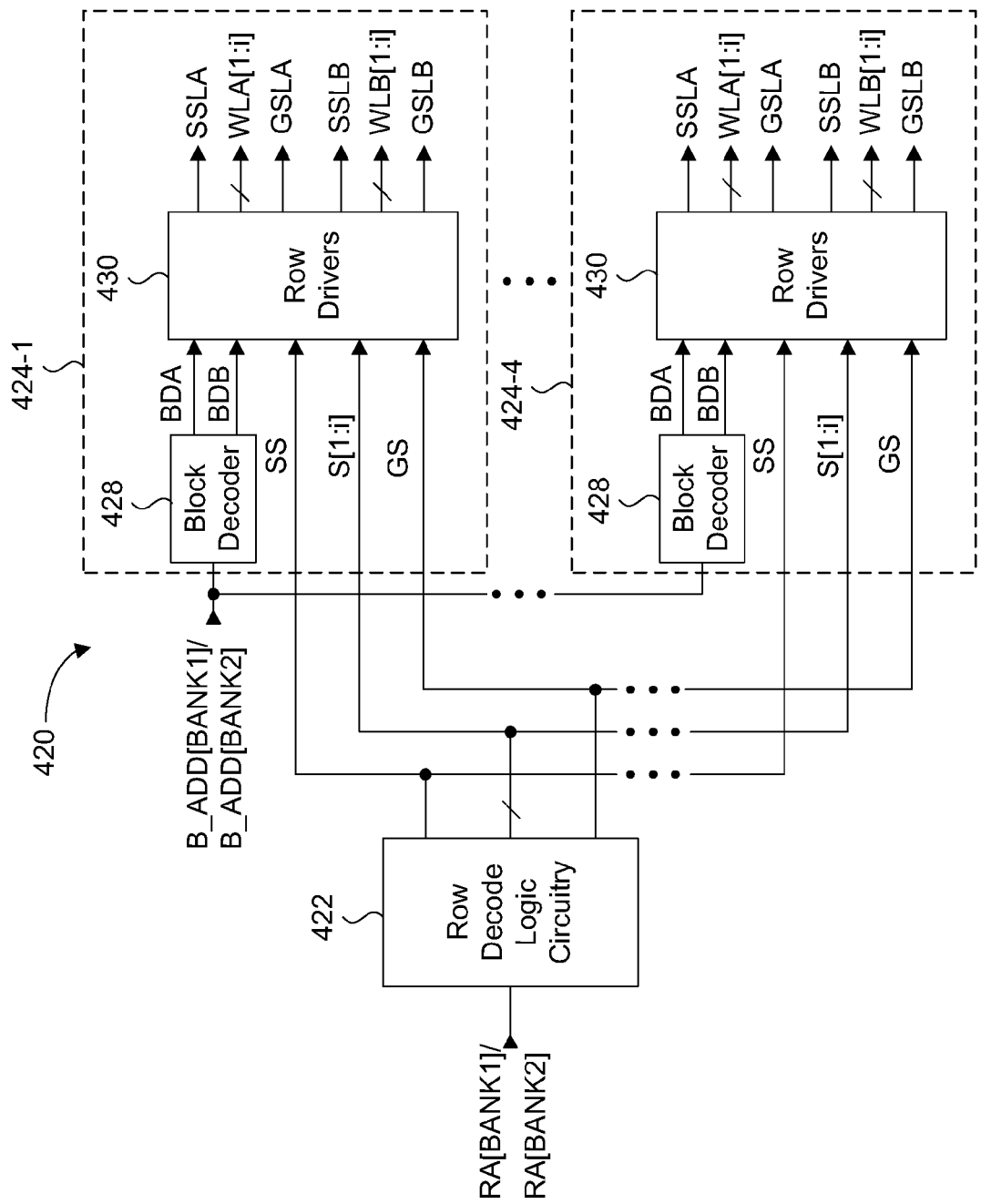
FIG. 8 is a block diagram of a row decoder included in the memory bank of FIG. 5.

FIG. 8 shows a block diagram of one of row decoders 150-1 and 152-1 or 150-2 and 152-2 shown in FIG. 5. As shown in FIG. 5, one row decoder, such as row decoder 150-1 for example, is shared between two adjacent planes in the same tile. The configuration of row decoders 150-1, 150-2 and 152-1, 152-2 is similar to each other. From this point forward, row decoder 420 represents one of row decoders 150-1, 150-2 and 152-1, 152-2. Row decoder 420 includes row decode logic circuitry 422 and memory block drive circuits 424-1 to 424-4 for respective memory blocks. A fabricated flash memory device includes a plurality of memory blocks, such as 1024, 3048 or 4096 memory blocks for example. In this simplified example, each plane has a total of four memory blocks and a total of four memory block drive circuits, two of which are not shown in order to simplify the schematic. The number of memory block drive circuits is not limited.

Referring to FIGS. 4, 7 and 8, row decode logic circuitry 422 receives either row address RA[BANK1] or RA[BANK2] having a plurality of bits from row predecoder 402 of core circuitry controller 112, and produces individual global row drive signals such as source select signal SS, wordline drive signal S[1:i] and ground select signal GS. In the presently described example, there is one row decode logic circuitry 422 for all the memory blocks in the tile, and the row drive signals SS, S[1:i] and GS are global signals provided to all the memory block drive circuits 424-1 to 424-4. Each of the memory block drive circuits 424-1 to 424-4 selectively passes global row drive signals SS, S[1:i] and GS as local row drive signals SSLA, WLA[1:i] and GSLA respectively, and/or SS LB, WLB[1:i] and GSLB respectively Row decode logic circuitry 422 includes well known logic circuits for decoding row address RA[BANK1] (or RA[BANK2]) and hence its details need not be presently described.

The other memory block drive circuits include the same circuit elements as memory block drive circuit 424-1, hence for brevity only the elements for memory block drive circuit 424-1 are described in further detail. Memory block drive circuit 424-1 includes a block decoder 428 and row drivers 430. Block decoder 428 of memory block drive circuit 424-1 receives either block address B_ADD[BANK1] or B_ADD[BANK2] for enabling its corresponding row drivers 430. One block decoder is enabled for any combination of bits of B_ADD[BANK1] (or B_ADD[BANK2]) to select the memory block for an erase, program or read operation. As previously mentioned, each of the planes has four memory blocks, hence the block address B_ADDR has two bits. In a fabricated flash memory device having a plurality of memory blocks, such as 1024, 3048 or 4096 for example, block decoder 428 is configured to receive the appropriate number of block addresses for selecting exactly one of the memory blocks for a memory operation. Row drivers 430 includes devices for passing row drive signals SS, S[1:i] and GS to the NAND cell strings in a memory block of one plane and the NAND cell strings in the memory block of the adjacent plane in the same tile. More specifically, the NAND cell strings in the memory block of one plane receive the row drive signals as SSLA, wordlines WLA[1:i] and GSLA, while the NAND cell strings in the memory block of the adjacent plane receive the row drive signals as SSLB, wordlines WLB[1:i] and GSLB. The row drive signals can be passed to one of the two planes in the tile, or to both planes in the tile simultaneously, in response to signals provided by the block decoder 428.

In response to the row address RA[BANK1] (or RA[BANK2]), row drive signals SSL, GSL and one wordline WL1 to WLi, are driven to the active logic level such as supply voltage VCC by row decode logic circuitry 422. In response to the block address B_ADD[BANK1] (or B_ADD[BANK2]), only the row driver 430 of the selected memory block is enabled for driving or passing the global row drive signals SS, S[1:i] and GS to the NAND cell strings in one or both planes of the tile. Because there is exactly one row decode logic circuitry 422 for producing one set of global row drive signals SS, S[1:i] and GS shared by both planes of the tile, the same physical wordlines in both planes can be driven at the same time when both planes of the tile are selected for an operation by block decoder 428. In an unselected memory block, row drivers 430 are disabled, thereby preventing the NAND cell strings in one or both planes of the tile from receiving the voltage level of global row drive signals SS, S[1:i] and GS.

Figure 9:
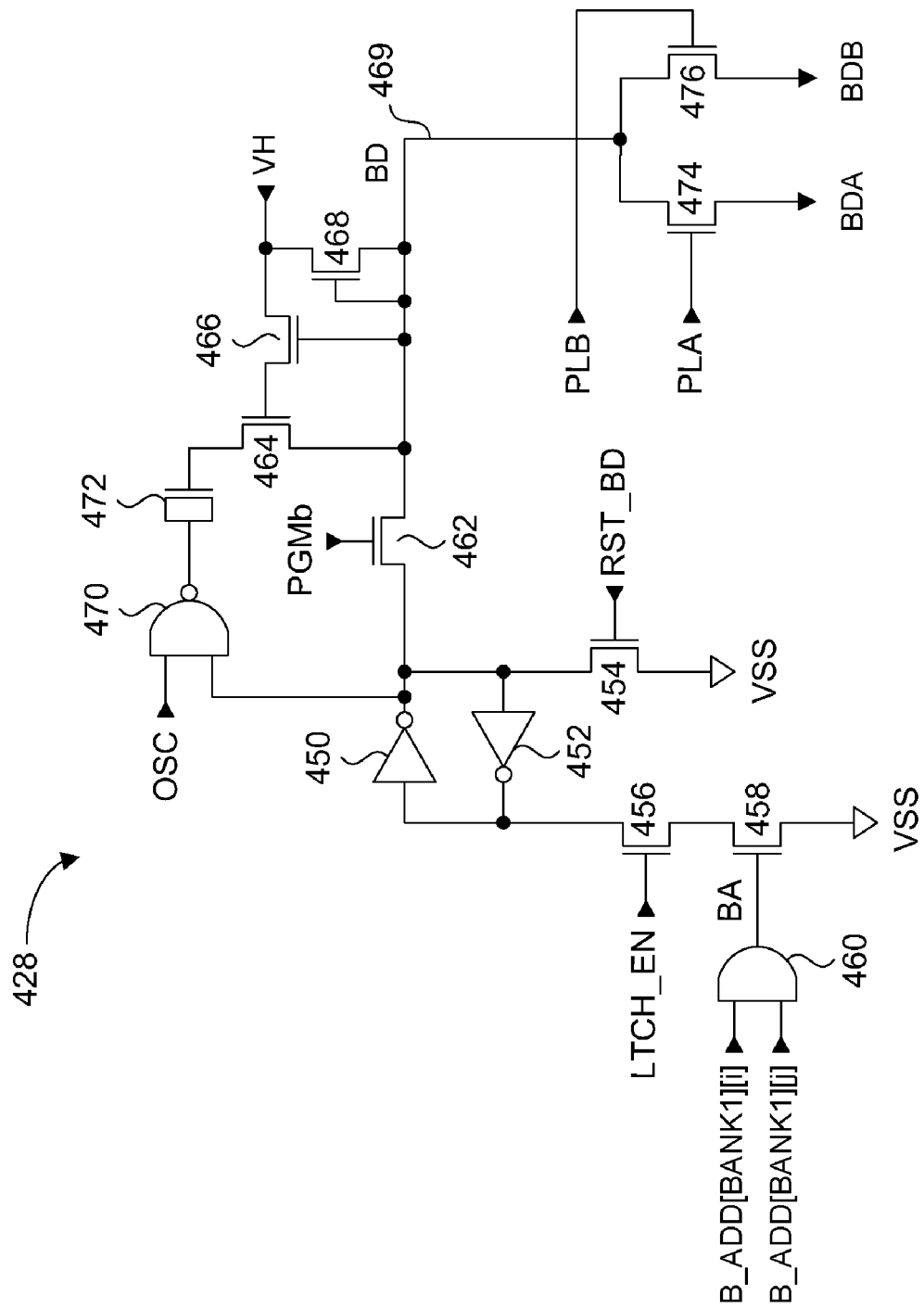
FIG. 9 is a circuit schematic of a block decoder of one memory block drive circuit shown in FIG. 8.

FIG. 9 is a circuit schematic of block decoder 428 of one memory block drive circuit, such as memory block drive circuit 424-1, shown in FIG. 8. Referring to FIGS. 8 and 9, one block decoder 428 is associated with one memory block and includes a latch circuit and a charge pump. The latch circuit includes cross-coupled inverters 450 and 452, an n-channel reset transistor 454, and n-channel enable transistors 456 and 458. The latch circuit is enabled, or set, when latch enable signal LTCH_EN and a decoded block address signal BA are at the high logic level. Decoded block address signal BA is also referred to as a block select signal. The decoded block address signal BA is provided by AND gate 460 that receives block address signals B_ADDR[1] and B_ADDR[2].

AND gate 460 of block decoder 428 included in each of the memory block drive circuits is responsive to different logic state combinations of block address signals B_ADD[BANK1][i] and B_ADD[BANK1][j] for selecting one memory block for read, program and erase operations. In FIG. 9, the block addresses for bank 1 are used, however the block addresses for bank 2 are decoded for a block decoder of bank 2. Variables "i" and "j" indicated that different bits of B_ADD[BANK1] are decoded. AND gate 460 can include different combinations of logic circuits for receiving block address signals B B_ADD[BANK1][i] and B_ADD[BANK1][j]. Such decoding schemes are well known in the art. When a reset signal RST_BD provided as one of the group of bank control signals CT[BANK1] or CT[BANK2], is driven to the high logic level, of the supply voltage VCC for example, reset transistor 454 is turned on to couple the input of inverter 452 to the source line voltage VSS. Reset signal RST_BD can be one of the control signals CT[BANK1] or CT[BANK2]. This results in the latch circuit of inverters 450 and 452 to be reset.

Block decoder 428 includes a local charge pump coupled to the output of inverter 450. The charge pump includes a depletion mode n-channel pass transistor 462, a native n-channel diode-connected boost transistor 464, a high breakdown voltage n-channel decoupling transistor 466, a high breakdown voltage n-channel clamp transistor 468, a NAND gate 470, and a capacitor 472. NAND gate 470 has one input terminal coupled to the output of inverter 450 and another input terminal for receiving an controlled oscillation signal OSC, for driving one terminal of capacitor 472. Controlled oscillation signal OSC is provided during memory operations which require the use of high voltages, and can be provided as one of the bank control signals CT[BANK1] or CT[BANK2]Pass transistor 462 is controlled by the complement of a program signal PGM, referred to as PGMb. Program signal PGMb can be one of the control signals that make up CT[BANK1] or CT[BANK2]. The common terminal of decoupling transistor 466 and clamp transistor 468 is coupled to the terminal of high voltage VH. High voltage VH is provided by high voltage generator 114 of FIG. 4. Master voltage BD at a terminal 469 is provided through the clamp transistor 468 to a selection circuit including n-channel pass transistors 474 and 476 connected in parallel. Pass transistor 474 is controlled by plane select signal PLA to pass the master voltage BD as block decoder output signal BDA while pass transistor 476 is controlled by plane select signal PLB to pass the master voltage BD as block decoder output signal BDB. The plane select signals PLA and PLB are provided by respective plane selectors of page size configuration 221-1 or 221-2 shown in FIG. 5. Accordingly, for any operation, one or both of the block decoder output signals BDA and BDB can have the master voltage BD. Plane select signals PLA and PLB have voltage levels which are high enough to enable the n-channel pass transistors 474 and 476 to fully pass the master voltage BD, so that the voltage levels of the block decoder output signals BDA and BDB are equal to the master voltage BD. For example, if the master voltage BD is approximately a program voltage Vpgm+Vtn, where Vtn is a threshold voltage of an n-channel transistor, the voltage level of the plane select signals PLA and PLB will be at least Vpgm+2Vtn. Thus, the block decoder output signals BDA and BDB can be equal to the master voltage BD.

The operation of the charge pump when enabled by the decoded block address signal BA is now described. During a read or erase operation, the complement program signal PGMb is at the high logic level and OSC is maintained at the low logic level. Therefore, circuit elements 472, 464, 466 and 468 are inactive, and the master voltage BD at line 469 reflects the logic level appearing on the output of inverter 450. During a program operation, the complement program signal PGMb is at the low logic level, and OSC is allowed to oscillate between the high and low logic levels at a predetermined frequency. If the output of inverter 450 is at the high logic level, then capacitor 472 will repeatedly accumulate charge on its other terminal and discharge the accumulated charge through boost transistor 464. Decoupling transistor 466 isolates the high voltage VH from the boosted voltage on the gate of boost transistor 464. Clamp transistor 468 maintains the voltage level of the master voltage BD at terminal 469 at about VH+Vtn, where Vtn is the threshold voltage of clamp transistor 468. The local charge pump shown in FIG. 9 is one example circuit which can be used to drive signals to a voltage level higher than the supply voltage VDD. When unselected, the charge pump keeps the master voltage BD at the inactive source line voltage VSS voltage level. Hence, the block decoder output signals BDA and BDB remain at the source line voltage VSS.

Figure 10:
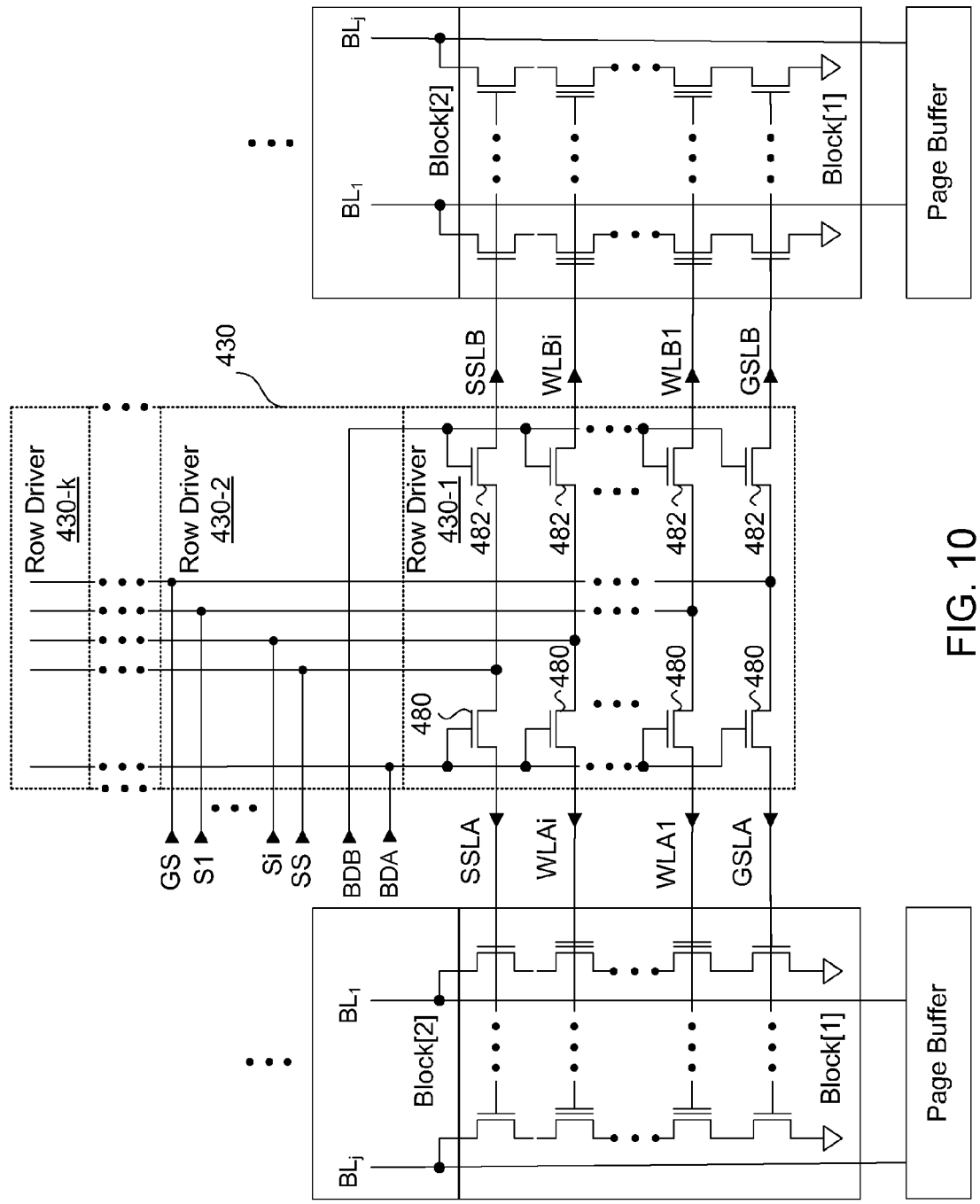
FIG. 10 is a circuit schematic of a row driver shown in FIG. 8.

FIG. 10 is a circuit schematic of one of row drivers 430 of FIG. 8. Positioned to the right side and left side of the row drivers 430-1-430-k are memory blocks to show their relative positioning to row drivers 430-1. By example, this relative positioning is consistent with the positioning of row decoder 150-1 relative to planes 200-1 and 202-1 in Bank 116A-1 of FIG. 4. The memory blocks show the NAND memory cell strings of one block, as previously shown FIG. 2B. One row driver includes a first set of n-channel pass transistors 480 and second set of n-channel pass transistors 482. Both sets of pass transistors 480 and 482 pass the row drive signals SS, S[1:i] and GS to the NAND cell strings of one or two planes of the tile. More specifically, signals SS, S[1:i] and GS are passed by the first set of n-channel pass transistors 480 as signals SSLA, wordlines WLA[1:i] and GSLA in response to the block decoder output signal BDA, and by the second set of n-channel pass transistors 480 as signals SSLB, wordlines WLB[1:i] and GSLB in response to the block decoder output signal BDB. In operation, when the block decoder output signal BDA is driven above the supply voltage VDD, then row drive signals SS, S[1:i] and GS greater than the supply voltage VDD can be passed onto SSLA, WLA[1:i] and GSLA lines, respectively. If the block decoder output signal BDA is at the source line voltage VSS, then the pass transistors 480 will be turned off to decouple the row drive signals SS, S[1:i] and GS from SSLA, WLA[1:i] and GSLA, respectively. The operation is identical for the block decoder output signal BDB and pass transistors 482.

The previously described circuit examples of FIGS. 8, 9 and 10 are directed to a shared row decoder architecture that can minimize circuit area overhead in view of circuit duplication for each plane being obviated. The trade-off for the circuit area savings obtained using the shared row decoder architecture is the inability to select different wordlines in both planes of the same tile. This is due to the fact that there is one row decode logic circuitry 422 for providing one set of row drive signals shared by both planes of the tile. In contemplated alternative examples where conservation of circuit area maybe less of an issue, a dedicated row decoder architecture can be used instead. In a dedicated row decoder architecture, there is one row decoder 420 for each plane, thereby allowing for simultaneous selection of both adjacent planes of a tile while selecting different wordlines to drive in each plane. The primary modifications for converting row decoder 420 to a dedicated row decoder for one plane include configuring block decoder 428 to provide only one of the block decoder output signals. For example, such a modified block decoder provides only BDA. Row driver 430 is configured to provide only one of the two sets of row drive signals. For example, such a modified row driver provides only SSLA, WLA[1:i], GSLA. Therefore, the row decoder for the other plane has its block decoder configured for providing the other of the block decoder output signal, such as BDB for example. Then the row driver for the other plane provides SSLB, WLB [1:i], GSLB. For clarity and consistency, various circuit embodiments are subsequently described with the assumption that a shared row decoder is used for each tile.

Since the bank address is predecoded by row and column predecoders of core circuitry controller 112 in FIG. 7, the predecoded address signals RA and B_ADDR for an unselected bank remain at an inactive logic level such as 0V for example. Therefore, all the row drive signals SS, S[1:i] and GS and the master voltage BD from block decoder 428 for the unselected bank remain at 0V. Therefore the wordlines, SSL and GSL remain inactive at 0V, or float at inactive voltage levels. For the selected bank, the row drive signals are driven to active logic levels based on RA[BANK1] (or RA[BANK2]), and the master voltage BD is driven to a high voltage level. Therefore, selected wordlines are driven in one or more selected planes, which is used to configure the page size for the bank. Further discussion of how the planes are selected for page size configuration according to the present embodiments follows.

Figure 11:
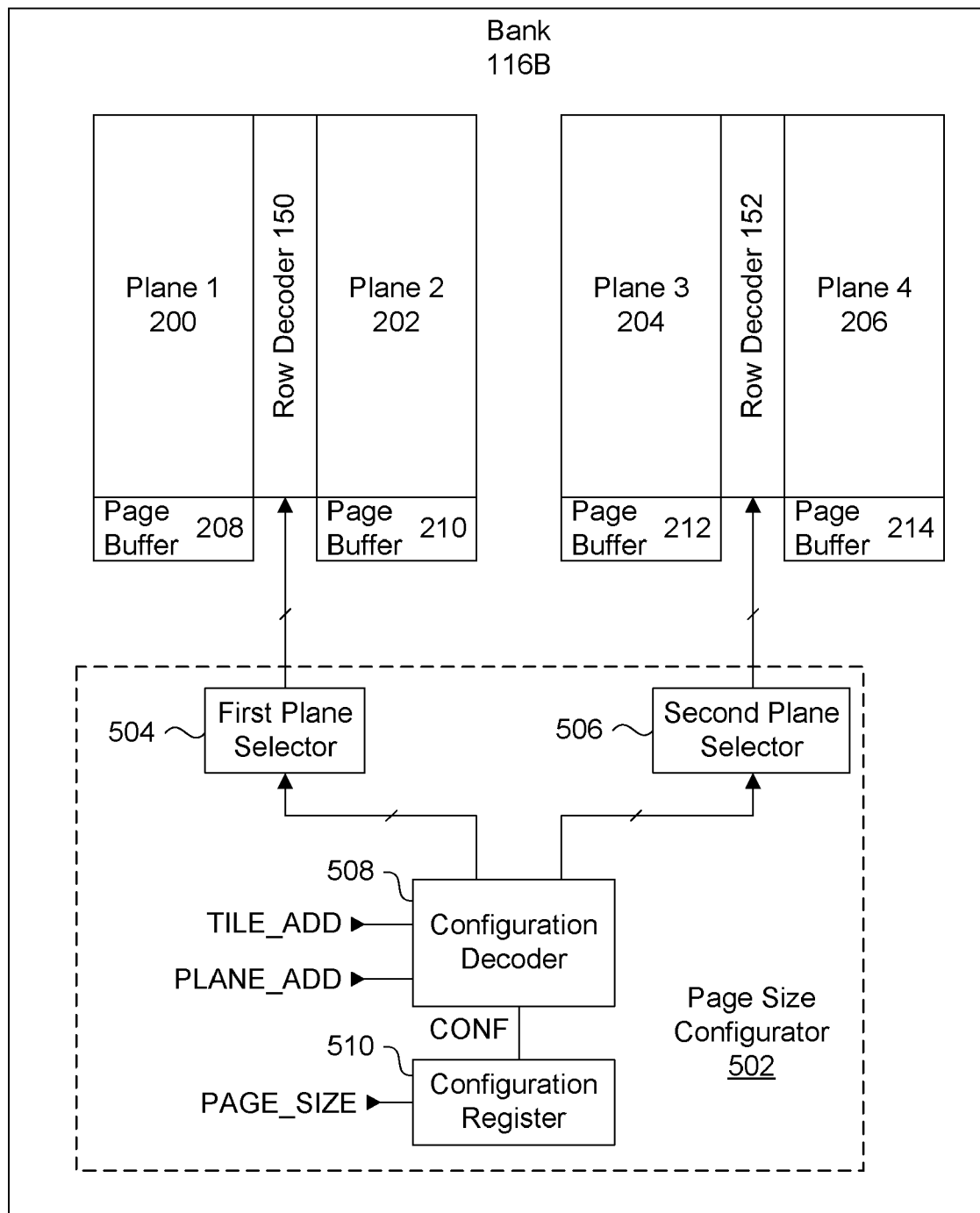
FIG. 11 is an illustration of another example of a memory architecture having configurable page size in a memory bank of the flash memory device of FIG. 4.

FIG. 11 is a block diagram showing functional circuit blocks of one bank in a memory device, and in particular the circuits used for configuring the page size of one bank, according to a presently described embodiment. Each bank of the multi-bank flash memory device 100 have the same functional circuit blocks shown in FIG. 11. Bank 116B includes the previously described memory array having four planes 200, 202, 204 and 206, row decoders 150 and 152, and page buffers 208, 210, 212 and 214. Planes 200 and 202 are arranged on either side of shared row decoder 150 and thus referred to as a memory array tile, as are planes 204 and 206 arranged on either side of shared row decoder 152. The row decoders and the page buffers receive address signals provided from address registers (not shown), and other control signals required for controlling the circuits during program, erase and read operations. These control signals are included in the CT control signals shown in FIG. 7, which are provided by a core controller associated with the respective bank, such as core controller 408 or core controller 410 of FIG. 7 for example. The core controller is responsible for activating the circuits in bank 116B in response to a decoded command received by the memory device. To enable selective page size configuration in bank 116B, a page size configurator 502 is included within bank 116B. Page size configurator 502 corresponds to page size configurator 221 shown in FIG. 5. Page size configurator 502 includes a first plane selector 504, a second plane selector 506, and a configuration decoder 508. A configuration register 510 is included for embodiments where the page configuration of the bank is set statically at power up, and dynamically with a dedicated command for specifically configuring the page size of a selected memory bank.

A static page configuration means that the page size is fixed for all memory operations until power down or reset of the memory device. Configuration register 510 can be omitted for embodiments where the page size of a memory bank is dynamically configured with a normal flash memory command, such as a read, a program and an erase command for example. This type of dynamic page size configuration can be alternately referred to as on-the-fly dynamic page configuration, where the page size can be changed with each command. For the presently described embodiments, it is assumed that configuration register 510 is included for static page size configuration and dedicated command dynamic page size configuration. A discussion of the functional blocks of page size configurator 502 is provided below.

First plane selector 504 provides plane selection signals for selectively enabling row decoder 150 to drive wordlines in one or both of planes 200 and 202. Similarly, second plane selector 506 provides plane selection signals for selectively enabling row decoder 152 to drive wordlines in one or both of planes 204 and 206. Both plane selectors 504 and 506 are controlled to operate independently of each other, or controlled to operate identically to each other depending on control signals they receive from the configuration decoder 508. Further discussion of this feature is discussed later.

Configuration decoder 508 includes decoding circuitry for providing the control signals that control plane selectors 504 and 506. These control signals are analogous to enabling signals since they can be used for selectively enabling one or both plane selectors 504 and 506. Configuration decoder 508 provides the control signals in response to one a plane address PLANE_ADD, a tile address TILE_ADD, and configuration data CONF provided by configuration register 510. Configuration register 510 stores configuration data PAGE_SIZE received externally via a data input, such as link interface 132 of FIG. 4 for example. As will be discussed later, configuration data PAGE_SIZE can be provided upon power up of the memory device for static configuration of the page size of bank 116B, or PAGE_SIZE can be provided during a normal operating period after successful power up, in a received command for dynamic configuration of the page size of bank 116B. Configuration register 510 can be any suitable number of bits in size, to suit the number of planes in the bank and the number of planes that can be selected.

The operation of bank 116B is now described with reference to a read operation by example. A read command is provided to the memory device, which includes a read operational code (OP code) and address information corresponding to the desired memory array location of the read data. This address information can include a row address, a column address, a bank address, a plane address and a tile address. It is assumed that prior to decoding any address information, configuration register 510 has been loaded with the page size configuration data. The page size configuration data can be loaded during power up of the memory device, or it can be loaded dynamically as part of address information provided with a command. In response to the page size configuration data stored in configuration register 510, the configuration decoder 508 changes the way it decodes the received TILE_ADD and PLANE_ADD signals. More specifically, configuration decoder 508 changes the logic states of the control signals it provides to the plane selectors 504 and 506 based on the configuration data. Therefore the output of the configuration decoder 508 in response to specific PLANE_ADD and TILE_ADD signals can change depending on the configuration data. This flexibility allows for the page size configurability of the bank.

As previously discussed, each of plane selector 504 and 506 provides plane selection signals for selectively enabling its corresponding row decoder to drive wordlines in one or both planes it is adjacent to.

Figure 12:
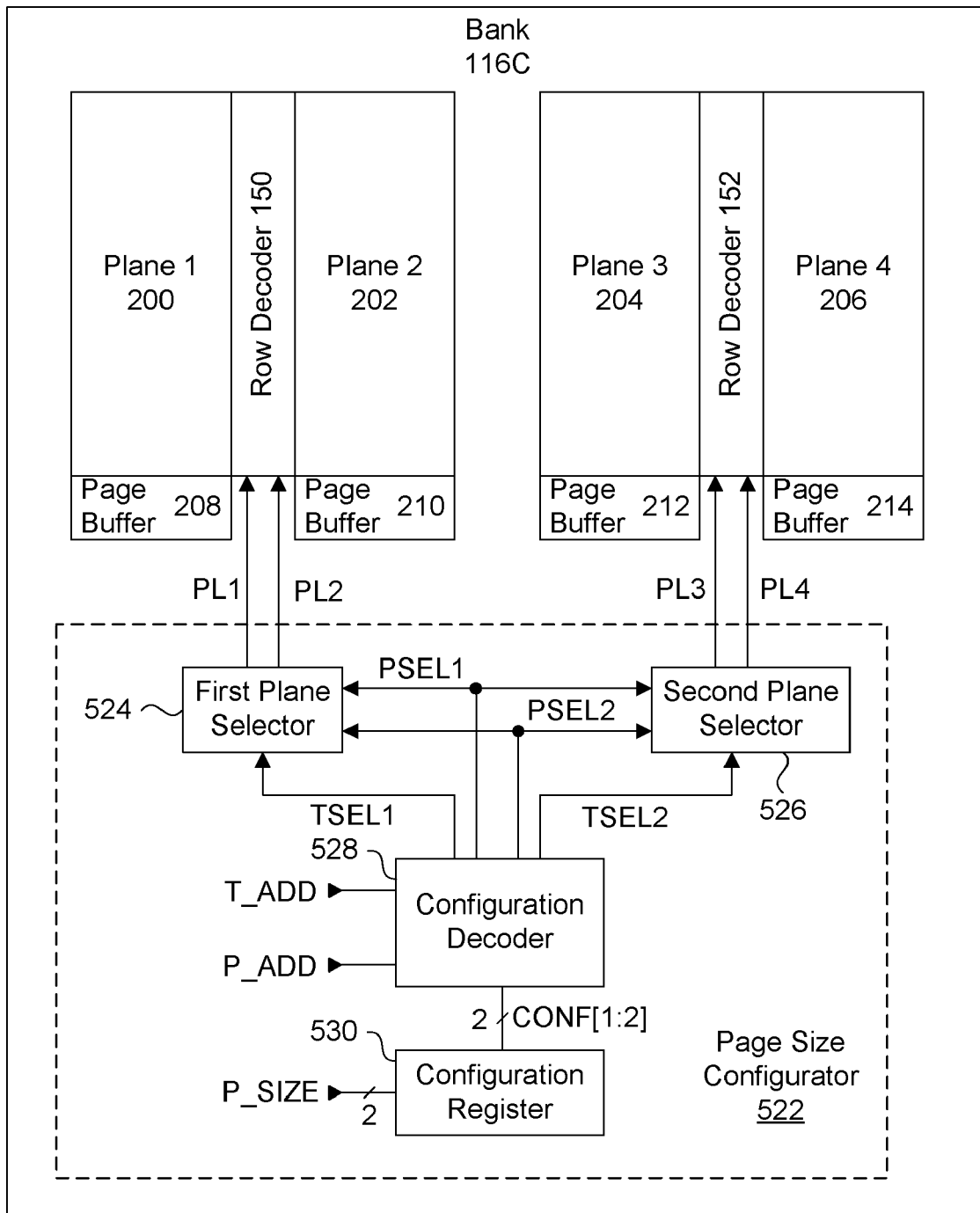
FIG. 12 is an illustration of another example of a memory architecture having configurable page size in a memory bank of the flash memory device of FIG. 4.

While FIG. 11 illustrates a general embodiment of a memory bank having a configurable page size, FIG. 12 illustrates one example configurable page size architecture for one bank of a memory device. In the example of FIG. 12, bank 116C includes the same planes 200, 202, 204, and 206, row decoders 150 and 152, page buffers 208, 210, 212 and 214. Page size configurator 522 on the other hand, is specifically configured to select specific planes in response to page configuration data, plane address information and bank address information. Page size configurator 522 corresponds to page size configurators 221 and 502 shown in FIG. 5 and FIG. 11. Generally, page size configurator 522 statically or dynamically configures bank 116C to have a page size that is either one page buffer unit, two page buffer units or four page buffer units in size. A detailed description of the functional circuit blocks of page size configurator 522 is provided below.

Page size configurator 522 includes a first plane selector 524, a second plane selector 526, a configuration decoder 528, and a configuration register 530 having two bits RB1 and RB2 (not shown in FIG. 12). Configuration register 530 receives and stores page size configuration data P_SIZE, which in the presently described example consists of two bits. In the presently described embodiments, P_SIZE corresponds to PAGE_SIZE of FIG. 11, and is provided through the input/output interface of the memory device, such as such as link interface 132 of FIG. 4 for example, in a predetermined command that is decoded by an internal command register (not shown), that routes the bits of P_SIZE to configuration register 530. As previously mentioned, such a command can be provided at power up, or alternately, dynamically in between normal operation commands. For the presently shown example of FIG. 12 where there are a total of four planes grouped into two memory array tiles, one bit of P_SIZE is used for configuring memory array tile selection and a second bit of P_SIZE is used for configuring plane selection. The two bits of P_SIZE are stored in the bit registers RB1 and RB2 of configuration register 530, and CONF [1:2] corresponding to the data stored in RB1 and RB2 is provided therefrom to configuration decoder 528. The first and second bits are referred to as CONF1 and CONF2, respectively. Configuration decoder 528 includes configurable logic decoding gates that receive a tile address bit T_ADD and a plane address bit P_ADD for providing decoded tile enabling signals TSEL1 and TSEL2, and plane enabling signals PSEL1 and PSEL2. The configurable logic decoding gates within configuration decoder 528 are controlled by CONF1 and CONF2 to change the logic states of the tile enabling signals TSEL1, TSEL2 and the plane enabling signals PSEL1, PSEL2 for any given logic states of the tile address bit T_ADD and the plane address bit P_ADD.

As shown in FIG. 12, the tile enabling signal TSEL1 is provided to first plane selector 524, the tile enabling signal TSEL2 is provided to second plane selector 526, while the plane enabling signals PSEL1 and PSEL2 are provided to both plane selectors 524 and 526. First plane selector 524 provides row decoder enabling signals PL1 and PL2 in response to the tile enabling signal TSEL1, the plane enabling signals PSEL1 and PSEL2. Second plane selector 526 provides row decoder enabling signals PL3 and PL4 in response to the tile enabling signal TSEL2, the plane enabling signals PSEL1 and PSEL2. Configuration decoder 528 functions as a first level decoder, while first and second plane selectors 524 and 526 function as second level decoders. In the presently shown example configuration, first plane selector 524 is enabled when the tile enabling signal TSEL1 is at the active logic level and second plane selector 526 is enabled when the tile enabling signal TSEL2 is at the active logic level. First plane selector 524 drives PL1 to the active logic level in response to the plane enabling signal PSEL1 at the active logic level, and drives PL2 to the active logic level in response to the plane enabling signal PSEL2 at the active logic level. Similarly, second plane selector 526 drives PL3 to the active logic level in response to the plane enabling signal PSEL1 at the active logic level, and drives PL4 to the active logic level in response to the plane enabling signal PSEL2 at the active logic level. Then row decoders 150 and 152 drive the wordlines in the selected planes in response to active logic levels of PL1, PL2, PL3 and PL4. With reference to the block decoder 428 of FIG. 9, signals PL1 and PL2 are logically equivalent to PLA and PLB respectively, and signals PL3 and PL4 are logically equivalent to PLA and PLB respectively. Bank 116C can be scaled to include more than two memory array tiles, which thus necessitates additional plane selectors, addressing bits and more bits for the page size configuration data.

Figure 13:
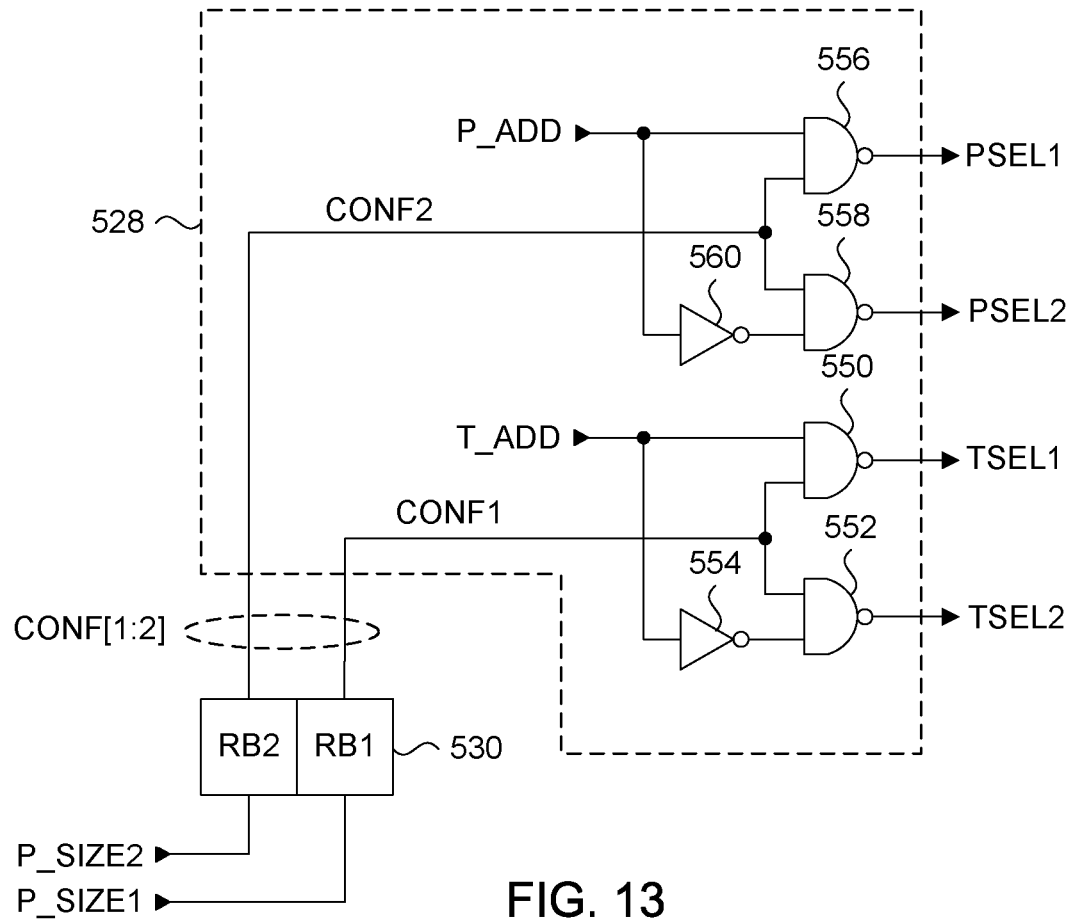
FIG. 13 is a circuit schematic of a configuration decoder and a configuration register of the bank shown in FIG. 12.

FIG. 13 is a circuit schematic of configuration decoder 528 and configuration register 530 shown in FIG. 12. Referring to FIGS. 12 and 13, configuration register 530 in the presently described example is a two-bit register, where each register can be any suitable data storage circuit. Configuration register 530 receives and stores P_SIZE1 and P_SIZE2, and provides corresponding bits CONF1 and CONF2 respectively. In the presently described example, CONF1 is used for configuring memory array tile selection while CONF2 is used for configuring plane selection. Configuration decoder 528 includes two independently operating decoding circuits. The first decoding circuit is the tile decoding circuit consisting of NAND gates 550 and 552, and inverter 554. The second decoding circuit is the plane decoding circuit consisting of NAND gates 556 and 558, and inverter 560.

In the tile decoding circuit, NAND gate 550 receives tile address T_ADD and configuration bit CONF1 for providing decoded tile enabling signal TSEL1. NAND gate 552 receives the complement of tile address T_ADD via inverter 554 and configuration bit CONF1 for providing decoded tile enabling signal TSEL2. Both NAND gates 550 and 552 are enabled when CONF1 is at the active high logic level, thereby enabling them to drive one of the tile enabling signals TSEL1 and TSEL2 to the active high logic level in response to T_ADD.

In the plane decoding circuit, NAND gate 556 receives plane address P_ADD and configuration bit CONF2 for providing decoded plane enabling signal PSEL1. NAND gate 558 receives the complement of plane address P_ADD via inverter 560 and configuration bit CONF2 for providing decoded plane enabling signal PSEL2. Both NAND gates 556 and 558 are enabled when CON F2 is at the active high logic level, thereby enabling them to drive one of the plane enabling signals PSEL1 and PSEL2 to the active high logic level in response to P_ADD. Table 1 below summarizes the functional operation of configuration decoder 528 in response to the different logic level combinations of CONF1 and CONF2. In an alternative example, the logic circuitry of configuration decoder 528 can be configured to decode inverted versions of CONF1 and CONF2. For example, when CONF1 and CONF2 are both at the "0" logic state, 1 page buffer unit is selected as the minimum page size.

TABLE 1

| CONF1 | CONF2 | Tile selection | Plane selection | Minimum Page size |
|---|---|---|---|---|
| 1 | 1 | Enabled | Enabled | 1 page buffer unit |
| 1 | 0 | Enabled | Disabled | 2 page buffer units |
| 0 | 1 | Disabled | Enabled | 2 page buffer units |
| 0 | 0 | Disabled | Disabled | 4 page buffer units |

The outputs of configuration decoder 528 are provided to plane selectors 524 and 526.

Figure 14A:
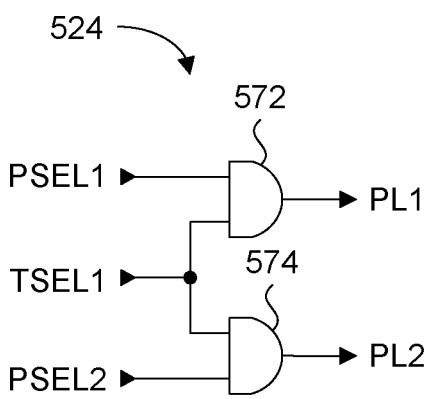
FIGS. 14A and 14B are circuit schematics of first and second plane selectors of a page size configurator of the bank shown in FIG. 12.
Figure 14B:
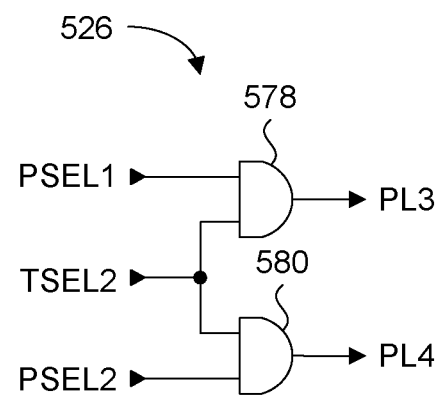

FIGS. 14A and 14B are circuit schematics of first and second plane selectors 524 and 526 of page size configurator 522 shown in FIG. 12. Referring to FIGS. 14A and 14B, first plane selector 524 includes two AND gates 572 and 574. AND gate 572 has a first input for receiving the plane enabling signal PSEL1 and a second input for receiving the tile enabling signal TSEL1. AND gate 574 has a first input for receiving the plane enabling signal PSEL2 and a second input for receiving the tile enabling signal TSEL1. The output of AND gate 572 drives signal PL1 while the output of AND gate 574 drives signal PL2. Second plane selector 526 includes two AND gates 578 and 580. AND gate 578 has a first input for receiving the plane enabling signal PSEL1 and a second input for receiving the tile enabling signal TSEL2. AND gate 580 has a first input for receiving the plane enabling signal PSEL2 and a second input for receiving the tile enabling signal TSEL2. The output of AND gate 578 drives signal PL3 while the output of AND gate 580 drives signal PL3.

As shown in Table 1, bank 116C of FIG. 12 can be statically or dynamically configured to have a page width of either 1, 2 or 4 page buffer units. However, different combinations of planes can be selected to provide the 1 and 2 page buffer unit page sizes. With reference to the circuits of FIGS. 13 and 14, the 1 page buffer unit page size configuration is selected by setting both CONF1 and CONF2 to the "1" logic state. This allows the plane enabling signals PSEL1, PSEL2 and the tile enabling signals TSEL1, TSEL2 to be driven to different logic levels in response to P_ADD and T_ADD. More specifically, one of the tile enabling signals TSEL1 and TSEL2 is driven to the active logic state in response to T_ADD, while one of the plane enabling signals PSEL1 and PSEL2 is driven to the active logic state in response to P_ADD. Following the decoding logic in plane selector 524, only one of plane selectors 524 and 526 of FIG. 12 is enabled. In the enabled plane selector, only one of PL1 and PL2 (or PL3 and PL4) is driven to the active logic level in response to one of the plane enabling signals PSEL1 and PSEL2. Accordingly, any one of planes 200, 202, 204 and 206 can be addressed for a read, program or erase operation.

For a 2 page buffer unit page size configuration, two different configuration settings can be used. In both settings, CONF1 and CONF2 are at complementary logic states, as shown in Table 1. While both settings achieve the same end result, different combinations of planes are selected. Looking at the first setting, CONF1 at the "1" logic state enables tile selection while CONF2 at the "0" logic state disables plane selection. In FIG. 13, NAND gates 556 and 558 are disabled and both of the plane enabling signals PSEL1 and PSEL2 are set to the high logic states. Therefore P_ADD is inhibited from being decoded. Because only one of the tile enabling signals TSEL1 and TSEL2 is driven to the active logic level in response to T_ADD, both PL1 and PL2 (or PL3 and PL4) are driven to the active logic level via the logic of plane selector 524. Therefore, both planes in one tile are simultaneously selected. Therefore this example configuration setting only allows for a 2 page buffer unit combination consisting of planes in the same tile.

Looking at the second setting, CONF1 at the "0" logic state disables tile selection while CONF2 at the "1" logic state enables plane selection. In FIG. 13, NAND gates 550 and 552 are disabled resulting in both of the tile enabling signals TSEL1 and TSEL2 being set to the high logic states. Therefore T_ADD is inhibited from being decoded, and both plane selectors 524 and 526 are enabled. Because only one of the plane enabling signals PSEL1 and PSEL2 is driven to the active logic level in response to P_ADD, only the pairing of PL1 and PL3 or PL2 and PL4 are driven to the active logic level via the logic of plane selector 524. In otherwords, only one plane of both tiles are simultaneously selected in this configuration setting.

For a 4 page buffer unit page size configuration, both CONF1 and CONF2 are at the "0" logic state. NAND gates 550, 552, 556 and 558 are disabled, thus resulting plane enabling signals PSEL1, PSEL2 and the tile enabling signals TSEL1, TSEL2 being set to the high logic states. Therefore P_ADD and T_ADD are inhibited from being decoded. Both plane selectors 524 and 526 are enabled and row decoder enabling signals PL1, PL2, PL3 and PL4 are driven to the active logic level to simultaneously select all four planes in bank 116C.

Since multi-bank flash memory device 100 of FIG. 4 has multiple banks, and the bank address BANK is predecoded by core circuitry controller 112 as shown in FIG. 7 with a row address ROW, only the row decoder circuits of the selected bank are active for driving wordlines of that bank. As previously mentioned, the predecoded address signals for a non-selected bank remain at the inactive logic level.

In the previously described examples of the 1, 2 and 4 page buffer unit size configurations, the addresses P_ADD and T_ADD can be provided in the command with or without knowledge of the configuration of the page size for bank 116C shown in FIG. 12. For example, the memory controller maintains a mapping of the page sizes to the corresponding addresses. This means that only the addresses to be decoded by configuration decoder 528 need to be provided, while the other addresses are statically held at an inactive voltage level.

Again referring to FIG. 12, although bank 116C can be configured to have different page sizes, it does not allow for a page size of 3 page buffer units, nor does it provide full flexibility for selecting any combination of 2 page buffer units. For example, planes 202 and 204 cannot be simultaneously selected, and planes 200 and 206 cannot be simultaneously selected. There may be circumstances where different combinations of planes are selected, such as for example, when the memory controller follows a wear leveling algorithm. Those skilled in the art would understand that wear leveling is a known technique for maximizing the endurance of a memory device by balancing the program and erase operations across all memory tiles or planes of the bank.

The previously presented example embodiment of FIG. 13 includes configuration register 530 for receiving the bits of page size configuration data P_SIZE. For the alternate embodiment where on-the-fly dynamic page size configuration is used, configuration register 530 is omitted, and P_SIZE1 and P_SIZE2 are connected directly to lines CONF1 and CONF2 respectively. Accordingly, as the operational command is decoded, P_SIZE1 and P_SIZE2 are directly fed to configuration decoder 528.

Figure 15:
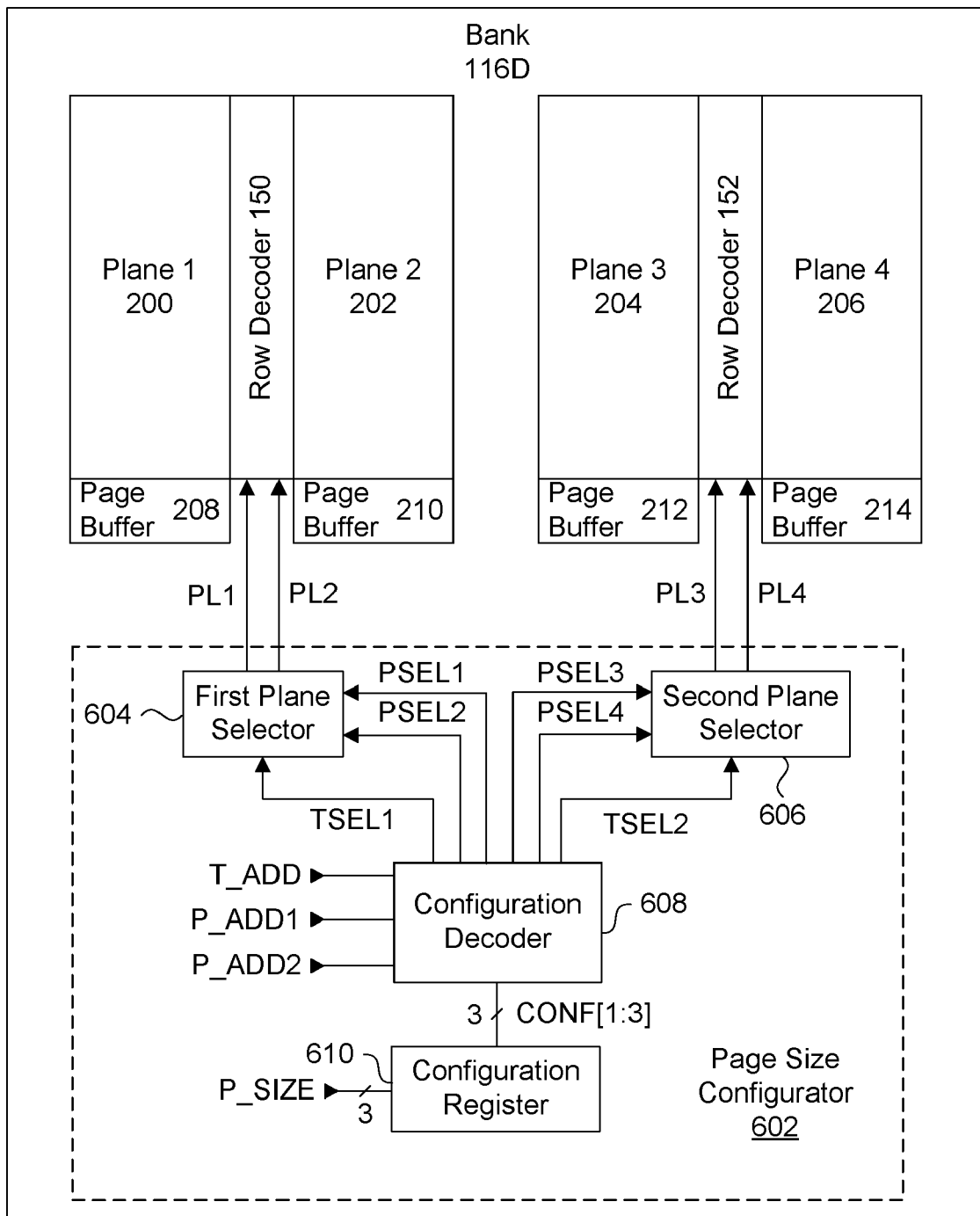
FIG. 15 is an illustration of another example of a memory architecture having configurable page size in a memory bank of the flash memory device of FIG. 4.

FIG. 15 presents another example configurable page size architecture for one bank of a multi-bank flash memory device 100. In the example of FIG. 15, bank 116D includes the same planes 200, 202, 204, and 206, row decoders 150 and 152, page buffers 208, 210, 212 and 214 as those of FIG. 12. Page size configurator 602 on the other hand, is specifically configured to select specific planes in response to page configuration data, plane address information and bank address information. Page size configurator 602 corresponds to page size configurators 221, 502 and 522 shown in FIGS. 5, 11 and 12, but is modified to operate with a difference in functionality, as is now described. Page size configurator 602 statically or dynamically configures bank 116D to have a page size that is either one page buffer unit, two page buffer units, three page buffer units or four page buffer units in size. In the presently shown example, any combination of page buffer units can be selected for page sizes of 2 and 3 page buffer units. A detailed description of the functional circuit blocks of page size configurator 602 is provided below.

Page size configurator 602 includes a first plane selector 604, a second plane selector 606, a configuration decoder 608, and a configuration register 610. The configuration register 610 receives and stores page size configuration data P_SIZE, which in the presently described example consists of three bits.

Figure 16:
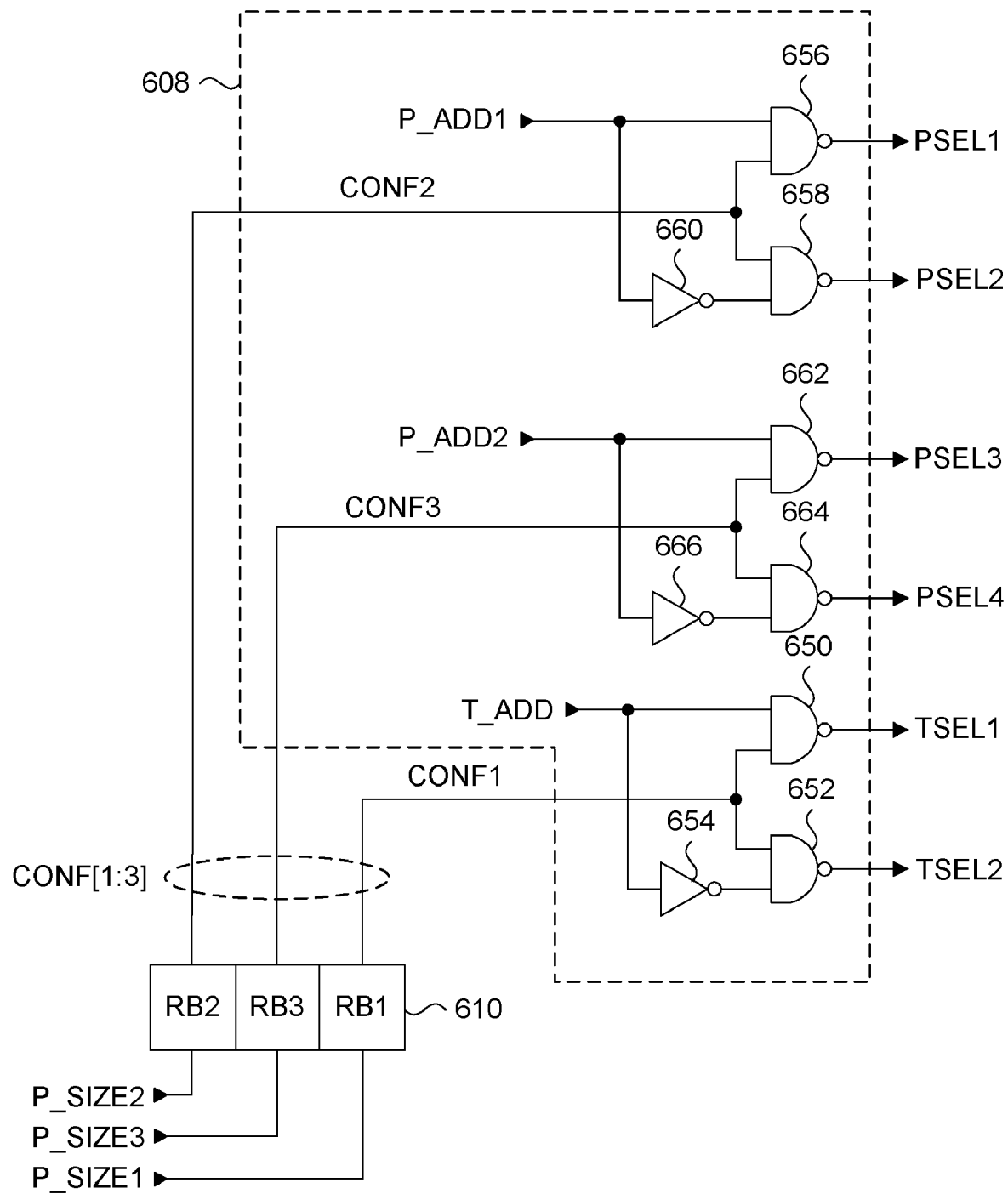
FIG. 16 is a circuit schematic of a configuration decoder and a configuration register shown in FIG. 15.

FIG. 16 is a circuit schematic of configuration decoder 608 and configuration register 610 shown in FIG. 15. Referring to FIGS. 15 and 16, there are a total of four planes grouped into two memory array tiles. One bit of P_SIZE is used for configuring memory array tile selection and two bits of P_SIZE are used for configuring plane selection. This first bit is referred to as CONF1 and the second and third bits are referred to as CONF2 and CONF3, which are provided to configuration decoder 608 as configuration signal CONF[1:3]. Configuration decoder 608 includes configurable logic decoding gates that receive a tile address bit T_ADD and two plane address bits P_ADD1 and P_ADD2. Configuration decoder 608 provides decoded tile enabling signals TSEL1 and TSEL2 and plane enabling signals PSEL1, PSEL2, PSEL3 and PSEL4. The configurable logic decoding gates within configuration decoder 608 are controlled by CONF1, CONF2 and CONF3 to change the logic states of the tile enabling signals TSEL1, TSEL2 and the plane enabling signals PSEL1, PSEL2, PSEL3, PSEL4 for any given logic states of tile address bit T_ADD and a plane address bits P_ADD1 and P_ADD2.

Configuration decoder 608 provides the tile enabling signal TSEL1 and the plane enabling signals PSEL1 and PSEL2 to first plane selector 604. Also, configuration decoder 608 provides the tile enabling signal TSEL2 and the plane enabling signals PSEL3 and PSEL4 to second plane selector 606. First plane selector 604 provides row decoder enabling signals PL1 and PL2 in response to the tile enabling signal TSEL1 and the plane enabling signals PSEL1, PSEL2. Second plane selector 606 provides row decoder enabling signals PL3 and PL4 in response to the tile enabling signal TSEL2 and the plane enabling signals PSEL3, PSEL4. Configuration decoder 608 functions as a first level decoder, while first and second plane selectors 604 and 606 function as second level decoders. In the presently shown example configuration, first plane selector 604 is enabled when the tile enabling signal TSEL1 is in the active logic level and second plane selector 606 is enabled with TSEL2 is at the active logic level. First plane selector 604 drives PL1 to the active logic level in response to the plane enabling signal PSEL1 at the active logic level, and drives PL2 to the active logic level in response to the plane enabling signal PSEL2 at the active logic level. Similarly, second plane selector 606 drives PL3 to the active logic level in response to the plane enabling signal PSEL3 at the active logic level, and drives PL4 to the active logic level in response to the plane enabling signal PSEL4 at the active logic level. Then row decoders 150 and 152 drive the wordlines in the selected planes in response to active logic levels of PL1, PL2, PL3 and PL4. With reference to FIGS. 8 and 9, signals PL1 and PL2 are logically equivalent to PLA and PLB respectively, which are received by one block decoder 428 corresponding to one tile, and signals PL3 and PL4 are logically equivalent to PLA and PLB respectively, which are received by one block decoder 428 corresponding to another tile. Thus, all the block decoders 428 corresponding to one tile in the memory bank receive PL1 and PL2 while all the block decoders 428 corresponding to another tile in the memory bank receive PL3 and PL4. Bank 116D can be scaled to include more than two memory array tiles, which thus necessitates additional plane selectors, addressing bits and more bits for the page size configuration data.

In the particular example, configuration register 610 is a three-bit register having bits RB1, RB2 and RB3. The register can be any suitable data storage circuit. Configuration register 610 receives and stores P_SIZE1, P_SIZE2 and P_SIZE3 in bit RB1, RB2 and RB3 registers, respectively. Bit RB1, RB2 and RB3 registers provide bits CONF1, CONF2 and CONF3, respectively. CONF1 is used for configuring memory array tile selection. CONF2 is used for configuring plane selection in a first tile. CONF3 is used for configuring plane selection in a second tile. The first tile includes planes 200 and 202 and the second tile includes planes 204 and 206. Configuration decoder 608 includes three independently operating decoding circuits. The first decoding circuit is the tile decoding circuit having NAND gates 650 and 652, and inverter 654. The second decoding circuit is the plane decoding circuit having NAND gates 656 and 658, and inverter 660. The third decoding circuit is the plane decoding circuit consisting of NAND gates 662 and 664, and inverter 666.

In the tile decoding circuit, NAND gate 650 receives tile address T_ADD and configuration bit CONF1 and provides decoded tile enabling signal TSEL1. NAND gate 652 receives the complement of tile address T_ADD via inverter 654 and configuration bit CONF1 and provides decoded tile enabling signal TSEL2. When CONF1 is at the active high logic level, both NAND gates 650 and 652 are enabled, so that one of the tile enabling signals TSEL1 and TSEL2 is driven to the active high logic level in response to T_ADD.

In the first plane decoding circuit, NAND gate 656 receives plane address P_ADD1 and configuration bit CONF2 and provides decoded plane enabling signal PSEL1. NAND gate 658 receives the complement of plane address P_ADD1 via inverter 660 and configuration bit CONF2 and provides decoded plane enabling signal PSEL2. Both NAND gates 656 and 658 are enabled when CONF2 is at the active high logic level, so that one of the plane enabling signals PSEL1 and PSEL2 is driven to the active high logic level in response to P_ADD1. In the second plane decoding circuit, NAND gate 662 receives plane address P_ADD2 and configuration bit CONF3 and provides decoded plane enabling signal PSEL3. NAND gate 664 receives the complement of plane address P_ADD2 via inverter 666 and configuration bit CONF3 and provides decoded plane enabling signal PSEL4.

Figure 17A:
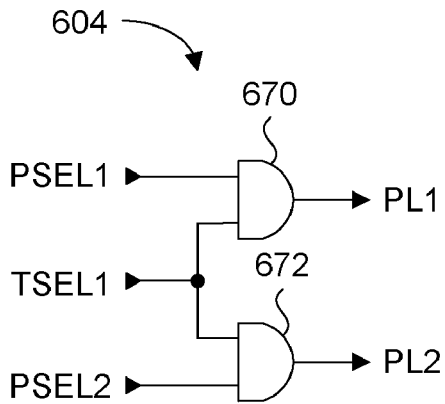
FIGS. 17A and 17B are circuit schematics of first and second plane selectors of the bank shown in FIG. 15.
Figure 17B:
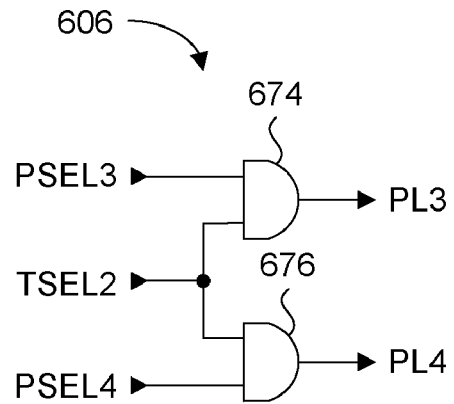

The outputs of configuration decoder 608 are provided to plane selectors 604 and 606 shown in FIG. 15. Example circuit configurations of first and second plane selectors 604 and 606 are shown in FIGS. 17A and 17B. Referring to FIGS. 17A and 17B, first plane selector 604 includes two AND gates 670 and 672. AND gate 670 receives the plane enabling signal PSEL1 and the tile enabling signal TSEL1. The output of AND gate 670 drives signal PL1. AND gate 672 receives the plane enabling signal PSEL2 and the tile enabling signal TSEL1 and provides signal PL2 as an AND operation between PSEL2 and TSEL1. Plane selector 606 includes two AND gates 674 and 676. The plane enabling signal PSEL3 and the tile enabling signal TSEL2 are fed to AND gate 674 which in turn provides the signal PS3. Similarly, the plane enabling signal PSEL4 and the tile enabling signal TSEL2 are fed to AND gate 676 which in turn provides the signal PL4.

Table 2 below summarizes the functional operation of configuration decoder 608 in response to the different logic level combinations of CONF1, CONF2, CONF3, P_ADD1, P_ADD2, and T_ADD. Configuration decoder 608 can be designed to decode inverted versions of any one or more of CONF1, CONF2 and CONF3 while providing the same decoded result.

TABLE 2

| CONF1 | CONF2 | CONF3 | Minimum Page size | Selected Plane |
|---|---|---|---|---|
| 1 | 1 | 1 | 1 page buffer unit | Any plane |
| 1 | 1 | 0 | Invalid | N/A |
| 1 | 0 | 1 | Invalid | N/A |
| 1 | 0 | 0 | 2 page buffer units | Two planes of any tile |
| 0 | 1 | 1 | 2 page buffer units | Any combination of one plane in each tile |
| 0 | 1 | 0 | 3 page buffer units | Any combination of tile addressed by P_ADD2 and one plane addressed by P_ADD1 |
| 0 | 0 | 1 | 3 page buffer units | Any combination of tile addressed by P_ADD1 and one plane addressed by P_ADD2 |
| 0 | 0 | 0 | 4 page buffer units | All planes |

As shown in Table 2, memory bank 116D of FIG. 15 can be configured to have any page size between one page buffer unit and four page buffer units. Moreover, for the two and three page buffer unit size configurations, any combination of planes can be simultaneously selected. This provides flexibility for the memory controller to execute wear leveling schemes for extending the endurance of each plane. It is noted that there are two combinations of CONF1, CONF2 and CONF3 which do not have to be used, and for the presently described example are labeled as invalid configuration settings. This is due to the fact that non-matching tile and plane addresses can be provided, resulting in none of the planes being selected even though plane and tile addresses have been provided. For example, T_ADD can select the tile containing planes 200 and 202, but only P_ADD2 is at the active logic level to select one of planes 204 and 206. Such addressing is considered invalid for the two invalid configuration settings.

Bank 116D of FIG. 15 includes configuration register 610 for receiving the bits of page size configuration data P_SIZE. In a case where on-the-fly dynamic page size configuration is used, configuration register 610 can be omitted, and P_SIZE1, P_SIZE2 and P_SIZE3 are provided directly as CONF1, CONF2 and CONF3, respectively. Accordingly, as the operational command is decoded, P_SIZE1, P_SIZE2 and P_SIZE2 are fed directly to configuration decoder 608.

The previously presented embodiments are directed to a memory bank having two tiles, where each tile includes a pair of planes coupled to a shared row decoder. Alternate embodiments can include a memory bank having more than two tiles. Accordingly, the corresponding page size configurator will be appropriately scaled to receive a corresponding number of address signals such that a corresponding number of enable signals can be provided for controlling the shared row decoders. Furthermore, the previously presented embodiments illustrate decoding architectures where tile enabling signals are decoded at the same time with plane enabling signals for producing the row decoder enabling signals. The plane enabling signals can be encoded to include the logic state information of the tile enabling signal, thereby obviating the need for the plane selectors as further decoding logic would be included to combine the plane address information with the tile address information for providing the plane enabling signals. Hence the plane enabling signals become the row decoder enabling signals in such an alternate embodiment. In a further alternate embodiment, the planes are not organized as tiles. In such an alternate embodiment a tile address is not required, as each dedicated row decoder would directly receive a corresponding plane enabling signal for enabling it to drive wordlines of its respective plane.

As previously mentioned, the multi-bank flash memory device 100 of FIG. 4 receives commands, where a command includes an op code and/or write data and address data. The address data includes the plane address and tile address information used by page size configurators 522 and 602 of FIGS. 12 and 15 respectively. Optional page size configuration data can be included in the command for dynamic on-the-fly page size configuration.

Figure 18:
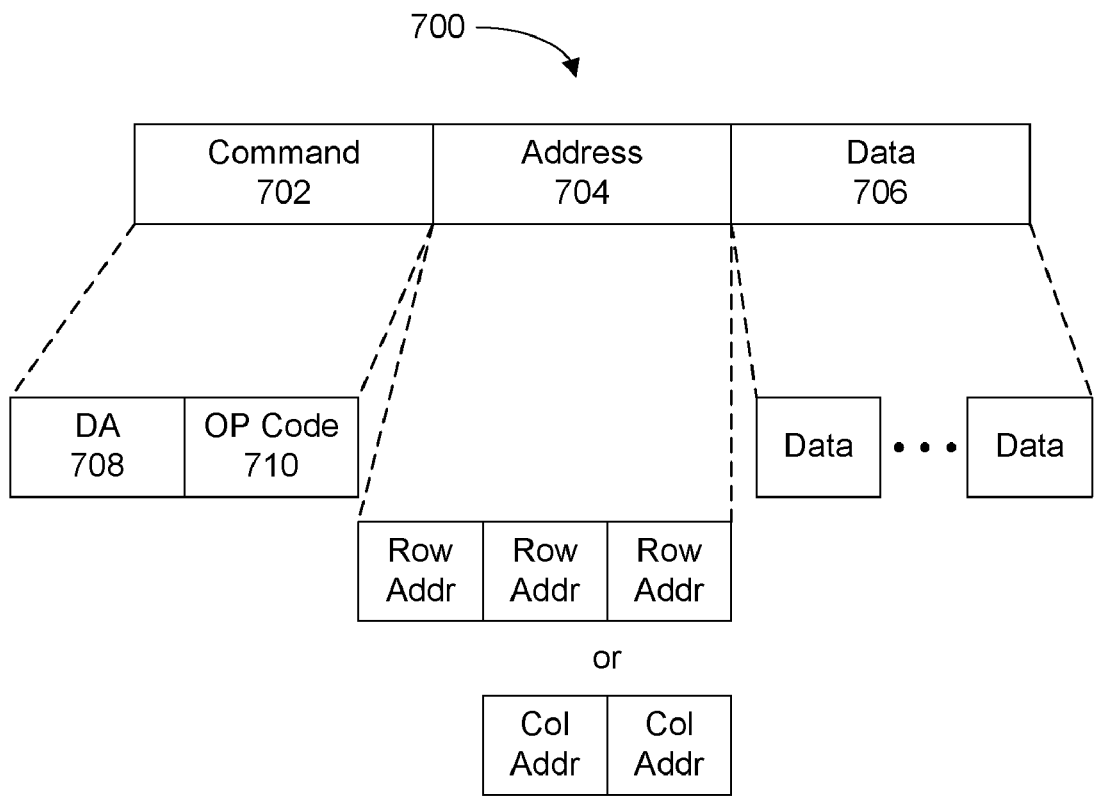
FIG. 18 is an illustration of a command packet.

FIG. 18 is an illustration of an example of a command packet that provides the information required by multi-bank flash memory device 100 of FIG. 4 to execute operations. More specifically, the shown command packet is used for providing commands serially to the memory devices of FIGS. 3A, 3B and 3C, as these memory devices receive commands as one or more bitstreams. The command packet of FIG. 18 shows all the possible fields that can be used, however certain commands do not use all the fields as will be described later with reference to the table of possible commands shown in FIG. 19. Referring to FIG. 18, command packet 700 has the structure as illustrated therein, and includes three fields, two of which are optional depending on the specific command being issued by the memory controller. The first field, being a mandatory field, is a command field 702. The first optional field is an address field 704, and the second optional field is a data field 706. Command field 702 includes two sub-fields, the first being a device address (DA) field 708 and the second being an op code (OP Code) field 710. Device address field 708 can be any number of bits in length, and is used for addressing a particular memory device in a system consisting of a number of memory devices. For example, device address field 708 of one byte in length is sufficient for addressing up to 256 memory devices. Op-code field 710 can be any number of bits in length to represent the commands executable by multi-bank flash memory device 100, and includes the bank address BANK. Address field 704 is used for providing either a row address ROW or a column address COL of a memory array, depending on the type of operation specified by the op code. Data field 706 includes any number of bits of data to be written or programmed. Because the command packet 700 is provided serially to multi-bank flash memory device 100, the command field 702 is first received, followed by the optional address field 708 and finally the optional data field 706.

FIG. 19 is a table of an example command set for flash memory with modular command in byte mode. The table includes 14 operations: Page Read, Page Read for Copy, Burst Data Read, Burst Data Load Start, Burst Data Load, Page Program, Block Address Input, Page-pair Address Input, Erase, Operation Abort, Read Status Register, Read Device Information Register, Read Link Configuration Register, and Write Link Configuration Register. Each operation has a command including a device address (DA) (1 byte) and an operation (OP) code (1 byte). Some commands include a row Address (3 bytes), a column address (2 bytes), and some commands include input data (e.g., 1 to 2112 bytes). For example, details of the commands are described in International Publication WO/2008/101317 (28 Aug. 2008), the contents of which are incorporated by reference in its entirety.

For the presently described embodiments, command packets 700 are provided in one of three different formats.

Referring to FIGS. 18 and 19, in the first format, command packet 700 consists only of command field 702, which in the present example, are 2-bytes in size. The first byte (i.e., DA field 708) provides the device address used for selecting or designating a particular device in a system of devices (e.g., in a serial connection of devices as shown in FIGS. 3B and 3C). The second byte (i.e., OP code 710) provides the op code. Depending on the specific operation, certain bit positions of the second byte are designated the bank address BANK. In the second format, command packet 700 consists of command field 702 and address field 704, where address field 704 can be either a row address ROW or a column address COL. For example, the row address can be any suitable number of bytes in size, where the specific bit positions are designated for a selected wordline address, the plane address PLANE_ADD, the tile address TILE_ADD, the block address B_ADD and configuration data P_SIZE. The column address can be any number of suitable bytes in size for designating a starting column address. In the third format, command packet 700 consists of command field 702, address field 704 and data field 706. Address field 704 for the third format has bit positions designated for column address data COL, which is a starting address for burst read operations, and the data field 706 includes data to be programmed. The number of bytes allocated for each field of command packet 700 described above and shown in FIG. 19 is illustrative only. The specific number of bytes for each field depends on the design of the memory device.

While the command packet shown in FIG. 18 is used for transmitting commands to serially connected memory devices, those skilled in the art should understand that commands with op codes, addresses and write data can be provided in parallel to memory devices having a parallel interface, such as the asynchronous flash memory device 10 of FIG. 2A. With an eight bit wide I/O, up to eight bits of a command are provided in parallel to memory device 10. Accordingly, multiple sets of eight bits are provided at different times in order to complete entry of a command.

Figure 20:
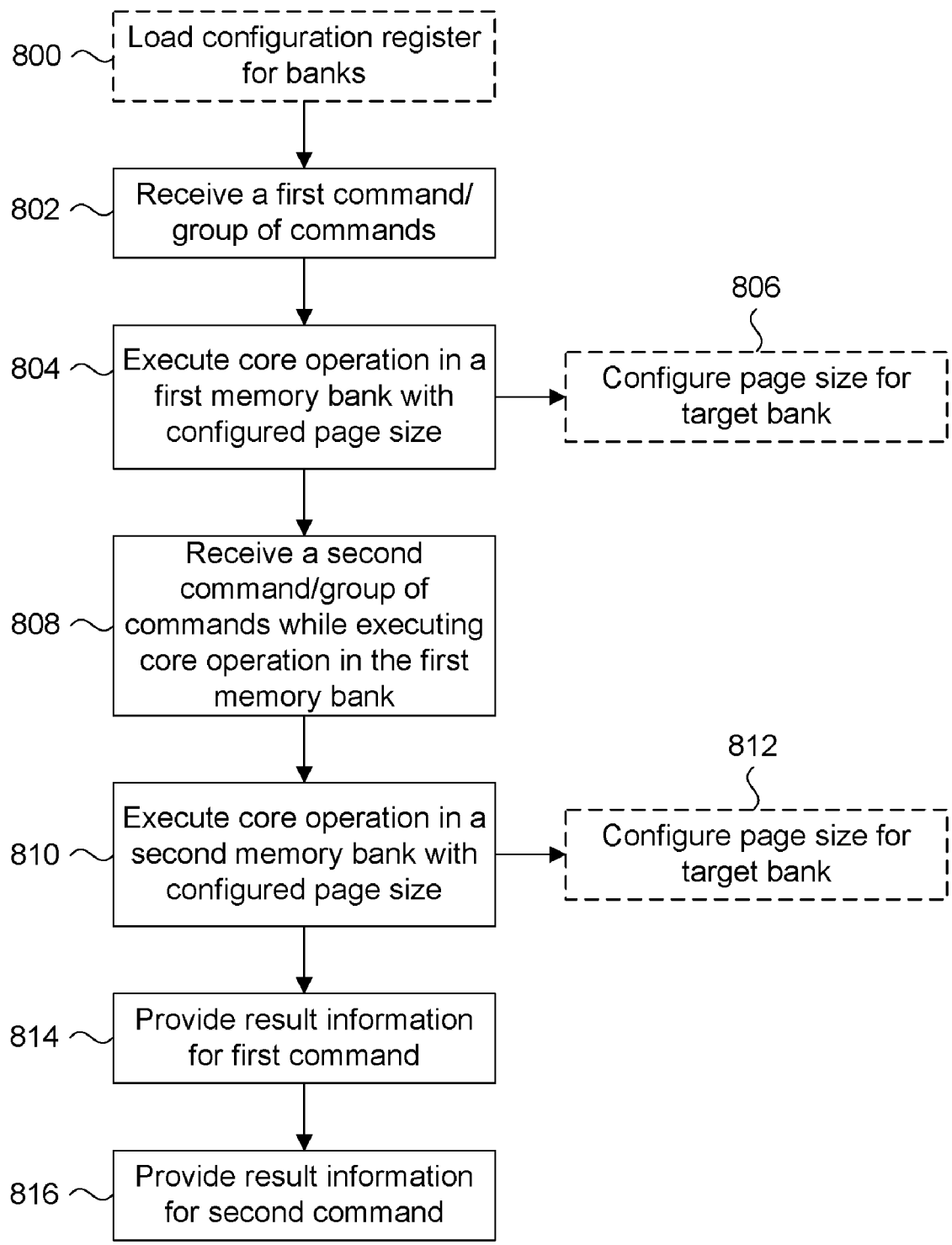
FIG. 20 is a flow chart of a method for executing concurrent operations in the flash memory device of FIG. 4.

FIG. 20 is a flow chart illustrating a method for executing concurrent operations in multi-bank flash memory device 100 of FIG. 4, in response to received command packets such as command packets 700 shown in FIG. 18. Accordingly, the present example assumes that the multi-bank flash memory device 100 is configured for serial interconnection with another flash memory device, in a serially connected memory system such as the ones shown in FIGS. 3A, 3B and 3C. The flow chart of FIG. 20 is described with reference to the sequence diagram of FIG. 6, and follows the example scenario where bank 116-1 is to execute a read operation while bank 116-2 is to execute a program operation concurrently. The concurrent operations are executed in different banks of memory device 100, where the page size of each bank is configured either before a first memory operating command is received or with the received memory operating commands.

Referring to FIGS. 4, 6 and 11 the page size of each bank is configured before a first memory operating command. The configuration register, such as configuration register 510 of FIG. 11, of banks 116-1 and 116-2 are loaded at step 800. Step 800 is shown in a dashed line box to show that this step can be omitted and replaced with on-the-fly page size configuration, as will be described shortly. The configuration registers 510 can be loaded at step 800 after power up of memory device 100 by issuing a dedicated configuration command that includes the configuration data, for each of banks 116-1 and 116-2. Such a configuration command can have the command packet structure of FIG. 18 for example.

Accordingly, two separate configuration commands can be issued, one for loading the configuration registers 510 of each of the two banks 116-1 and 116-2. In the present example, the configuration commands are received at link interface 132 of FIG. 4. If the page size configuration is to remain unchanged, then the page size configuration is considered to be statically set and cannot be changed until the next power up sequence of memory device 100. Alternatively, the configuration registers 510 can be configured in between memory operating commands through the dedicated configuration command. In such a situation, the page size configuration is considered to be dynamically set as it can change any number of times while the memory remains powered up. The decision for static or dynamic loading of the configuration registers is preset by the memory controller for a specific application. In either case, the logic for configuration decoders 508 of the page size configurators 502 for each bank is set in response to the data loaded into the respective configuration registers 510.

Following at step 802, a first command packet such as a page read command for bank 116-1, is issued by a memory controller and received by memory device 100. Once the entire packet (command field, address field and data field) is received, the command interpreter 108 extracts the op code, any addresses and write data, and decodes the op code. Hence, signals such as CTRL, ROW, COL and bank are then provided to core circuitry controller 112 so that the core controller corresponding to bank 116-1 can execute core operations at step 804 for first memory bank 116-1 of the memory device 100. Core operations are executed by row decoders 120, sense amplifier (SA) and page buffers 122, and column decoders 124, as well as high voltage generator 114. Depending on the instruction set, architecture of memory device 100 and the operation to be executed, a group of command packets are required for providing the necessary information for the selected bank before core operations can begin. In such a case, step 802 becomes the issuance and receipt of a group of command packets. The core operation is executed with the configured page size for bank 116-1 since the page size configurator 502 for bank 116-1 has been previously configured via the configuration registers 510 loaded with configuration data in step 100. According to an alternate embodiment, the page size of bank 116-1, or any other bank, can be configured on-the-fly at step 806 instead of at step 800. Accordingly, step 806 is shown in a dashed line box to indicate that this step can be replaced with previously described step 800. As previously discussed for on-the-fly page size configuration, the configuration register 510 is not required and the page size configuration data P_SIZE embedded in the command packet received at step 802 are provided directly to the configuration decoder 508 of the target bank.

Occurring almost immediately after initiation of the first memory bank core read operation, a second command packet such as a burst data load command for bank 116-2 is issued by the memory controller, and received by the memory device 100 via link interface 132 at step 808. At step 810 the core operations of the second memory bank are executed in response to the second command. Once again, a group of command packets may be received at step 808. In the present example, this includes loading the page buffers 208, 210, 212 and 214 with the write data received with the command. For on-the-fly page size configuration, step 810 includes configuring the page size of the second target bank, that being bank 116-2 in the present example, at step 812. The configuration decoder 508 of page size configurator 502 corresponding to bank 116-2 are configured with the configuration data embedded in the command packet received at step 808. In the present example, a program command for bank 116-2 is issued by the memory controller and received by memory device 100 to initiate page programming of the data stored in the page buffers 208, 210, 212 and 214 of bank 116-2. Due to the relatively long program latency period tprg, the memory controller preferably initiates the program operation in bank 116-2 as soon as all the data is loaded into the page buffers of bank 116-2. Eventually result information pertaining to the first command, in the form of read data from the page buffers 208, 210, 212 and 214 of bank 116-1, are output to the data output port(s) of link interface 132 at step 814 in response to a burst read command for bank 116-1. Other result information can include status information, which is provided in response to a supplemental read command packet. Status information provides an indication of the success or failure of a particular type of operation, such as a program or erase operation, and is read from a status register associated with that memory bank in response to a supplemental "read status" command packet issued by the memory controller.

At step 816, result information pertaining the second command will be provided, which in the present example is status information (not shown in FIG. 6) provided on an output port of the link interface 132 in response to a read status command packet. As can be seen in the presently described example concurrent operations, the sequence of steps 802 to 810 can be executed at least twice. During the second iteration of steps 802 to 810, the program command packet for bank 116-2 is received while bank 116-1 is busy executing the internal core read operation, and the burst read command packet for bank 116-1 is received while bank 116-2 is busy executing the internal core program operation. The method shown in FIG. 20 illustrates the concurrent operation of two memory banks, but the method is applicable to the concurrent operation of any number of memory banks in memory device 100.

As discussed for the method of FIG. 20, a group of command packets may be received by memory device 100 for setting up a core operation for a selected bank. Examples of operations which may require a group of command packets includes read, program and erase operations where the page size for the bank is dynamically configured on-the-fly. As previously mentioned, the page size for the selected bank is configured with page size configuration data embedded in a command. In a first memory array architecture where row decoders are dedicated for each plane, different physical rows in each plane can be activated for the read, program or erase operations. Therefore separate address loading or input commands are used to provide the addresses required for selecting the wordlines of each selected plane. In a second memory array architecture where row decoders are shared between pairs of planes, the same physical rows or wordlines in each plane are activated for the read, program or erase operations. In such a row architecture, one row address is sufficient for activating the wordlines in one or more planes.

Figure 21:
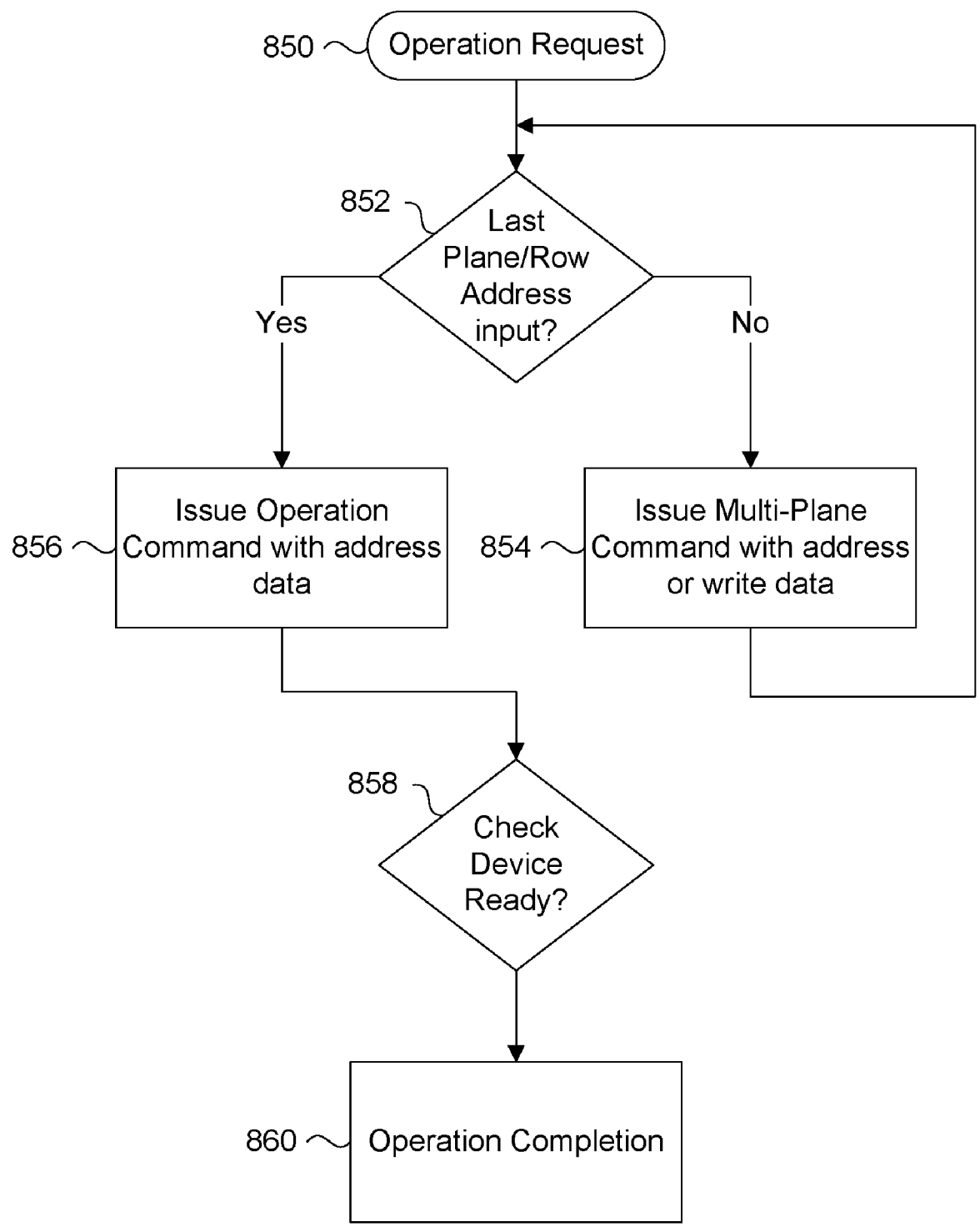
FIG. 21 shows steps executed by a controlling device for accessing one memory bank of the flash memory device.

The flow chart of FIG. 21 describes steps executed by a controlling device external to the memory device, such as memory controller 6 of FIG. 1 for example, for accessing one memory bank of the memory device. More specifically, this method assumes that wordlines in different planes of the bank can be addressed independently. The method starts at step 850 where an operation request is received by the memory controller 6. Such requests can be received from a host 4 within which the memory controller is in communication with, and the operation request can include one of a read, program or erase operation request. At step 852, the memory controller determines if the last plane/row address is ready to be provided to the memory device. If not, the method proceeds to step 854 where a multi-plane command is issued to the memory device, along with address and/or write data. In one example, this row address is 3-bytes in size and includes address data for selecting a particular page, row, or wordline in a plane, and plane address data and tile address data. The row address can be RA, the plane address can be P_ADD1 and PADD2, and the tile address can be T_ADD, for example.

The method iteratively loops between steps 852 and 854 until the last row address has been provided to the memory device. With each iteration, the address information is latched within the circuits of the memory device. Once the last row address is ready to be issued, the memory controller issues a command corresponding to the operation request at step 856, with the last address data. In response, the memory device executes the command using the latched addresses, including the last addresses provided in step 856. Once the memory device confirms to the memory controller that it is ready at step 858, then further completion steps are executed at step 860 to complete the operation.

The previous method steps have been described to generically include read, program and erase operations. Thus, there are specific steps executed in steps 854, 856 and 860 for each of the read, program and erase operations. For a program operation, step 854 includes issuing a column address and a row address with data to be programmed, and step 856 includes issuing a program command with the last column address, row address and write data. The completion steps 860 for the program operation include checking the program status of the memory device, which can result with an indication of either a programming error or successful completion of programming. For an erase operation, such as a block erase operation for example, step 854 includes issuing an address including the block address to be erased, and step 856 includes issuing the block erase command with the last block address to be erased. The completion steps 860 for the block erase operation include checking the erase status of the memory device, which can result with an indication of either an erase error or successful erasure. One memory block is typically the smallest unit of memory that can be erased at one time. However, portions of a memory block can be erased as described in International Publication WO/2008/106778 (12 Sep. 2008), the contents of which are incorporated by reference in its entirety. Accordingly, the described embodiments can be applied to the flash memory described in International Publication WO/2008/106778.

The completion steps for a read operation require more steps than for the program and erase operations. A full description of a multiple plane read operation according to the presently presented embodiment is described with reference to the previously shown flow chart of FIG. 21, the read operation completion flow chart of FIG. 22, and the corresponding illustrated read sequence of FIG. 23. In this example, two planes in two different tiles are to be selected for reading data therefrom. Starting in FIG. 21, the memory controller checks at step 852 if the last plane/row address is ready to be issued. Since the first addresses are to be issued, the method proceeds to step 854 where the first multi-plane address input command is issued with the row and plane addresses. In FIG. 23, an example multi-plane address input command byte in hexadecimal format is shown as 01h, followed by a 3-cycle row address input sequence, which includes the plane address. In the presently described example, a page or row in plane 2 is selected. At this point, the row address and plane addresses are latched in the decoding circuits corresponding to plane 2. Returning to step 852 of FIG. 21, the second and last plane/row address is ready to be provided, and the method proceeds to step 856 where a read command with a 5-cycle column and row address input sequence is provided. In FIG. 23, an example multi-plane address input command byte in hexadecimal format is shown as 00h, followed by a 5-cycle column and row address input sequence. A read confirm command 30h is provided after the addresses are issued. In the presently described example, a page or row in plane 4 is selected.

Because a page read command was issued, the control circuits of the memory device begin internal operations to read the data from the selected pages in planes 2 and 4. more specifically, the internal read operation starts once the address latch cycles for the last addresses are finished. The data of the selected pages are simultaneously sensed and transferred to the page buffer in less than tR, where tR is the transfer time from the cell array to the page buffer. It is noted that tR is same regardless of the number of planes that have been selected.

In FIG. 21, the memory device will eventually provide an indication, such as a ready/busy signal, informing the memory controller at step 858 that the tR period is finished and data is ready to be read out from the page buffers. Now the operation completion steps of 860 for the multi-plane read operation will follow in the flow chart of FIG. 22.

Figure 22:
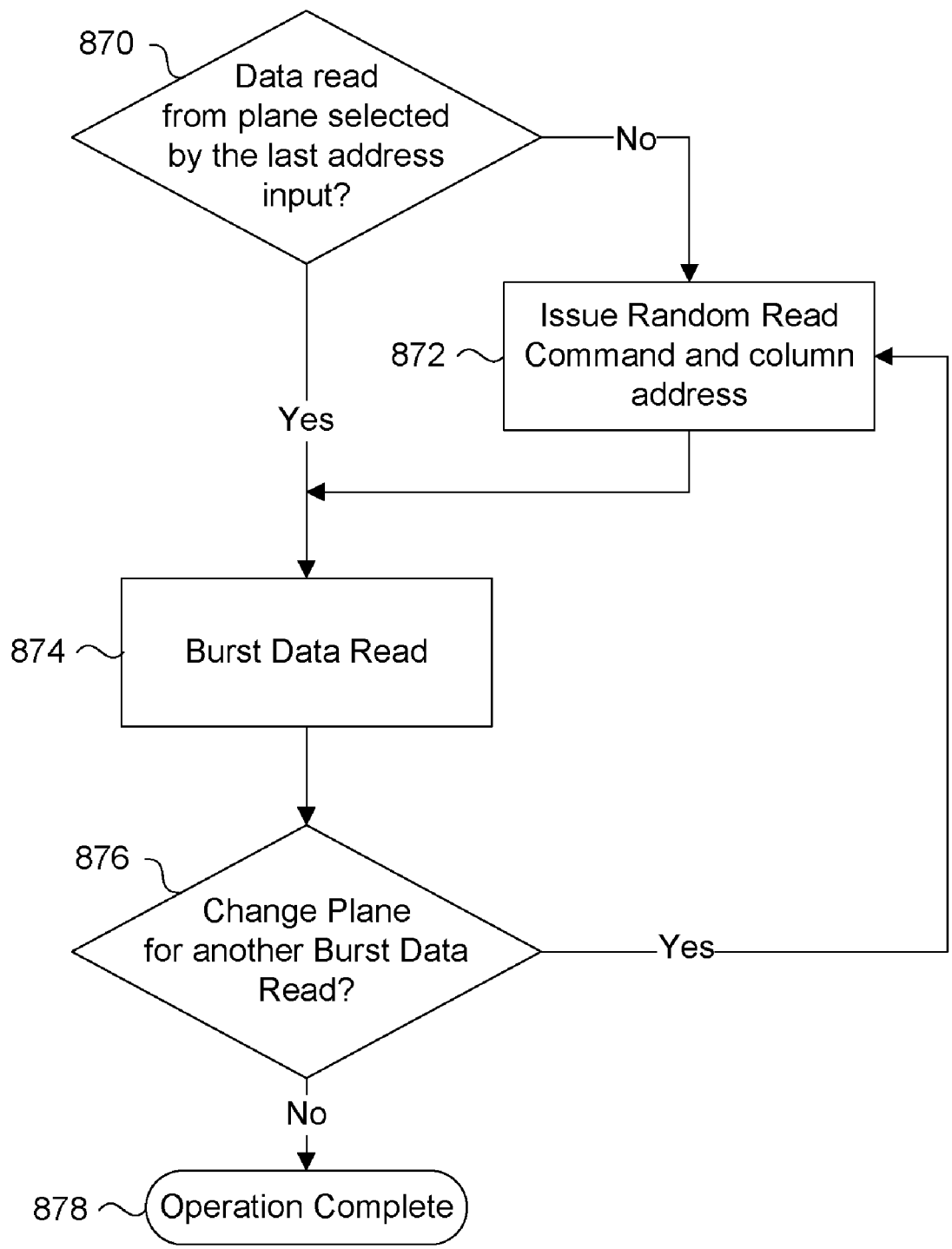
FIG. 22 is a flow chart showing steps of a read operation completion method.
Figure 23:
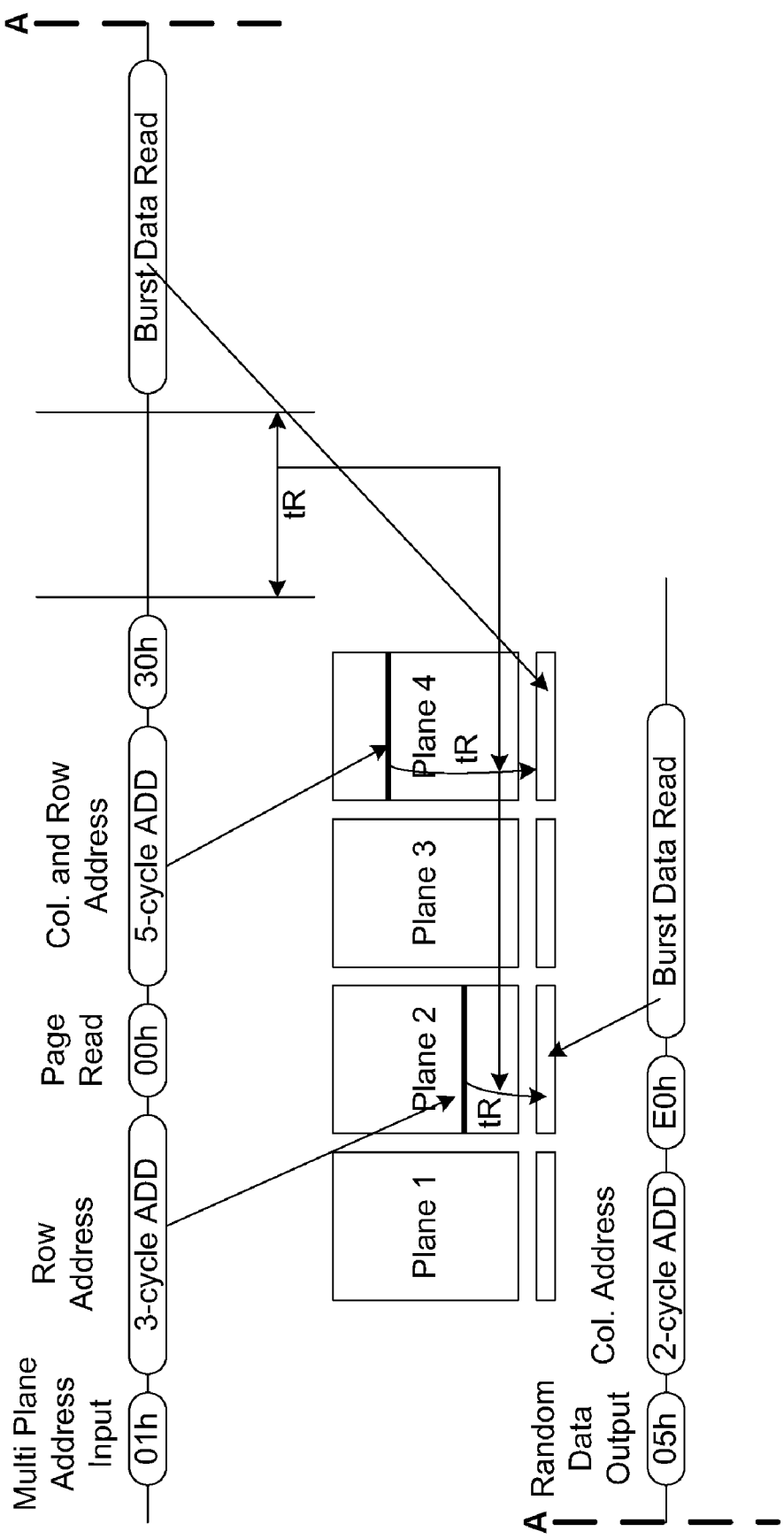
FIG. 23 is a sequence diagram showing a read operation for one memory bank.

The first completion step 870 of FIG. 22 is to determine if the data to be read out will be from the last plane address provided to the memory device, which corresponds to plane 4 in the presently described example. Alternately, step 870 can determine if the data to be read out will be from the first plane address provided to the memory device. These two different schemes are design choices for the memory device and either can be used. Since this condition is met, a burst data read command is issued at step 874 and the data stored in the page buffer corresponding to plane 4 is read out of the memory device. Otherwise, if data is to be read from a previously addressed plane, the method proceeds to step 872 where a random read command is issued with a column address, where the column address corresponds to a specific bit position in the page buffer where data is to be read out from. In the presently described example, the random read command is used for enabling the decoding circuits of the memory device to receive the new column address for reading out data from the corresponding page buffer. Following at step 876, the memory controller determines if there is another plane to read data from. Because there is data in plane 2 to read from, the method returns to step 872 where a random read command is issued with a new column address to the memory device. The random read command is shown as 05h in FIG. 23 followed by a 2-cycle column address input sequence, and ending with a confirm command E0h. Then a burst data read occurs in step 874 to read out data from plane 2. At step 876, there are no further planes to read data from, and the read operation ends at step 878.

Figure 24:
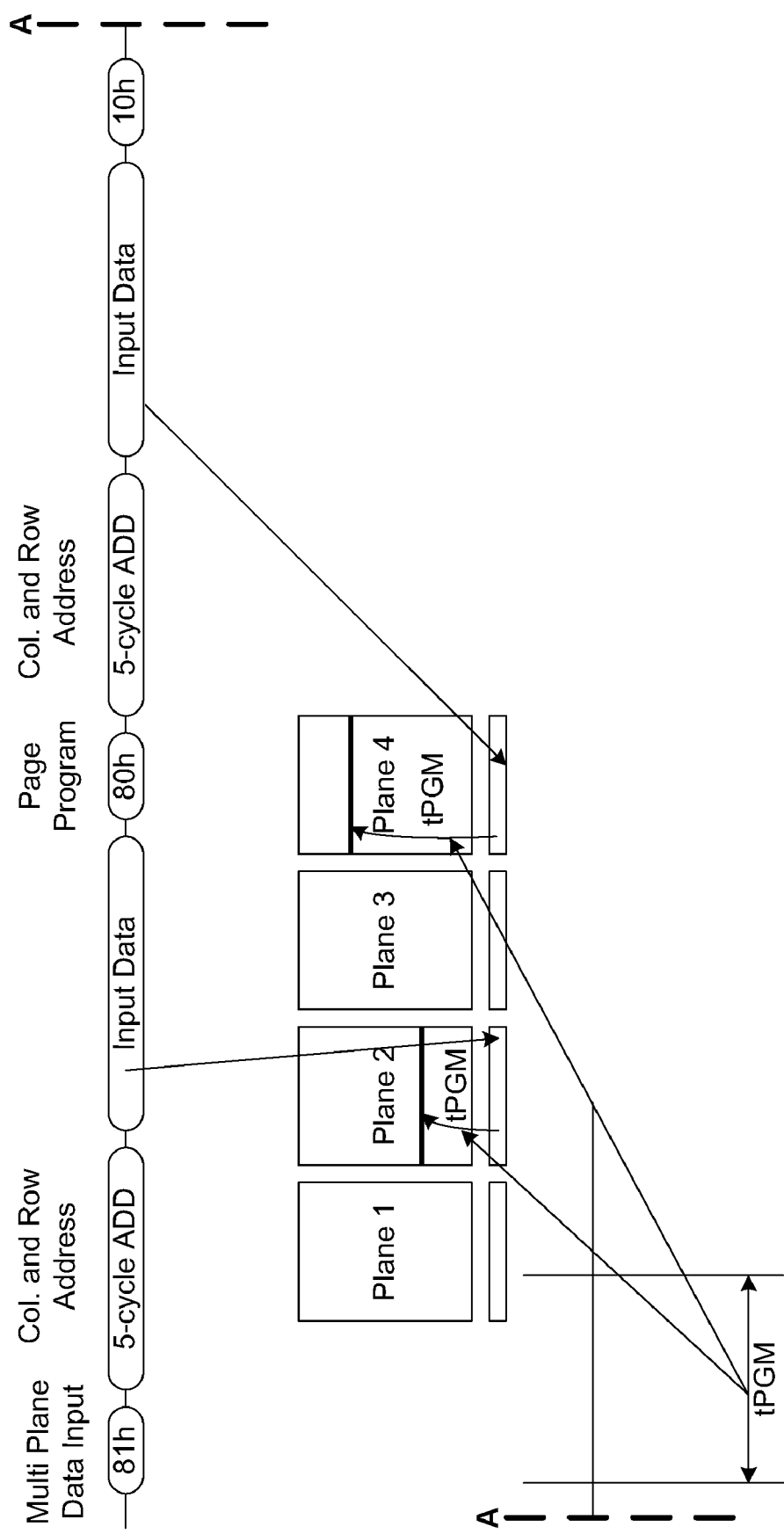
FIG. 24 is a sequence diagram showing programming of two planes of a memory bank having 4 planes.
Figure 25:
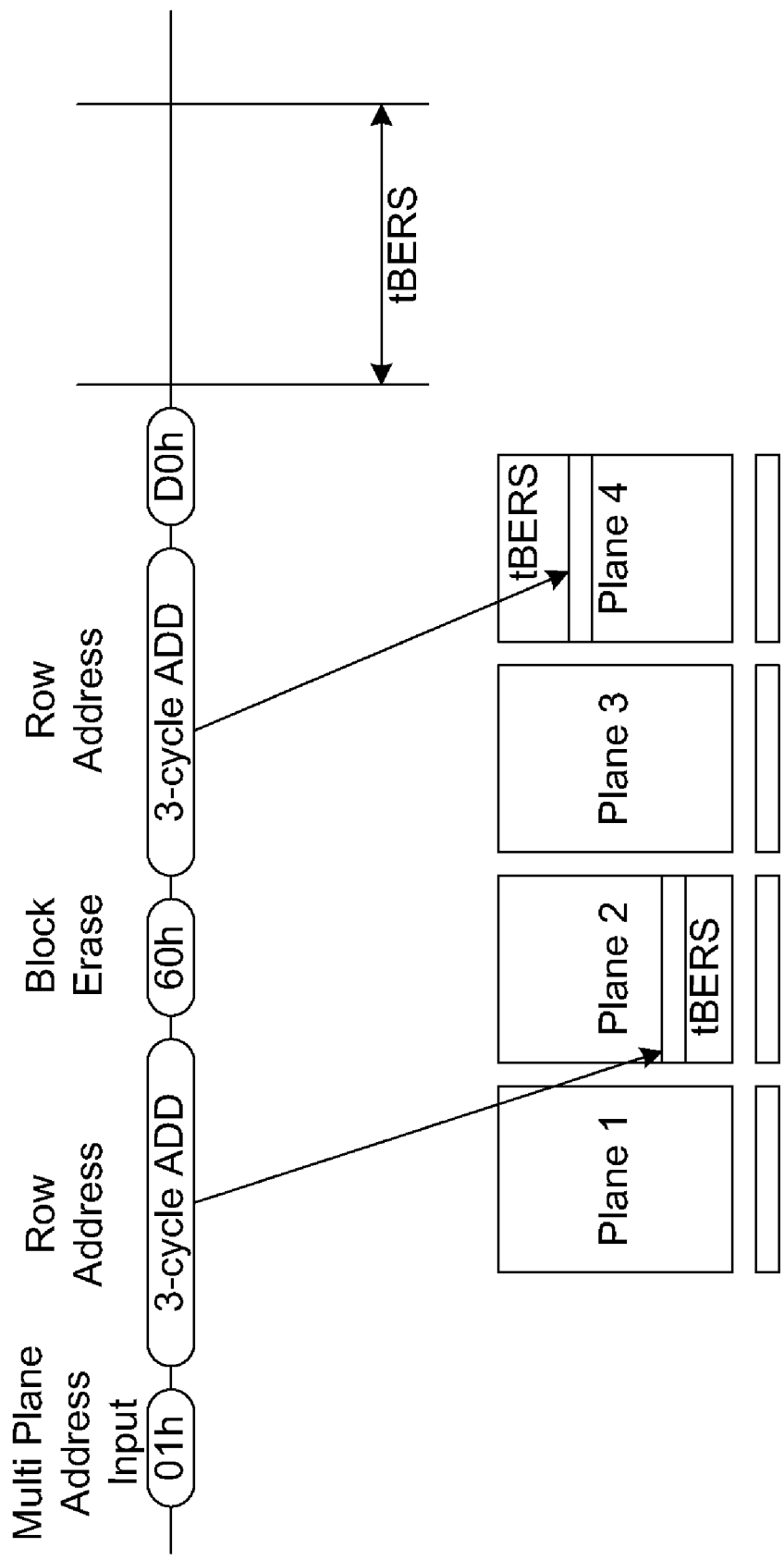
FIG. 25 is a sequence diagram showing erasing of blocks from 2 planes of a memory bank having 4 planes.

Brief example descriptions for multi-plane program and erase operations, according to the presently described embodiments with reference to the illustrated sequences of FIG. 24 and FIG. 25 will now be provided. FIG. 24 is an illustrated sequence for programming 2 planes of a memory bank having 4 planes. The programming sequence begins with a multi-plane write data input command 81h, followed by a 5 cycle column and row address input sequence, which itself is followed by the program data. In the presently described example, the program data is loaded into the page buffer corresponding to plane 2, and a particular row in plane 2 is selected as the target location for programming the data in the page buffer. The address for the second and last page to be programmed is provided by issuing a page program command 80h followed by a 5 cycle column and row address input sequence, which itself is followed by further program data. In the presently described example, a row address different than for plane 2 is selected for plane 4. A page program confirm command 10h follows after the further program data. Once the address latching has finished, internal operations for programming the data in the page buffers begins. The data loaded into the page buffers of planes 2 and 4 are simultaneously programmed in less than tPROG, which is the elapsed page program time. It is noted that the page program time tPROG is same regardless of the number of planes selected in the memory bank.

FIG. 25 is an illustrated sequence for erasing blocks from 2 planes of a memory bank having 4 planes. The erase sequence begins with a multi-plane address input command 01h, followed by a 3 cycle row address input sequence. In the presently described example, the row address selects a specific block in plane 2. The block address for the second and last block to be erased is provided by issuing a block erase command 60h followed by a 3 row address input sequence. In the presently described example, a block address different than for plane 2 is selected for plane 4. A block erase confirm command D0h follows after the row addresses are provided. Once the address latching has finished, internal operations for erasing the data in the selected blocks of planes 2 and 4 begins. The data of the selected blocks are simultaneously erased in less than tBERS, where tBERS is the block erase time. It is noted that the block erase time tBERS is same regardless of the number of planes selected in the memory bank.

It is noted that because a group of command packets corresponding to one core operation includes individual command packets issued by a memory controller, these individual command packets can be issued at different times and not necessarily immediately after a previous individual command packet for that group of command packets is issued. This means that individual command packets designated for different memory banks can be issued in an interleaved pattern to maximize a predetermined efficiency parameter of the memory device. For example, one efficiency parameter may be to ensure that core operations are initiated as soon as possible in each memory bank. This may occur in a situation where a read request for a maximum page size of data is first requested from a first bank, followed by a read request for a minimum page size of data from a second bank. Because a group of command packets may be required for issuing the different row addresses for the first bank, the issuance of the group of command packets can be interrupted with the issuance of a single command packet for initiating the read operation in the second memory bank. Another example efficiency parameter may to minimize peak power consumption, which may be necessary when receiving programming or erase operations for both memory banks. In such a case, the memory controller can ensure that core programming/erase operations for both memory banks are initiated sufficiently far apart from each other to reduce load on the high voltage generators. The memory controller can be programmed with such efficiency algorithms based on the requested operations and the architecture of the memory device.

Figure 26:
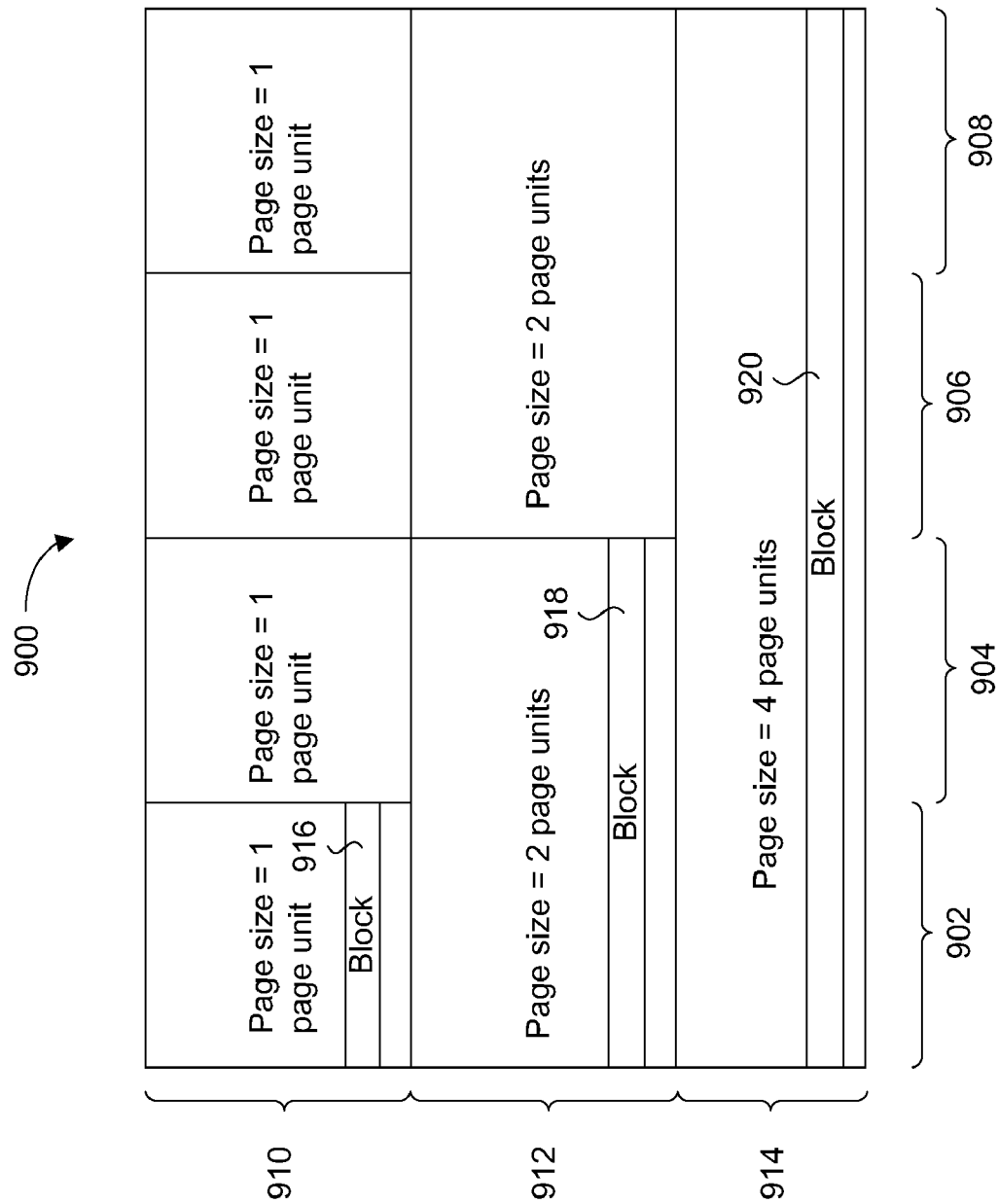
FIG. 26 illustrates a first example logical partition of a memory bank having 4 planes, according to a present embodiment.

Accordingly, the circuit and methods for multi-bank access provides full flexibility to the host system by allowing them to selectively configure the page size for each memory bank of a memory device. The configuration can be done statically upon power up of the memory device, or dynamically through commands received by the memory device. An advantage of dynamic configuration is that the memory bank can be logically partitioned to have different page sizes based on the row address provided to the memory bank. FIG. 26 illustrates a first example logical partition of a memory bank having 4 planes as shown in FIGS. 11, 12 and 15. Referring to FIG. 26, memory bank 900 includes four planes, 902, 904, 906 and 908 located in two tiles. The four planes are arranged in a symmetric partitioning scheme. In the symmetric partitioning scheme, every plane has the same logical configuration. More specifically, each plane has the same number and physical positioning of rows that represent either the smallest page size or a portion of predetermined page sizes for the memory bank. Each of the planes has logical row groupings 910, 912 and 914. This is but one example logical row configuration of many possible combinations. Each row grouping includes a sequential number of rows, or pages. Row grouping 910 is set such that each plane provides a minimum page size of one page unit for memory bank 900. Row grouping 912 is set such that each plane provides one half of a 2 page unit page. Row grouping 914 is set such that each plane provides one quarter of a 4 page unit page. Once this logical mapping scheme is known to the memory controller, application specific data can be selectively programmed to the most appropriate row grouping. For example, large multi-media files are programmed to row grouping 914 since its page size is the largest for memory bank 900. Small data files are programmed to row grouping 910. Intermediate sized data files are programmed to row grouping 912.

In FIG. 26, the page size of 1 page unit has memory block 916, of which only one is shown, where the memory block size is determined by the number of wordlines per NAND cell string and the NAND cell strings of one plane. The page size of 2 page units has memory block 918, of which only one is shown, and has the same number of wordlines per NAND cell string. Accordingly, memory block 918 is twice the size of memory block 916 since it includes the NAND cell strings of two planes. The page size of 4 page units has memory block 920 having the same number of wordlines per NAND cell string. Accordingly, memory block 920 is twice the size of memory block 918 and four times the size of memory block 916 since it includes the NAND cell strings of all four planes.

Figure 27:
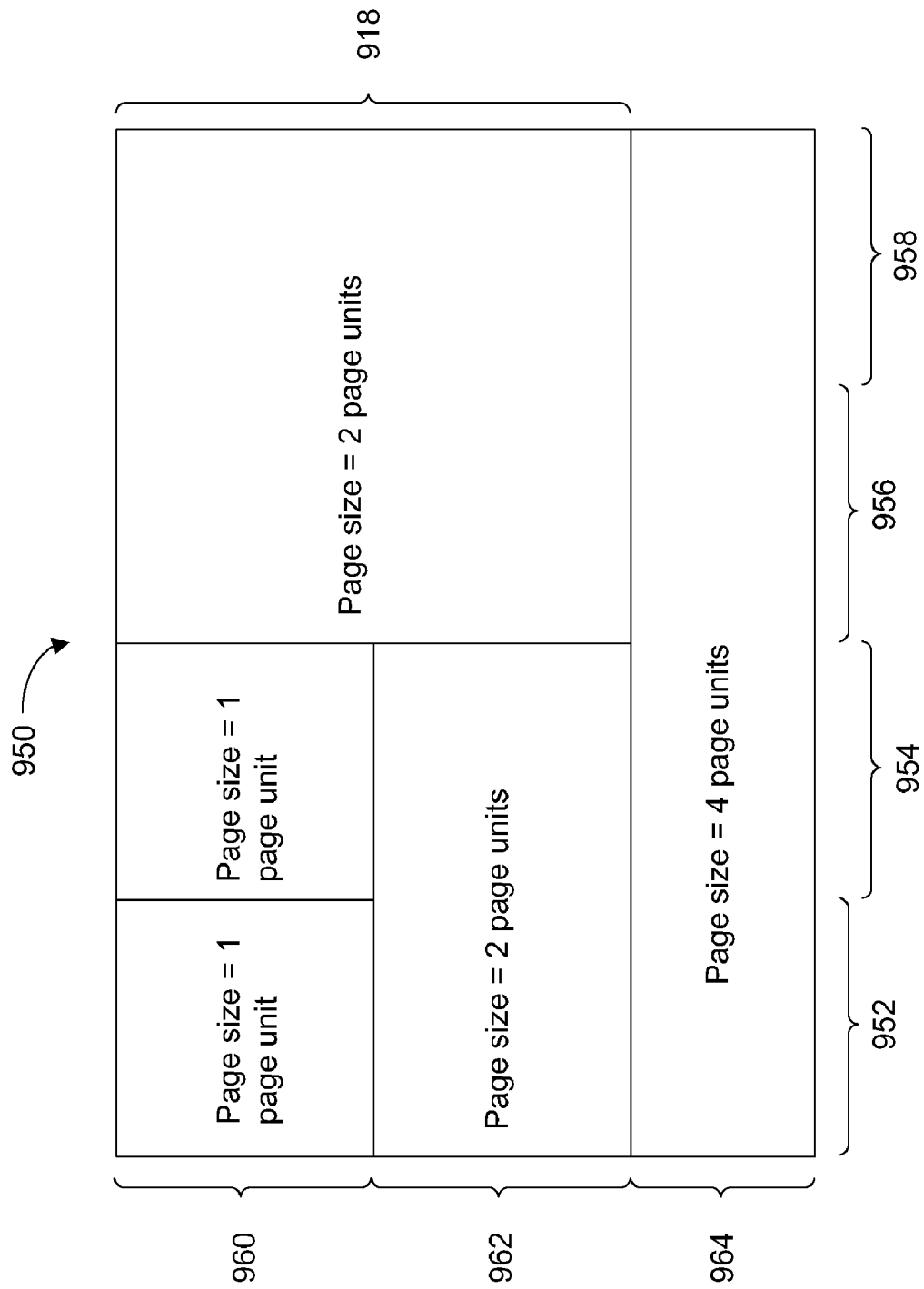
FIG. 27 illustrates a second example logical partition of a memory bank having 4 planes.

FIG. 27 illustrates a second example logical partition of a memory bank having 4 planes as shown in FIGS. 11, 12 and 15. Referring to FIG. 27, memory bank 950 includes four planes, 952, 954, 956 and 958 located in two tiles. The four planes are arranged in an asymmetric partitioning scheme. In the asymmetric partitioning scheme, the logical row groupings can vary from plane to plane. For example, planes 952 and 954 have logical row groupings 960 and 962, while planes 952, 954, 956 and 958 have logical row grouping 964. However, planes 956 and 958 have row grouping 918. Therefore, only planes 952 and 954 can provide single page unit pages, while planes 956 and 958 do not provide any single page unit pages. Instead, planes 956 and 958 are configured to provide a larger number of 2 page unit pages than planes 952 and 954.

The previously shown embodiments of FIGS. 11, 12 and 15 showed the respective page size configurators 502, 522 and 602 included within the memory bank. This means that the manufactured chip has its page size configurators positioned proximate to the tiles of memory such that the conductor lines carrying signals provided by the first plane selector and the second plane selectors to the memory tiles are minimized in length. Therefore, the bank having a combination of memory tiles and its page size configurator can be considered a macro, or one instance of a larger circuit block having a predetermined "footprint" that can be duplicated on the semiconductor chip. Such macros facilitate design of chips with embedded multi-bank flash memory, or design of a discrete flash memory device having multiple banks. However, to maximize packing density and minimize semiconductor area use, it is desirable to customize the layout of the memory tiles and the circuits of the page size configurators.

Figure 28:
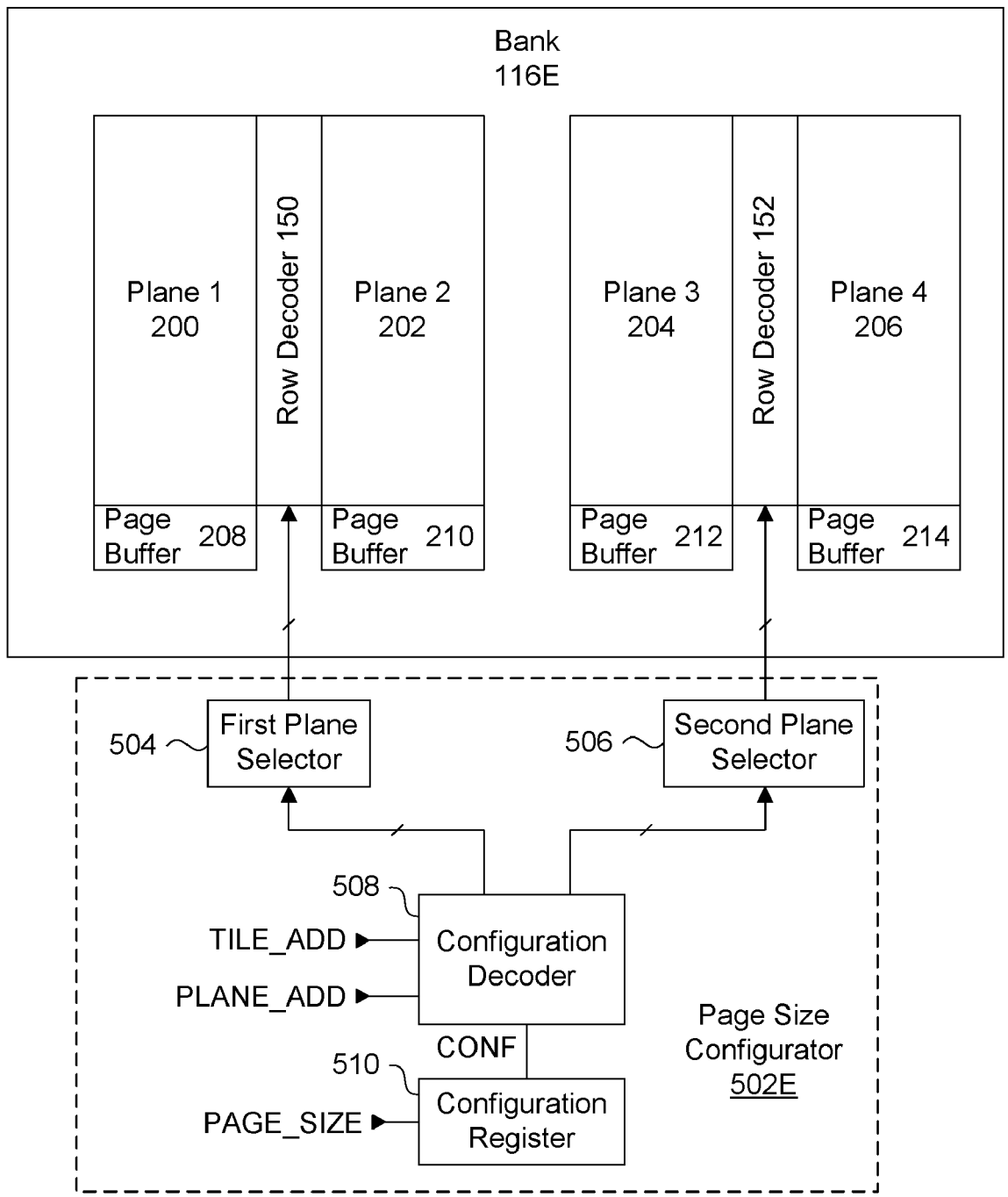
FIG. 28 illustrates another example of a memory architecture having configurable page size in a memory bank of the flash memory device.

FIG. 28 shows another example of a memory architecture having configurable page size in a memory bank of the multi-bank flash memory device 100 of FIG. 4. In FIG. 28, bank 116E is similar to that of FIG. 11 except that bank 116E includes only the two pairs of planes (Planes 1, 2 and Plane 3, 4). In FIG. 28, a page size configurator 502E is located outside of bank 116E. Accordingly, page size configurator 502E can be positioned distantly from planes 200, 202, 204, 206 and their corresponding row decoders and page buffers.

In the previously described examples, a plurality of pairs of planes (e.g., two pairs) is associated with one page size configurator. In an alternative embodiment, each pair of planes in a memory bank can be associated with one page size configurator. In other words, each pair of planes, or a tile, can have a dedicated page size configurator.

Figure 29A:
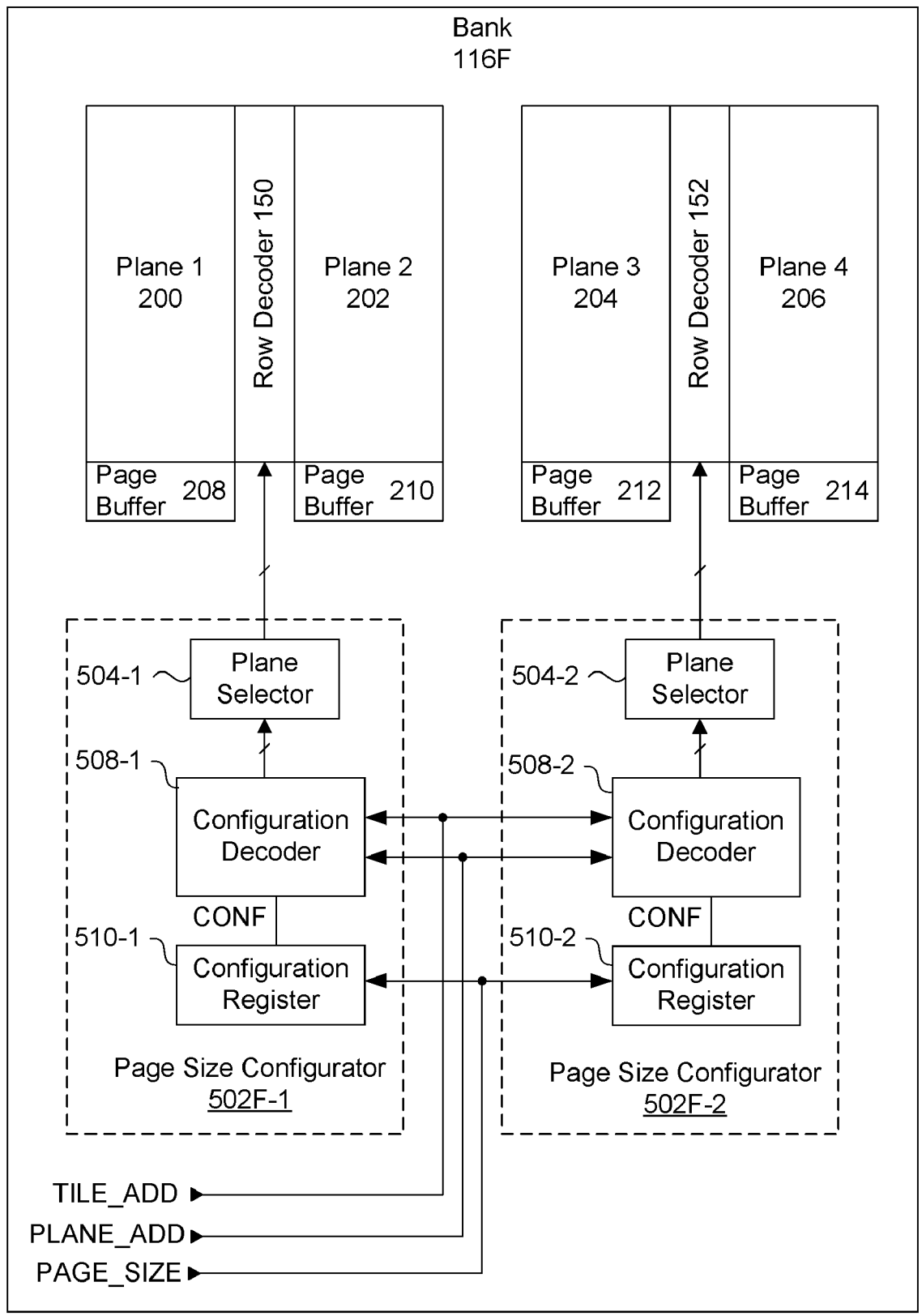
FIGS. 29A and 29B illustrate other examples of a memory architectures having configurable page size in a memory bank of the flash memory device.

FIG. 29A shows another example of a memory architecture having configurable page size in a memory bank of the multi-bank flash memory device 100 of FIG. 4. Referring to FIG. 29A, pairs of Planes 1, 2 and Planes 3, 4 of a memory bank 116F are associated with page size configurators 502F-1 and 502F-2, respectively, which are included in the bank 116F. Page size configurator 502F-1 includes plane selector 504-1, configuration decoder 508-1 and configuration register 510-1. Page size configurator 502F-2 includes plane selector 504-2, configuration decoder 508-2 and configuration register 510-2. The configuration decoders and the configuration registers of the two page size configurators 502F-1 and 502F-2 receive TILE_ADD, PLANE_ADD and PAGE_SIZE. With reference to FIGS. 13, 14A, 14B, 16, 17A and 17B, which show different specific page size configurator embodiments, it should be apparent to those skilled in the art that plane selector 504-1, configuration decoder 508-1 and configuration register 510-1 include only the circuit elements that provide signals used by row decoder 150. Similarly, plane selector 504-2, configuration decoder 508-2 and configuration register 510-2 include only the circuit elements that provide signals used by row decoder 152. Accordingly, specific bits of TILE_ADD, PLANE_ADD and PAGE_SIZE are provided to each of page size configurator 502F-1 and page size configurator 502F-2.

Figure 29B:
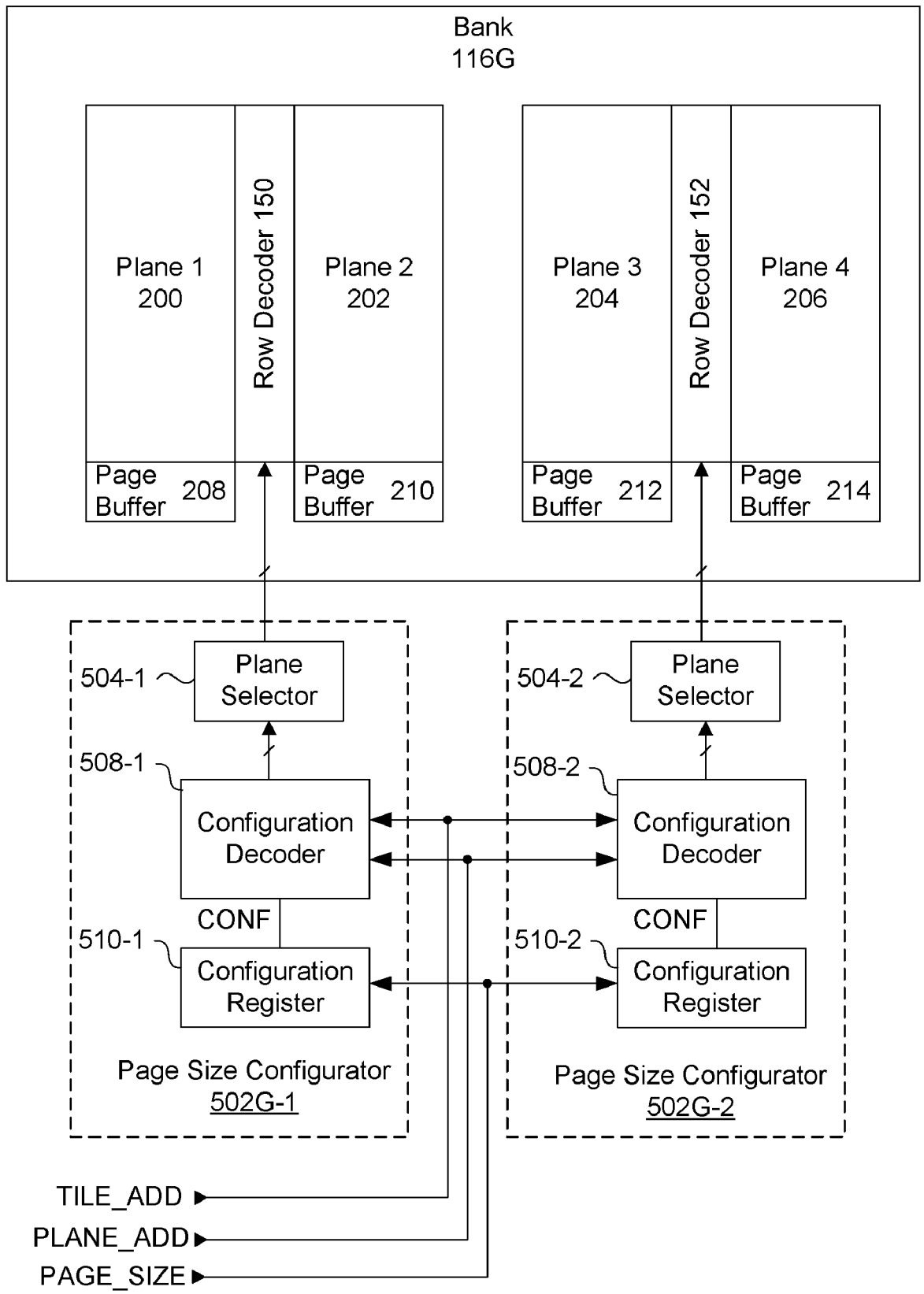

FIG. 29B shows another example of a memory architecture having configurable page size in a memory bank of the multi-bank flash memory device 100 of FIG. 4. Referring to FIG. 29B, pairs of Planes 1, 2 and Planes 3, 4 of a memory bank 116G are associated with page size configurator 502G-1 and 502G-2, respectively, which are located outside of the bank 116G. Page size configurator 502G-1 corresponds to page size configurator 502F-1 of FIG. 29A and page size configurator 502G-2 corresponds to page size configurator 502G-2 of FIG. 29A.

In the examples shown in FIGS. 28, 29A and 29B, the page size configurators can be replaced with page size configurator 522 of FIG. 12 or 602 of FIG. 15.

The previously presented multi-bank memory architectures can be implemented in discrete memory devices, or embedded in an ASIC. Hence, the flash memory system 2 of FIG. 1 can be implemented with parallel connected or serial connected memory devices having the previously presented multi-bank memory architectures.

While not shown in the example partitioning schemes of FIGS. 26 and 27, a row grouping having 3 page unit page sizes can be set to span three planes. For the 2 and 3 page unit page sizes, different combinations of planes can be combined together where non-adjacent planes form the page. Therefore, the configurable page size for a memory bank allows for efficient use of the available memory capacity for different applications.

Therefore, the previously described embodiments allow for application specific storage of data in a memory bank of a memory device. To maximize storage efficiency and thus minimize the number of memory cells exposed to unnecessary program and erase cycles, data can be stored in rows of the memory bank designated to have the smallest page size greater than the size of the data. Furthermore, performance is enhanced because internal read, program and erase times remain substantially constant when as the page size is increased. Circuit embodiments for a memory device have been presented to illustrate examples of how logic decoding operations can be dynamically or statically set using configuration data. Access operations by a memory controller for controlling the memory device having such circuits have been presented to illustrate example sequences for accessing the individual planes that make up a configured page size.

The previously described embodiments present a flash memory device architecture where the memory array is organized into banks, where each of the banks has a configurable page size, and are operable at substantially the same time to execute memory operations concurrently as each bank has its own core control logic. The page size of each memory bank can be statically configured or dynamically configured with page size configuration data during normal operations of the memory device. The page size configuration data can be embedded with address information in a memory command received by the memory device for on-the-fly dynamic page size configuration.

In the embodiments described above, the device elements and circuits are coupled or connected to each other as shown in the figures, for the sake of simplicity. In practical applications of the present invention to apparatus, devices, elements, circuits, etc. may be coupled or connected directly to each other. As well, devices, elements, circuits etc. may be coupled or connected indirectly to each other through other devices, elements, circuits, interfaces, etc., necessary for operation of the apparatus. Thus, in actual configuration, the circuit elements and devices are directly or indirectly coupled with or connected to each other.

In the preceding description, for purposes of explanation, numerous details are set forth in order to provide a thorough understanding of the embodiments of the invention. However, it would be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A flash memory device comprising:
    a memory element configured to perform memory operations, the memory element including at least two memory banks each having local core circuitry, each of the at least two memory banks having a configurable page size for receiving and providing data having different page sizes during memory operations; and
    core controller circuitry including at least two core controllers configured to receive control signals corresponding to the memory operations, the at least two core controllers operating the local core circuitry of the at least two memory banks concurrently in response to the received control signals.

2. The flash memory device of claim 1, further including a row predecoder receiving a row address and a bank address, the row predecoder providing predecoded row addresses corresponding to a selected memory bank of the at least two memory banks in response to the bank address and the row address.

3. The flash memory device of claim 1, further including a column predecoder receiving a column address and a bank address, the column predecoder providing a predecoded column address corresponding to a selected memory bank of the at least two memory banks in response to the bank address and the row address.

4. The flash memory device of claim 1, further including a selector for selectively passing the control signals to a selected core controller of the at least two core controllers in response to a bank address, the selected core controller providing bank control signals in response to the control signals.

5. The flash memory device of claim 4, further including a command interpreter for receiving a command, and for decoding the command to provide the control signals and the bank address.

6. The flash memory device of claim 1, wherein each of the at least two memory banks includes two memory planes each having NAND memory cell strings connected to bitlines and wordlines connected to flash memory cells of each of the NAND memory cell strings.

7. The flash memory device of claim 6, wherein the two memory planes are each adjacent a shared row decoder.

8. The flash memory device of claim 6, wherein the flash memory cells connected to a wordline forms a page unit having a predetermined page size.

9. The flash memory device of claim 8, wherein the configurable page size includes one of a single page unit from one of the two memory planes and two page units.

10. The flash memory device of claim 8, further including page size configurators corresponding to each of the each of the at least two memory banks for selectively enabling activation of at least one wordline in each of the two memory planes in response to an address.

11. The flash memory device of claim 10, wherein each of the at least two memory banks includes one of the page size configurators.

12. The flash memory device of claim 10, wherein each of the two memory planes includes a row decoder enabled by the page size configurator for driving the at least one wordline with a global row drive signal.

13. The flash memory device of claim 10, wherein the two memory planes are each adjacent a shared row decoder enabled by the page size configurator for driving the at least one wordline with a global row drive signal.

14. The flash memory device of claim 13, wherein the shared row decoder includes a row driver for selectively passing the global row drive signal to the at least one wordline in response to first and second enable signals provided by the page size configurator.

15. The flash memory device of claim 14, wherein the row driver includes a first pass transistor for passing the global row drive signal to a first wordline in response to the first enable signal, and a second pass transistor for passing the global row drive signal to a second wordline in response to the second enable signal.

16. The flash memory device of claim 15, wherein the first enable signal and the second enable signal are driven to a high voltage level greater than a voltage level of the global row drive signal.

17. The flash memory device of claim 16, wherein the shared row decoder further includes a block decoder for providing a master voltage as the first enable signal in response to a first plane select signal, and as the second enable signal in response to a second plane select signal.

18. The flash memory device of claim 1, wherein each of the at least two memory banks includes four memory planes each having NAND memory cell strings connected to bitlines and wordlines connected to flash memory cells of each of the NAND memory cell strings.

19. The flash memory device of claim 18, further including a page size configurator corresponding to one of the at least two memory banks for selectively enabling activation of at least one wordline in each of the four memory planes of the one of the at least two memory banks, in response to an address.

20. The flash memory device of claim 19, wherein the four memory planes of the one of the at least two memory banks are arranged as a first tile and a second tile, the first tile and the second tile each having memory planes adjacent a shared row decoder.

21. The flash memory device of claim 20, wherein the page size configurator selectively enables activation of at least one wordline in each of the four memory planes in response to a tile address and a plane address.

22. The flash memory device of claim 21, wherein the flash memory cells connected to one wordline forms a page unit having a predetermined page size, and the configurable page size includes any combination of page units from each of the four memory planes.

23. A method for operating a flash memory device including at least first and second memory banks, each having a configurable page size, comprising:
   providing page size configuration commands after power up of the flash memory device, the page size configuration commands including configuration data stored in configuration resisters corresponding to the first and second memory banks;
   executing a first memory operation in the first memory bank; and
   executing a second memory operation in the second memory bank while the first memory operation is being executed in the first memory bank.

24. The method of claim 23, wherein the page sizes of the first and second memory banks are configured after the power up of the flash memory device.

25. The method of claim 24, wherein the page size configuration commands are provided any time before and after the first memory operation and the second memory operation are executed.

26. The method of claim 23, wherein executing the first memory operation includes configuring the page size of the first memory bank and executing the second memory operation includes configuring the page size of the second memory bank.

27. The method of claim 26, wherein executing the first memory operation includes receiving a first command including an op code corresponding to the first memory operation and configuration data corresponding to the first memory bank page size.

28. The method of claim 26, wherein executing the second memory operation includes receiving a first command including an op code corresponding to the second memory operation and configuration data corresponding to the second memory bank page size.

29. The method of claim 23, wherein the first memory operation and the second memory operation includes one of a read operation, a program operation and an erase operation.

30. A system comprising:
a memory controller providing commands for executing corresponding memory operations; and
a memory system having at least one memory device, the at least one memory device having at least two memory banks, each of the at least two memory banks having a configurable page size and controllable for executing memory operations corresponding to the commands concurrently, the at least one memory device further having core controller circuitry for receiving control signals corresponding to the commands, the core controller being configured to concurrently control local core circuits corresponding to each of the at least two memory banks in response to the received control signals.

31. The system of claim 30 wherein the memory system having at least one memory device includes
a first memory device connected to a common bus, the common bus being connected to the memory controller, and
a second memory device connected to the common bus and in parallel with the first memory device.

32. The system of claim 30 wherein the memory system having at least one memory device includes
a first memory device connected in series to the memory controller and having inputs for receiving the commands and outputs for providing the commands, and
a second memory device connected in series to the first memory device and having inputs for receiving the commands.

33. The system of claim 32 wherein the second memory device has outputs for providing the commands to the memory controller.

34. The system of claim 30, wherein the at least one memory device further includes a command interpreter for decoding the commands and providing the control signals.

* * * * *

UNITED STATES PATENT AND TRADEMARK OFFICE
CERTIFICATE OF CORRECTION

| | | |
|---|---|---|
| PATENT NO. | : 8,120,990 B2 | Page 1 of 1 |
| APPLICATION NO. | : 12/364665 | |
| DATED | : February 21, 2012 | |
| INVENTOR(S) | : Jin-Ki Kim | |

It is certified that error appears in the above-identified patent and that said Letters Patent is hereby corrected as shown below:

On the Title Page, item (63), delete

"Continuation-in-part of application No. 12/329,929, filed on Dec. 8, 2008, application No. 12/364,665"

and insert therefor

-- Continuation-in-part of application No. 12/329,929, filed on Dec. 8, 2008, now Patent No. 8,068,365 --

Signed and Sealed this
Twenty-ninth Day of May, 2012

David J. Kappos
*Director of the United States Patent and Trademark Office*